(12) United States Patent
Suzuki et al.

(10) Patent No.: US 7,912,359 B2
(45) Date of Patent: Mar. 22, 2011

(54) HEATING DEVICE OF THE LIGHT IRRADIATION TYPE

(75) Inventors: Shinji Suzuki, Tokyo-to (JP); Tetsuya Kitagawa, Himeji (JP); Kyohei Seki, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 721 days.

(21) Appl. No.: 11/848,359

(22) Filed: Aug. 31, 2007

(65) Prior Publication Data

US 2008/0219650 A1    Sep. 11, 2008

(30) Foreign Application Priority Data

Sep. 12, 2006    (JP) .................................. 2006-246538

(51) Int. Cl.
*F21V 9/00* (2006.01)
*F21V 7/04* (2006.01)
(52) U.S. Cl. ...................................... 392/408; 362/558
(58) Field of Classification Search .......... 392/407–440; 313/110–117; 362/293, 558; 118/724–726; 438/195–423
See application file for complete search history.

(56) References Cited

U.S. PATENT DOCUMENTS

| | | | |
|---|---|---|---|
| 4,789,771 A | 12/1988 | Robinson et al. | |
| 4,859,832 A | 8/1989 | Uehara et al. | |
| 6,021,152 A | 2/2000 | Olsen et al. | |
| 6,720,531 B1 * | 4/2004 | Jacobson et al. | 219/390 |
| 6,759,632 B2 * | 7/2004 | Ducret et al. | 219/390 |
| 2006/0263958 A1 * | 11/2006 | Kajimoto et al. | 438/195 |
| 2009/0203186 A1 * | 8/2009 | Sakagami | 438/423 |

FOREIGN PATENT DOCUMENTS

| JP | 62-020308 A | 1/1987 |
|---|---|---|
| JP | 2002-110580 A | 4/2002 |
| WO | 91/10873 A1 | 7/1991 |

* cited by examiner

*Primary Examiner* — Daniel Robinson
(74) *Attorney, Agent, or Firm* — Roberts Mlotkowski Safran & Cole, P.C.; David S. Safran

(57) ABSTRACT

A heating device of the light irradiation type having an article to be heated, a guard ring located on the periphery of that article, multiple lamps located above the article to be heated and the guard ring, and a reflecting mirror located above the lamps, in which a light diffusion part is located in the upper region corresponding to the article to be heated so that the diffused light projects onto the entire surface of the article to be heated. The light diffusion part can be formed, for example, on a reflecting mirror, an optically transparent window part located between the article to be heated and the lamps or a light diffusion area formed on the light-emitting bulbs of the lamps. The size of the region occupied by the light diffusion part is such that diffused light is not projected to the guard ring.

6 Claims, 30 Drawing Sheets

HEATING DEVICE OF THE LIGHT IRRADIATION TYPE

BACKGROUND OF THE INVENTION

1. Field of the Invention

This invention relates to a heating device of the light irradiation type that perform rapid and high-temperature heat treatment by means of light irradiation of an article to be heated.

2. Description of Related Art

Heat treatment of the light irradiation type in the semiconductor production process is performed by a broad range of processes including film formation, diffusion, and annealing. In all of these processes, a semiconductor wafer (simply "wafer" hereafter), which is a plate-shaped workpiece, is heat-treated at a high temperature.

If heat treatment of the light irradiation type is used in this heat treatment, it is possible to rapidly heat and cool the wafer. For example, it is possible to increase the temperature of the wafer to 1000° C. or more in from several seconds to several tens of seconds after irradiation of the wafer begins. If the light irradiation is stopped, it is possible to cool the wafer rapidly.

A heating device of the light irradiation type generally uses multiple incandescent lamps as a heat source. As for the incandescent lamps in which filaments are arranged within light-emitting bulbs made of optically transparent material, the startup of optical output is quick, so the incandescent lamps are suitable for rapid heat-treatment of a workpiece. In the case of halogen lamps, in particular, a cyclical regeneration cycle (halogen cycle) of the halogen and the tungsten filament, which heats and vaporizes that are sealed in the light-emitting bulb, as a result of which there is the advantage of extending the service life without size reduction or blackening of the bulb.

In the event that the material of the wafer is silicon, if an uneven temperature distribution occurs in the wafer when the wafer is heated to 1050° C. or more, a phenomenon called slip, which is a defect of crystal transition, occurs in the wafer, and the wafer being heat treated is deteriorated and becomes an inferior good. Therefore, in the event that the wafer is heat-treated using a heating device of the light irradiation type, it is necessary to heat the wafer, maintain it at a high temperature, and cool it so that the temperature distribution is uniform across the full surface of the wafer. It is the same if the wafer is heated for the purpose of film formation. That is, in order to form a film of uniform thickness across the full surface of the wafer, the wafer must be heated so that the temperature distribution of the wafer is uniform.

It is thought that, in the event that the physical properties are uniform across the full surface of the wafer, the wafer temperatures will be uniform if light illumination is performed so that irradiance is uniform across the full surface of the wafer. In reality, however, even if light irradiation is performed under that sort of irradiation conditions, temperatures are lower at the periphery of the wafer and an uneven temperature distribution occurs on the wafer. In the event that the wafer is heated to 1050° C. or more, as described above, an uneven wafer temperature distribution is created and slip will occur on the wafer.

The reason that temperatures are lower at the periphery of the wafer is that heat is radiated by the wafer periphery area, such as the sides of the wafer and the portions near the sides of the wafer. Consequently, it is necessary to compensate for the temperature reduction caused by heat radiation from the wafer periphery area in order to make the temperature distribution uniform across the full surface of the wafer. For example, light irradiation can be performed so that irradiance on the surface of the wafer periphery area is greater than the irradiance on the central surface of the wafer.

On the other hand, one method proposed to prevent lower temperatures at the periphery of the wafer is the method of surrounding the periphery of the wafer with an auxiliary piece having the same thermal capacity as the wafer. Such auxiliary piece is generally called a guard ring.

In the event that the thermal capacity of the guard ring placed around the periphery of the wafer is the same as the thermal capacity of the wafer, the wafer and guard ring can be regarded as unified virtual plate-shaped body. In that event, the peripheral area of the wafer will not be the peripheral area of the virtual plate-shaped body, and so heat radiation from the peripheral area of the wafer will not occur. For that reason, the temperatures of the peripheral area of the wafer will not be lowered. In other words, by using a guard ring as described above, it is possible to compensate for heat radiation from the peripheral area of the wafer, and to make the temperatures of the wafer uniform.

Now, because the guard ring is set to enclose the periphery of the wafer, the guard ring often is given the additional function of holding the edge of the wafer and so is used as a wafer holder.

In reality, however, it is difficult to manufacture a guard ring so that it can be regarded as a single unit with the wafer (that is, so that their thermal capacities are equal). The reasons for that are shown below.

(a) For the guard ring and the wafer to have the same thermal capacity, the material of the guard ring should be the same as the material of the wafer. For example, if the wafer is a silicon wafer, the material of the guard ring should be silicon (Si). However, when silicon is repeatedly subjected to great temperature changes it deforms and is unable to fulfill the function of a guard ring.

(b) To avoid the problem of deformation, guard rings are often made of silicon carbide (SiC). Silicon carbide has a slightly greater specific heat than silicon, but the difference is not great. Nevertheless, silicon carbide is hard to machine, and because of machining problems (yield) the thickness cannot be less than 1 mm, so it will be thicker than the wafer thickness of 0.7 to 0.8 mm. Because of the different specific heats of silicon and silicon carbide and the different thicknesses of the wafer and the silicon carbide guard ring, the thermal capacity per unit area of the guard ring, when heated to a high temperature, may be as great as 1.5 times that of the wafer.

Accordingly, in order to make the guard ring function to compensate for the temperature drop in the peripheral area of the wafer, it is necessary to cancel out the influence of the difference of thermal capacities between the wafer and the guard ring. Concretely, it is necessary to provide light irradiation so that the irradiance on the guard ring is greater than the irradiance on the wafer.

Because of the situation described above, it is essential that a heating device of the light irradiation type have the function of light irradiation in which the irradiance in the irradiated region can be set at will. By using a heating device of the light irradiation type having such a function, it is possible to provide light irradiation so that the irradiance on the guard ring is greater than the irradiance on the wafer, as described above. A heating device of the light irradiation type having that function is explained below.

In this heating device of the light irradiation type, the heat source comprises multiple incandescent lamps. The multiple lamps are controlled by dividing them into a number of control zones (lamp groups) and setting the distribution of the irradiance in the irradiated region to the prescribed distribution. For example, the heating device of the light irradiation type described in JP-A-S62-20308 (of 1987) has as its light irradiation means, which is the heating means, multiple straight-bulb halogen lamps arrayed in parallel. These halogen lamps are divided up with several in each of a number of lamp groups; each lamp group is a control unit, and the thermal output from each lamp group can be controlled independently. Concretely, the temperature at multiple points on the workpiece is first detected by a radiation thermometer. Then the control units are controlled so that the temperatures on the workpiece will be uniform.

The heating device of the light irradiation type described in JP-A-S63-260127 (of 1988) and corresponding U.S. Pat. No. 4,859,832 has as its light irradiation means, which is the heating means, multiple infrared lamps arrayed concentrically in rings of differing diameters. These lamps are also controlled by dividing them up into a number of control zones (lamp groups).

Concretely, for various workpiece temperature distribution patterns determined in advance, data on how the lighting of the multiple infrared lamps can be controlled to obtain the desired temperature uniformity on the workpiece is collected. Based on that data, the controller of the heating device of the light irradiation type stores a table of infrared lamp lighting control patterns for individual temperature distribution patterns.

Then, during heat processing, two or more points on the workpiece are measured with a radiation thermometer to learn the temperature distribution pattern. The controller searches the stored table for the temperature distribution pattern that is closest to the measured temperature distribution pattern. Based on the infrared lamp lighting control pattern that corresponds to the temperature distribution pattern resulting from the search, the lamp groups are controlled to make the workpiece temperatures uniform.

A concrete explanation of an example of light irradiation of the guard ring at a radiation irradiance greater than that on the wafer, by means of zone control, is given below. Now, for ease of understanding, the emissivity distribution of the surface of the wafer that is the workpiece is taken to be uniform. That is, the temperature of the light-irradiated wafer is considered to be proportional to the irradiance on the wafer surface.

As semiconductor integrated circuits have become finer and more highly integrated, the circuit structures formed on wafers have become finer in the direction of wafer depth as well. That is, thin film structure has advanced as a part of this circuit structure. In the process of high-temperature heat treatment of wafers, on the other hand, there are times when it is necessary for the temperature attained by the wafer to exceed 1000° C. Following ion implantation, for example, a high-temperature heat treatment process of that description is used to activate the impurities that have been driven in.

The speed of heat diffusion of the impurities increases at such high temperatures. For that reason, if the wafer is at a high temperature for a long period, the impurity ions will diffuse in the direction of wafer depth, and it will not be possible to maintain the thin film structure mentioned above. Therefore, heating equipment that realizes abrupt heating and abrupt cooling processes called spike annealing has been developed in recent years. With spike annealing there is no maintaining at a fixed temperature; once the target temperature (the temperature necessary for activation) is reached, cooling follows immediately. In other words, the period during which the wafer is at a high temperature is as short as possible, and the progress of impurity ion diffusion in the direction of wafer depth is suppressed.

To accomplish this, there is a very strong desire to make the rate of temperature rise in the spike annealing process very rapidly and to bring the temperature of the wafer or other workpiece to the target temperature in a short period.

When the spike annealing process is carried out using the heating device of the light irradiation type described above, the irradiance of irradiated light on the surface of the workpiece is great, and so a rapid rate of temperature rise is realized. Here, in the case of a heating device of the light irradiation type having a light irradiation means that comprises multiple straight-bulb halogen lamps arrayed in parallel, reducing the spacing between the lamps will increase the irradiance of the irradiated light on the surface of the workpiece.

Here, if the workpiece is plate-shaped like a wafer and a prescribed size is set, the prescribed number of lamps will be the number that can be arrayed in parallel facing the workpiece. When the irradiance of irradiated light on the surface of the workpiece in such a situation is inadequate, it will be necessary to supply greater power in the halogen lamps or other incandescent lamps that comprise the light irradiation means, and thus increase the luminous energy of the light emitted from the incandescent lamps.

FIGS. 28(*a*) & 28(*b*) are diagrams for explaining the distribution of the irradiance of a workpiece (wafer) 106 and a guard ring 105 when the workpiece 106 and the guard ring 105 are irradiated by a light irradiation means that comprises multiple straight-bulb lamps 101 and a wave-shaped mirror 102.

In FIGS. 28(*a*) & 28(*b*), the light irradiation means comprises multiple straight-bulb halogen lamps 101 arrayed in parallel. Above the lamps 101 there is a wave-shaped mirror 102 that is a reflecting mirror. The reflective surface of the wave-shaped mirror 102 has multiple concavities arrayed in parallel.

Each of the straight-bulb halogen lamps 101 is partially enclosed by one of the concavities. The concavities of the wave-shaped mirror 102 are designed so that the light reflected by the concavities will have a degree of directionality. That is, the spread of the light reflected by the concavities of the wave-shaped mirror is less than the spread of the light from the lamps 101 that directly irradiates the workpiece 106.

Now, the wafer or other workpiece 106 is generally accommodated in a treatment chamber. The light radiated by the light irradiation means passes through an optically transparent window part 104 that is located in the treatment chamber, and irradiates to workpiece 106.

FIG. 28(*a*) shows a case in which the multiple straight-line lamps 101 are divided into two lamp groups (zones): lamp group 101-1 for irradiation of the guard ring and lamp group 101-2 for irradiation of the wafer. Here, the lamp group 101-1 for irradiation of the guard ring is the group located above the guard ring 105. The lamp group 101-2 for irradiation of the wafer, on the other hand, is the lamp group located above the workpiece 106 (also called the "wafer" hereafter).

Here, in order to light-irradiate the guard ring 105 with greater irradiance than the workpiece 106, the individual zones (lamp groups) are controlled so that the energy supplied to each lamp 1 that belongs to the lamp group 101-1 for irradiation of the guard ring is greater than the energy supplied each lamp that belongs to the lamp group 101-2 for irradiation of the wafer. As a result, the intensity of the light emitted from the lamps belonging to the lamp group 101-1 for irradiation of the guard ring is greater than the intensity of the light emitted from the lamps belonging to the lamp group 101-2 for irradiation of the wafer.

As is clear from FIG. 28(a), using the zone control described above it is possible to light illuminate the guard ring 105 with greater irradiance than the workpiece 106.

Nevertheless, the irradiance on a part (the edge) of the workpiece 106 is greater than the irradiance at the center of the workpiece, and distribution of the irradiance uniformity of the workpiece 106 cannot be realized. When the emissivity distribution of the surface of the workpiece is uniform, the temperature distribution of the workpiece 106 will be uneven if the distribution of the irradiance on the surface of the workpiece is uneven.

The reason the distribution of the irradiance of the workpiece 106 is uneven is that the irradiated light from the lamp group 101-1 for irradiation of the guard ring also irradiates the peripheral area of the workpiece. In other words, the light emitted from the lamps 101 is diverging light, and so if the workpiece 106 is not close to the lamps 101, the light from the lamp group 101-1 for irradiation of the guard ring, which is located above the guard ring 105, will irradiate the peripheral area of the wafer as well. The intensity of the light emitted from lamps belonging to the lamp group 101-1 for irradiation of the guard ring is of greater intensity than the light emitted from lamps belonging to the lamp group 101-2 for irradiation of the wafer, and so the irradiance at the edge of the workpiece 106 is markedly greater than the irradiance on the center part of the wafer.

In the event that the wafer 106, which is the workpiece, is heated to a temperature of 1050° C. or greater, the uneven irradiance part indicated by the slanting lines in FIG. 28(a) will grow larger; the unevenness of temperature distribution will be marked and slip will occur in the wafer 106.

The uneven irradiance part of the wafer 106 mentioned above can be reduced by increasing the number of zones. FIG. 28(b) is an example where there are 3 zones (lamp groups). In the example shown here, the lamp group 101-2 for irradiation of the wafer is divided into group I and group II. Group II is located above the region where the uneven irradiance part occurred in FIG. 28(a). Group I, on the other hand, is located above the region of the central part of the wafer. Now, the lamp group 101-1 for irradiation of the guard ring is called "group III" hereafter.

The idea of zone control shown in FIG. 28(b) is as follows. For light irradiation of the guard ring 105 with a greater irradiance than the workpiece 106, the energy supplied to the lamps 101 belonging to group III is set to be greater than the energy supplied to the lamps belonging to group I and group II. Further, the light irradiated from group III also irradiates the peripheral area of the wafer, and so to counteract that portion, the energy supplied to the lamps belonging to group II is set to be less than the energy supplied to the lamps belonging to group I. In other words, the energy supplied to the lamps belonging to the various groups decreases in the order, group III, group I, group II.

As is clear from FIG. 28(b), by means of zone control as described above, it is possible to provide light irradiation of the guard ring 105 with greater irradiance than the workpiece 106. Further, it is possible to control the unevenness of distribution of the irradiance that arises from irradiation of the peripheral area of the wafer by the irradiating light from the lamp group 101-1 for irradiation of the guard ring, which is diverging light. Therefore, the temperature distribution of the wafer has better uniformity.

As stated above, zone control by means of at least three lamp groups is necessary in order to provide light irradiance of the guard ring 105 with greater irradiance than the workpiece 106, and to make the irradiance distribution of the surface of the wafer roughly uniform. In reality, the distribution of the irradiance on the workpiece is influenced by a number of factors, including the distance between the workpiece 106 and the light irradiation means (the multiple straight-bulb lamps 101 and the wave-shaped mirror 102 in FIGS. 28(a) & 28(b)), the shape of the reflecting mirror (the wave-shaped mirror 102 in FIGS. 28(a) & 28(b)), and the amount of overlap of light from the various zones (lamp groups). For that reason, zone control can be more complex, and the number of lamp groups is normally greater than three.

Now, the explanation of zone control shown in FIGS. 28(a) & 28(b) is applied in a single dimension perpendicular to the axial direction of the bulbs of the straight-bulb lamps 101. For example, with regard to the axial direction of the bulbs of the straight-bulb lamps, there is only one lamp present in the irradiation region, and so it is not possible to implement zone control. Therefore, in order to apply zone control to the full surface of the wafer (that is, in two dimensions), it is usual to rotate the wafer during light irradiation.

FIGS. 29(a) & 29(b) are diagrams showing the schematic structure of the light irradiation means of a heating device of the light irradiation type suited to the spike annealing process, and the distribution of the irradiance on the wafer, which is the workpiece, and the guard ring when the wafer and guard ring are irradiated by this light irradiation means.

In FIG. 29(a), the light irradiation means comprises multiple straight-bulb halogen lamps 101 arrayed in parallel. Here, in order to make the spacing between lamps as small as possible to suit the spike annealing process, a flat mirror 112 must be adopted as the reflecting mirror placed above the lamps. That is because it would be difficult to narrow the spacing between lamps if, as in FIG. 28(a) & 28(b), a wave-shaped mirror 102 were used as the reflecting mirror.

FIG. 29(a) is, like FIG. 28(b), an example of providing 3 zones (lamp groups). That is, the zones comprise group I located above the central region of the wafer, which is the workpiece, group II located above the peripheral area of the wafer, and group III, which is the lamp group used to irradiate the guard ring.

Control of the individual zones is performed, as in FIG. 28(b), as described below. In order to do light irradiation with irradiance on the guard ring 105 that exceeds the irradiance on the wafer that is the workpiece 106, the energy supplied to the lamps belonging to group III is set to be greater than the energy supplied to the lamps belonging to group I and group II. Further, the light irradiated from group III also irradiates the peripheral area of the wafer, and so to counteract that portion, the energy supplied to the lamps belonging to group II is set to be less than the energy supplied to the lamps belonging to group I.

In other words, the energy supplied to the lamps belonging to the various groups decreases in the order, group III, group I, group II.

As is clear from FIG. 29(a), unlike the case shown in FIG. 28(b), the distribution of the irradiance on the surface of the workpiece 106 is not uniform. This is thought to be because of the following reasons.

As stated above, it is necessary to narrow the lamp spacing of the lamps 101 that make up the light irradiation means as much as possible in order to suit the spike annealing process. A flat mirror 112 is used as the reflecting mirror for that reason. However, the flat mirror, unlike the wave-shaped mirror, does not have concave surfaces. Therefore, the light reflected by the flat mirror, unlike the light reflected by the wave-shaped mirror, does not have a degree of directionality.

Further, the length of the optical path of light from a lamp 101 that is reflected by the flat mirror 112 and arrives at the workpiece (wafer) 106 is longer than the optical path of the light from a lamp 101 that irradiates the wafer 106 directly, and so the spread on the wafer 106 of reflected light from the flat mirror 112 is greater than the spread of direct light from the lamp 101.

Accordingly, there is an increase in the proportion of light emitted from each zone that irradiates parts of the regions irradiated by light emitted from other zones. In other words, the separation of zones deteriorates.

As described above, in order to provide light irradiation so that the irradiance on the guard ring 105 exceeds the irradiance on the workpiece 106, the energy supplied to lamps 101 belonging to group III is set to be greater than the energy supplied to the lamps 101 belonging to group I and group II. Accordingly, the intensity of light emitted from the lamps 101 belonging to group III is greater than the intensity of light emitted from the lamps 101 belong to group I and group II. The effect of the light irradiated on the peripheral area of the workpiece 106 from the lamps 101 belonging to group III is particularly great.

Consequently, it is thought that even if the zone control shown in FIG. 28(b) is adopted in the example shown in FIG. 29(a), the distribution of the irradiance on the surface of the wafer (workpiece) will be uneven, unlike the case shown in FIG. 28(b). As mentioned above, when the emissivity distribution of the wafer surface is uniform, if the distribution of the irradiance on the wafer surface is uneven the temperature distribution of the wafer will be uneven as well. In the event that the wafer is heated to a temperature of 1050° C. or higher, the unevenness of the temperature distribution will be marked when the unevenness of irradiance is great, and slip will occur in the wafer 106.

In such a case, it is thought that it is possible to improve the distribution of the irradiance on the wafer surface by increasing the number of individually controlled zones. However, the control system that controls the zones becomes more complex to the extent that the number of zones is increased, and in practice this is often unrealistic.

Shortening the distance between the lamps 101 that make up the light irradiation means and the workpiece 106, as shown in FIG. 29(b), can be considered as a way to handle the problem described above.

That is, shortening that distance shortens the optical path of the light from a lamp 101 that reaches the workpiece 106 after reflection by the flat mirror 112, and shortens the optical path of light from a lamp 101 that directly irradiates the workpiece 106. By this means, the light from a lamp 101 that reaches the workpiece 106 after reflection by the flat mirror 112 and the light from a lamp 101 that directly irradiates the workpiece 106 both arrive at the workpiece 106 without spreading too much. As a result, the proportion of light emitted from each zone that irradiates parts of the regions irradiated by light emitted from other zones is reduced, and zone separation improves.

Using the constitution shown in FIG. 29(b), zone separation is improved relative to the constitution shown in FIG. 29(a). That is, it is thought possible to improve the uniformity of the distribution of the irradiance on the surface of the workpiece 106 without increasing the number of zones.

In reality, however, the uniformity of the distribution of the irradiance on the surface of the workpiece 106 is not good, as is clear from FIG. 29(b).

In other words, to the extent that the distance between the lamps 101 that make up the light irradiation means and the wafer that is the workpiece 106 is shortened, the light from a lamp 101 that reaches the workpiece 106 after reflection by the flat mirror 112 and the light from a lamp 101 that directly irradiates the workpiece 106 both arrive at the workpiece 106 without spreading too much, and so it becomes impossible to ignore the effect of the non-light-emitting areas among the lamps 101.

Conventionally, to the extent that the distance between the lamps 101 that make up the light irradiation means and the wafer that was the workpiece 106 was long, the light that arrived from the lamps 101 either directly or indirectly by way of the flat mirror 112 spread on the workpiece, and although the degree of uniformity of the distribution of the irradiance on the workpiece was not good, it averaged out to some extent. Therefore, the effect of the non-light-emitting areas among the lamps was reduced.

Nevertheless, although the constitution shown in FIG. 29(b) improves zone separation, there is almost no averaging of irradiance; a relatively sharp drop in irradiance (this relatively sharp drop in irradiance is called "ripple" hereafter) is created in the region on the wafer 106 corresponding to the non-light-emitting areas among the lamps 101.

Therefore, it is difficult, as shown in FIG. 29(b), to improve the uniformity of the distribution of the irradiance on the surface of the wafer 106 even by shortening the distance between the lamps 101 that constitute the light irradiation means and the wafer 106, which is the workpiece, and exercising zone control.

As a measure to overcome the problems of the arrangement that is shown in FIG. 29(b), it is possible to shorten the distance between the lamps 101 that constitute the light irradiation means and the wafer 106, which is the workpiece, and to use a flat diffusion mirror 122 rather than a flat mirror 112 as the reflecting mirror, as shown in FIG. 30(c). In other words, one can attempt to minimize ripple by assuring zone separation with respect to the light emitted from the lamps 101 that irradiates the wafer 106 directly and using diffused light that reaches the wafer 106 from the lamps 101 after reflection by a diffusion mirror.

However, using the constitution shown in FIG. 30(c), it is possible to reduce ripple to some extent but it is not possible to ignore the effect of uneven irradiance resulting from diffused light. That is, the energy supplied to the lamps 101 belonging to group III is set to be greater than the energy supplied to the lamps belonging to group I and group II.

Accordingly, the intensity of light emitted from the lamps 101 belonging to group III is greater than the intensity of light emitted from the lamps belonging to group I and group II. In particular, the distance between the lamps 101 that constitute the light irradiation means and the wafer 106, which is the workpiece, is short, and so the intensity of the diffused light that reaches the wafer 106 from the lamps 101 after reflection by the diffusion mirror 122 is increased. As shown in FIG. 30(c), this diffused light spreads and irradiates the peripheral area of the wafer. Ultimately, as in the case of the constitution shown in FIG. 29(a), the uniformity of the distribution of the irradiance on the surface of the wafer is not good.

SUMMARY OF THE INVENTION

The present invention was made on the basis of the situation described above; it has a primary object to provide a heating device of the light irradiation type that is capable of improving the uniformity of distribution of the irradiance on the surface of the workpiece, particularly with regard to the spike annealing process, and without increasing the number of zones.

MEANS TO SOLVE THE PROBLEM

As stated above, when heating a wafer or other workpiece (the workpiece is explained hereafter as being a wafer) using a heating device of the light irradiation type that has a light irradiation means comprising multiple straight-bulb incandescent lamps (halogen lamps, for example) arrayed in parallel, it is necessary to provide light irradiation with greater irradiance on the guard ring than on the wafer in order to heat the wafer so that the guard ring functions to compensate for the temperature drop in the peripheral area of the wafer.

To accomplish that, the distribution of the irradiance in the irradiation region is set at the prescribed distribution by controlling the multiple lamps that constitute the light irradiation means by dividing them into a number of control zones (lamp groups).

If the light emitted from the lamps are in parallel beams, the irradiated regions on the workpiece irradiated by the light emitted by the various zones can be clearly delimited. However, the light emitted from the lamps is divergent light, and so part of the light emitted from one zone will irradiate part of the irradiation region of light emitted from other zones.

Conventionally, the number of zones has been set in consideration of this overlap of irradiation regions. Further, in order to assure zone separation as much as possible, it has been common to place a wave-shaped mirror over the zones to give a degree of directionality to the reflected light.

In the case of a spike annealing process, for example, it is necessary to increase the irradiance of light that irradiates the wafer, which is the workpiece, in order to realize the desired rapid rate of temperature rise. It is therefore necessary to reduce the spacing between lamps in the case of heating devices of the light irradiation type that have light irradiation means that comprise multiple straight-bulb incandescent lamps arrayed in parallel. Further, depending on the situation, it may be necessary to increase the luminous energy of light emitted from the incandescent lamps by supplying more power to the incandescent lamps.

In the case of heating device of the light irradiation type constituted in this way, it is difficult to use a wave-shaped mirror that spreads the spacing of the lamps to some extent; it is necessary to use a flat mirror as the reflecting mirror placed above the lamps.

When exercising zone control under such conditions, the number of zones must be increased. However, the control system that controls the zones becomes more complex to the extent that the number of zones is increased, and in practice this is often unrealistic.

Accordingly, it is necessary to improve zone separation as much as possible in order to provide good heating of the light irradiation type without increasing the number of zones too much. To accomplish that, the distance between the light irradiation means and the workpiece must be shortened, as stated above, but in that event, it is impossible to avoid the problem of ripple that arises from the non-light-emitting areas of light from lamps arrayed in parallel.

Further, if a diffusion mirror is used as the reflecting mirror in order to avoid the ripple problem, it is difficult, as stated above, to improve the zone separation that was the original purpose.

As above, in order to realize the abrupt heating and abrupt cooling that is called spike annealing, it has become necessary to narrow lamp spacing and shorten the distance between the light irradiation means and the workpiece, but in such situations it has become necessary to assure uniformity of the distribution of the irradiance on the surface of the workpiece without increasing the number of zones. This invention solves such demands a light diffusion part is located in the upper region corresponding to the article to be heated so that the diffused light projects onto the entire surface of the article to be heated.

Other objects, features and advantages of the invention will become apparent for the detailed description below when considered in conjunction with the accompanying drawings.

DETAILED DESCRIPTION OF THE INVENTION

(1) First Embodiment

In the event that the spacing between the lamps that make up the light irradiation means is reduced in order to carry out a spike annealing process, for example, the heating device of the light irradiation type of this invention assures the uniformity of the distribution of the irradiance on the surface of the wafer or other workpiece as follows.

Concretely, zone separation is improved by shortening the distance between the light irradiation means and the wafer that is the workpiece, and the previously unavoidable problem of ripple that arises from the non-light-emitting areas of light from the lamps is solved as well.

The first embodiment of this invention is explained below with reference to FIG. 1.

Figure 1:
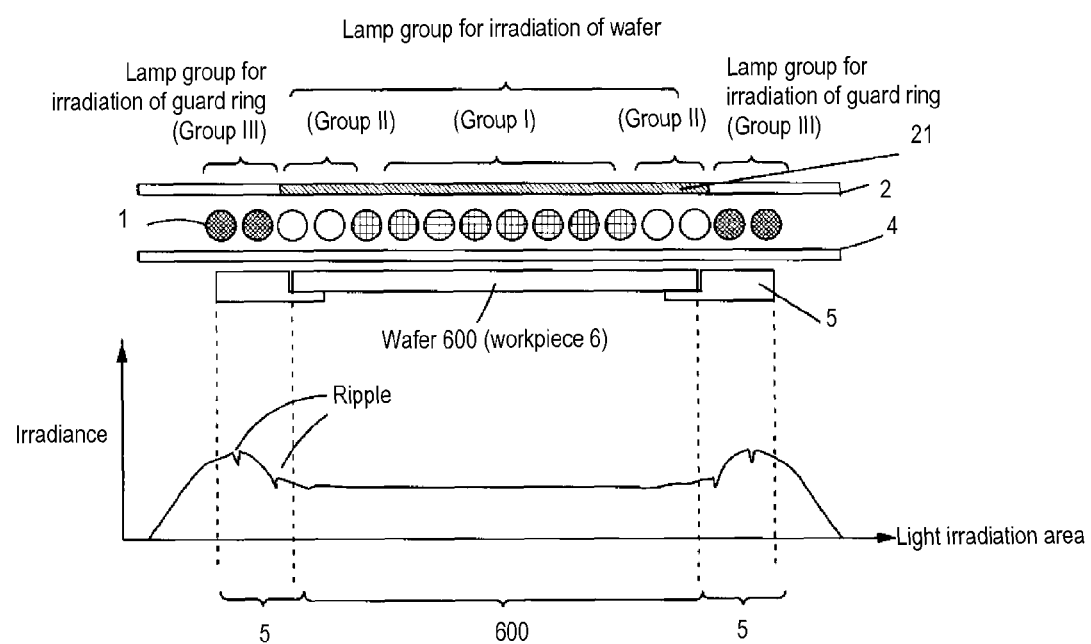
FIG. 1 is a diagram showing a first embodiment of the present invention.

FIG. 1 is a diagram that explains the schematic structure of the light irradiation means in the heating device of the light irradiation type of this invention, as well as the distribution of the irradiance on the wafer 600 that is the workpiece 6 and on the guard ring 5 when the wafer 600 and the guard ring 5 are irradiated by this light irradiation means.

The light irradiation means in the heating device of the light irradiation type of this invention comprises, as in conventional light irradiation means, multiple straight-bulb halogen lamps 1 arrayed in parallel. Further, a flat mirror 2 is adopted as the reflection mirror placed above the lamps in order to suit the spike annealing process by reducing as much as possible the spacing between the lamps 1.

Figure 28A:
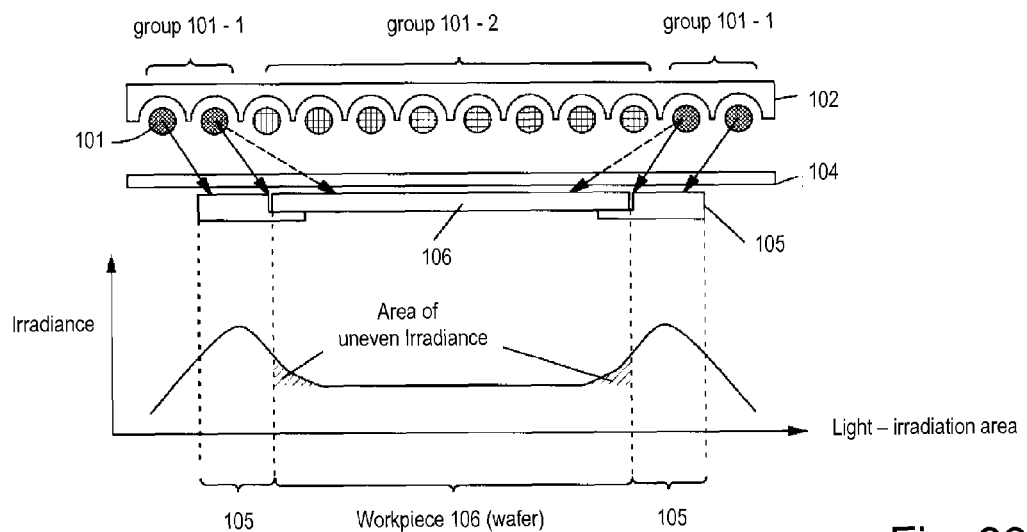
FIGS. 28(a) & 28(b) are diagrams for explaining the distribution of the irradiance on the wafer and guard ring when the wafer and the guard ring are irradiated by a light irradiation means comprising straight-bulb lamps and a wave-shaped mirror.
Figure 28B:
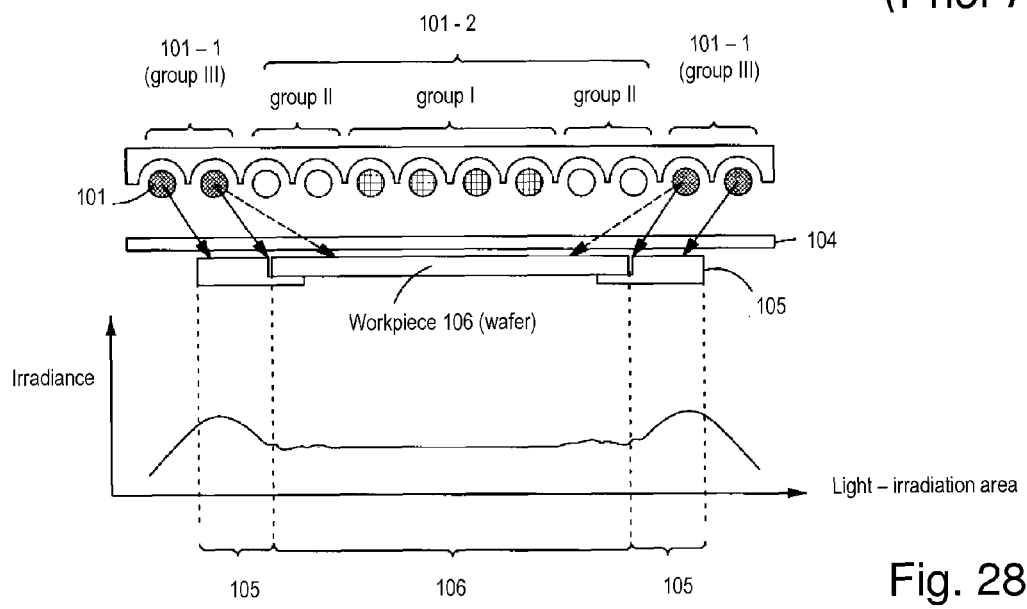
Figure 29A:
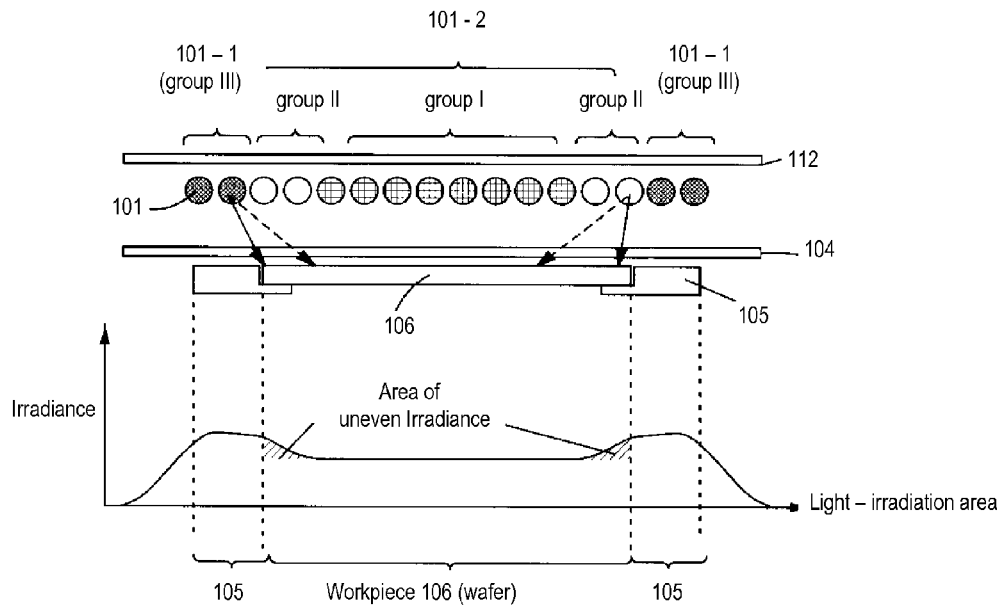
FIGS. 29(a) & 29(b) are diagrams for explaining the schematic constitution of a heating device of the light irradiation type applied to the spike annealing process, and the distribution of the irradiance on the wafer and guard ring.
Figure 29B:
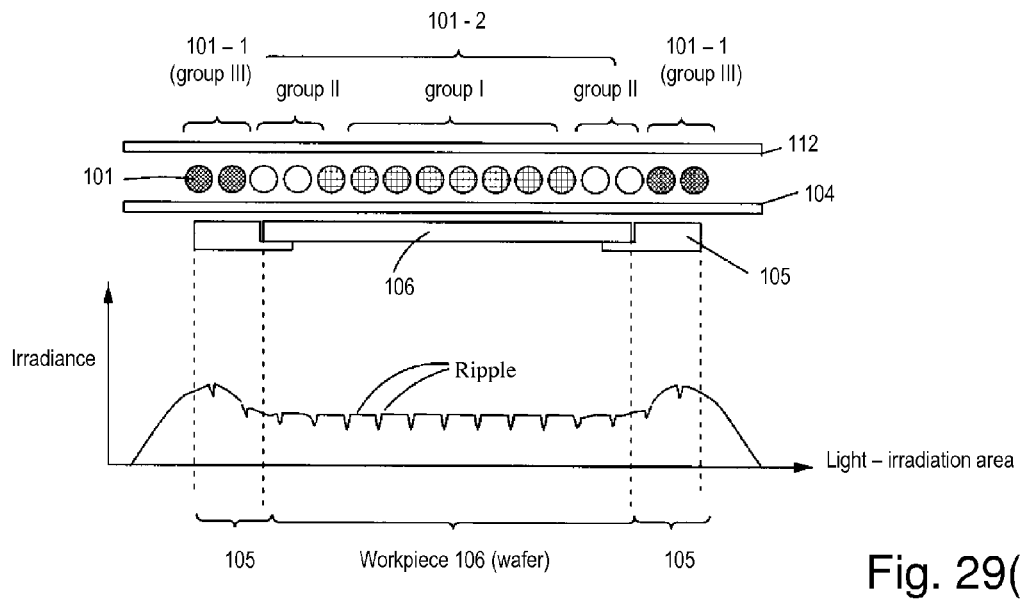
Figure 30C:
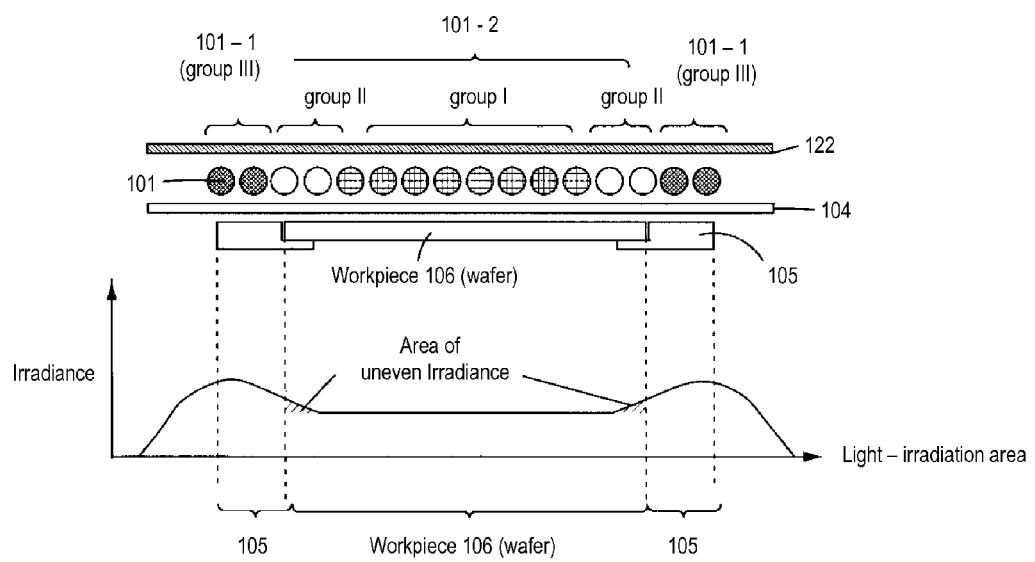
FIG. 30 is a diagram to explain the schematic constitution of a heating device of the light irradiation type applied to the spike annealing process, and the distribution of the irradiance on the wafer and guard ring as a part (c) continuation of FIGS. 29(a) & 29(b).

Here, the light irradiation means shown in FIG. 1, like those shown in FIG. 28(b) and FIGS. 29(a) & 29(b), is an example with three zones (lamp groups).

That is, the zones comprise group I that is located above the central region of the wafer, group II that is located above the peripheral area of the wafer, and group III that is the lamp group for irradiation of the guard ring.

As in the examples shown in FIG. 28(b) and FIGS. 29(a) & 29(b), zone control is performed as follows. For light irradiation of the guard ring 5 with a greater irradiance than the workpiece 6, the energy supplied to the lamps 1 belonging to group III is set to be greater than the energy supplied to the lamps belonging to group I and group II. Further, the light irradiated from group III also irradiates the peripheral area of the wafer, and so to counteract that portion, the energy supplied to the lamps belonging to group II is set to be less than the energy supplied to the lamps belonging to group I.

In other words, the energy supplied to the lamps belonging to the various groups decreases in the order, group III, group I, group II.

Further, in the heating device of the light irradiation type of this invention, the distance between the lamps 1 that make up the light irradiation means and the workpiece 6 is set to be as short as possible.

The point of difference between the heating device of the light irradiation type of this invention and conventional devices is that a portion of the reflecting mirror 2 (a flat mirror, for example) is a diffusion mirror area 21 that diffuses the reflected light. Concretely, there is, in the reflecting mirror 2, a diffusion mirror area 21 that is a diffusion part in the region where there is incident light from the lamps 1 that belong to group I that are located over the central region of the wafer 600 that is the workpiece 6 and from the lamps 1 belonging to group II located above the peripheral area of the wafer 600, but almost no incident light from the lamps 1 belonging to group III, which is the lamp group for illuminating the guard ring 5.

Moreover, the portion of reflecting mirror 2 that corresponds to the guard ring 5 is a non-diffusion surface so that non-diffused light is incident to the guard ring 5.

Next, the diffusion mirror area 21 is located in the upper region corresponding to the workpiece 6 (wafer 600), and the size of the region formed by the diffusion mirror area 21 is either the same as the size of the region enclosed by the periphery of the workpiece 6 or a size that is expanded slightly from the periphery of the wafer to include the peripheral area of the wafer.

As mentioned above, the distance between the lamps 1 that make up the light irradiation means and the workpiece 6 is set to be as short as possible, and so the optical path of the light from a lamp 1 that reaches the workpiece 6 after reflection by the reflecting mirror 2 and the optical path of light from a lamp 1 that directly irradiates the workpiece 6 are shorter.

By this means, the light from a lamp 1 that reaches the workpiece 6 after reflection by the reflecting mirror 2 and the light from a lamp 1 that directly irradiates the workpiece 6 both arrive at the workpiece 6 without spreading too much.

As a result, the proportion of light emitted from each zone that irradiates parts of the regions irradiated by light emitted from other zones is reduced, and zone separation improves.

Here, if a flat mirror 112 of which the reflecting surface is specular were used as in the constitution shown in FIG. 29(b), then as stated above, ripple would occur in the irradiated region of the wafer 600 that is the workpiece 6, caused by the region corresponding to the portion of the wafer 600 that is equivalent to the non-light-emitting areas among the lamps 1.

In contrast, by means of the heating device of the light irradiation type of this invention, the flat mirror 2 that is the reflecting mirror is set so that the diffusion mirror area 21 is a region with incident light from the lamps belonging to group I and group II, with almost no incident light from the lamps 1 belonging to group III.

In other words, the diffusion mirror area 21 is located in the upper region with respect to the workpiece 6 (wafer 600) so that the diffused light is incident to the full surface of the workpiece 6, and the size of the region formed by the diffusion mirror area 21 is either the same as the size of the region enclosed by the periphery of the workpiece 6 or a size that is expanded slightly from the periphery of the wafer to include the peripheral area of the wafer.

Therefore, the light that is emitted by the lamps 1 belonging to group I and group II and reflected by the reflecting mirror 2 irradiates the workpiece 6 as diffused light.

Here, the distance between the lamps 1 belonging to group I and group II and the workpiece 6 is set to be as short as possible, and so the diffused light irradiation region in the light irradiation region (that is, the surface of the workpiece 6 and the surface of the guard ring 5) does not spread too much.

In other words, this diffused light primarily irradiates the surface of the wafer 600 that is the workpiece 6. This diffused light counteracts the conventional ripple component, and as a result it improves the uniformity of the distribution of the irradiance on the surface of the wafer 600.

Hardly any of the light emitted from the lamps 1 belonging to group III, on the other hand, is incident to the diffusion mirror area 21 of the reflecting mirror 2; the major portion is incident to the mirror surface that is specular (the non-diffusion surface) of the reflecting mirror 2 (the whitened portion of the flat mirror 2 in FIG. 1). Of the light emitted from the lamps 1 belonging to group III, therefore, hardly any of the light reflected by the reflecting mirror 2 is diffused light.

The distance between the lamps 1 belonging to group III and the workpiece 6 is set to be as short as possible, and so the light that arrives at the workpiece 6 from the lamps belonging to group III, either directly or indirectly by way of the reflecting mirror 2, does not spread too much. In other words, good zone separation is maintained between group III and group II.

To summarize the above, the heating device of the light irradiation type of this invention has the spacing between lamps 1 as small as possible so that it is suited to the spike annealing process, and uses a flat mirror 2, for example, as the reflecting mirror. At this time, the distance between the light irradiation means and the workpiece 6 is set short so that the optical light path of the light from a lamp 1 that reaches the workpiece 6 after reflection by the reflecting mirror 2 and the optical path of light from a lamp 1 that directly irradiates the workpiece 6 are short, and the zone separation is improved.

For example, when the zones (lamp groups) are group I positioned above the central region of the wafer, group II positioned above the peripheral area of the wafer, and group III which is the lamp group used for irradiation of the guard ring, the reflecting surface of the reflecting mirror 2 is set so that the diffusion mirror area 21 is a region with incident light from the lamps belonging to group I and group II, and with almost no incident light from the lamps 1 belonging to group III.

By means of the constitution described above, the light emitted by the lamps 1 belonging to group I and group II and reflected by reflecting mirror 2 irradiates the workpiece 6 (wafer 600) as diffused light. The conventional ripple component is counteracted by this diffused light, and the uniformity of the distribution of the irradiance on the surface of the wafer is improved as a result.

Further, the light emitted from the lamps 1 belonging to group III and reflected by the reflecting mirror 2 is reflected by the specular reflection area that is the non-diffusion surface of the reflecting mirror 2; hardly any of that light is reflected by the diffusion mirror area 21. Accordingly, good zone separation is maintained between group III and group II.

Here, a ripple component is present in the distribution of the irradiance on the guard ring 5, produced by light that is emitted from the lamps 1 belonging to group III and that arrives at the guard ring 5 either directly or by way of the reflecting mirror 2. However, the guard ring itself is a part of the heating device of the light irradiation type and does not require a uniform distribution of the irradiance on its surface like the workpiece (wafer), and so the presence of ripple does not cause any problem.

In other words, using the heating device of the light irradiation type of this invention it is possible to shorten the length of the optical path of light that is emitted from the lamps 1 and that irradiates the workpiece either directly or by way of the reflecting mirror (a flat mirror 2, for example). And so, zone separation is good, and at the same time, it is possible to suppress the ripple component that has conventionally occurred on the workpiece by shortening the optical path.

For that reason, the heating device of the light irradiation type of this invention can be well-suited to the spike annealing process described above.

(2) Second Embodiment

The constitution of the light irradiation means of the heating device of the light irradiation type of this invention is not limited to the constitution 1 described above. As explained below, a constitution in which there is a light diffusion area is placed in an optically transparent window part is also possible.

Figure 2:
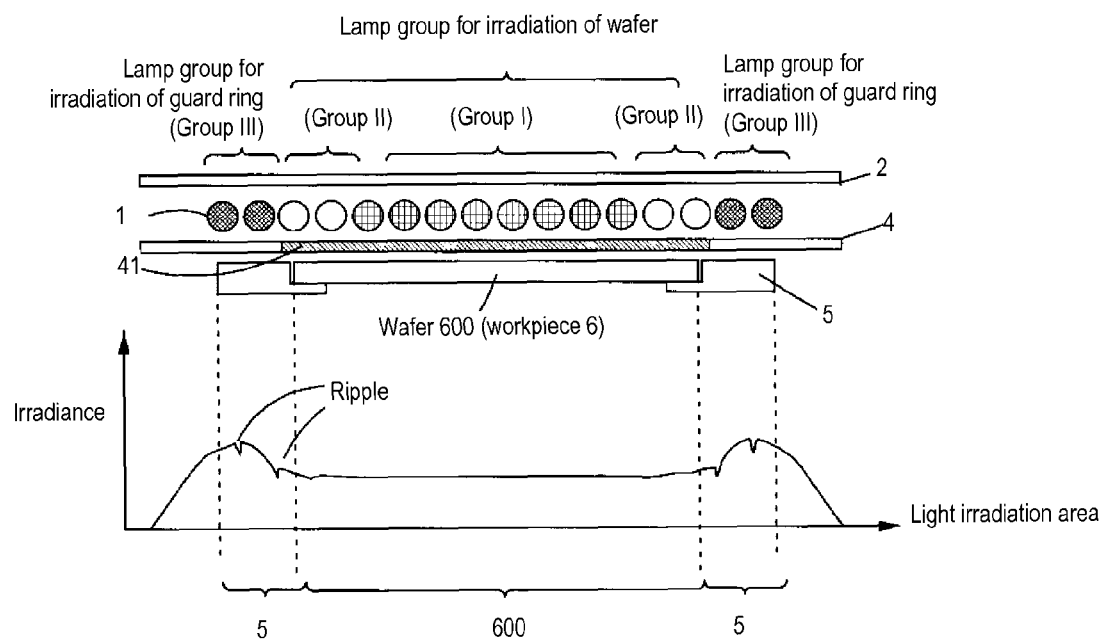
FIG. 2 is a diagram showing second embodiment of the present invention.

Constitution 2, which is another example of constitution of the light irradiation means of the heating device of the light irradiation type of this invention, is shown in FIG. 2.

The light irradiation means shown in FIG. 2, like constitution 1, comprises multiple straight-bulb incandescent lamps 1 arrayed in parallel; the reflecting mirror 2 installed above the lamps 1 is a flat mirror, for example, and there are three zones (lamp groups). That is, the zones are group I located above the central region of the wafer that is the workpiece, group II that is located above the peripheral area of the wafer, and group III that is the lamp group for irradiation of the guard ring.

As in constitution 1 described above, the energy supplied to the lamps is set to decrease in the order, group III, group I, group II.

Further, in the heating device of the light irradiation type of this invention, the distance between the lamps 1 that make up the light irradiation means and the workpiece 6 is set to be as short as possible.

In order to suppress the occurrence of ripple in the distribution of the irradiance on the workpiece 6 in constitution 1 shown in FIG. 1, there is a light diffusion mirror area 21 in the flat mirror that is reflecting mirror 2, in the region where there is incident light from the lamps 1 belonging to group I and group II but hardly any incident light from the lamps 1 belonging to group III.

In the second embodiment shown in FIG. 2, on the other hand, a conventional flat mirror is used as the reflecting mirror 2, and there is a light diffusion area 41 in the optically transparent window part 4.

In other words, in the optically transparent window part 4, there is a light diffusion area 41 in the region where there is incident light from the lamps 1 belonging to group I, located above the central region of the wafer, and group II, located above the peripheral area of the wafer, but hardly any incident light from the lamps 1 belonging to group III, which is the lamp group for irradiation of the guard ring. This light diffusion area 41 is located in the upper region corresponding to the workpiece 6 (wafer 600) so that the diffused light is incident to the full surface of the workpiece 6. Furthermore, the size of the light diffusion area 41 of the optically transparent window part 4 located between the workpiece 6 and the lamps 1 is either the same as the size of the region enclosed by the periphery of the workpiece 6 or a size that is expanded slightly from the periphery of the wafer to include the peripheral area of the wafer.

Here, in embodiment 2, as in embodiment 1, the distance between the light irradiation means and the workpiece 6 is set short so that the optical light path of the light from a lamp 1 that reaches the workpiece 6 after reflection by the reflecting mirror 2 and the optical path of light from a lamp 1 that directly irradiates the workpiece 6 are short, and the zone separation is improved.

By means of this constitution, the light that passes through the light diffusion area 41 of the optically transparent window part 4 after it is emitted from the lamps 1 of group I and group II, either directly or reflected by the flat mirror 2 that is the reflecting mirror, is diffused light that irradiates the workpiece 6. The intensity of this diffused light is averaged, and so the uniformity of the distribution of the irradiance on the surface of the wafer 600, which is the workpiece 6, is improved without production of ripple in the distribution of the irradiance on the surface of the wafer 600.

On the other hand, hardly any light that passes through the light diffusion area 41 of the optically transparent window part 4, after it is emitted from the lamps 1 of group III and reflected by the reflecting mirror 2, and so good zone separation between group III and group II is maintained.

Here, a ripple component is present in the distribution of the irradiance on the guard ring 5, produced by light that is emitted from the lamps 1 belonging to group III and that arrives at the guard ring 5 either directly or by way of the reflecting mirror 2. However, the guard ring itself is a part of the heating device of the light irradiation type and does not require a uniform distribution of the irradiance on its surface like the workpiece (wafer), and so the presence of ripple does not cause any problem.

Accordingly, using an embodiment like embodiment 2 of the heating device of the light irradiation type of this invention, as in the case of embodiment 1, it is possible to shorten the length of the optical path of light that is emitted from the lamps 1 and that irradiates the workpiece 6 either directly or by way of the reflecting mirror 2. And so, zone separation is good, and at the same time, it is possible to suppress the ripple component that has conventionally occurred on the workpiece by shortening the optical path. For that reason, the heating device of the light irradiation type of this invention can be well-suited to the spike annealing process described above.

Now, of the light irradiation means of the heating device of the light irradiation type described in constitution 1, only the reflected light emitted from the lamps 1 belong to group I and group II and reflected by the reflecting mirror 2 is diffused light.

Using the light irradiation means of the heating device of the light irradiation type described in constitution 2, on the other hand, the light emitted from the lamps 1 belong to group I and group II that irradiates the workpiece 6 directly, without being reflected by the reflecting mirror 2, is also diffused light. By this means it is possible to suppress the ripple component described above more efficiently.

(3) Third Embodiment

Figure 3:
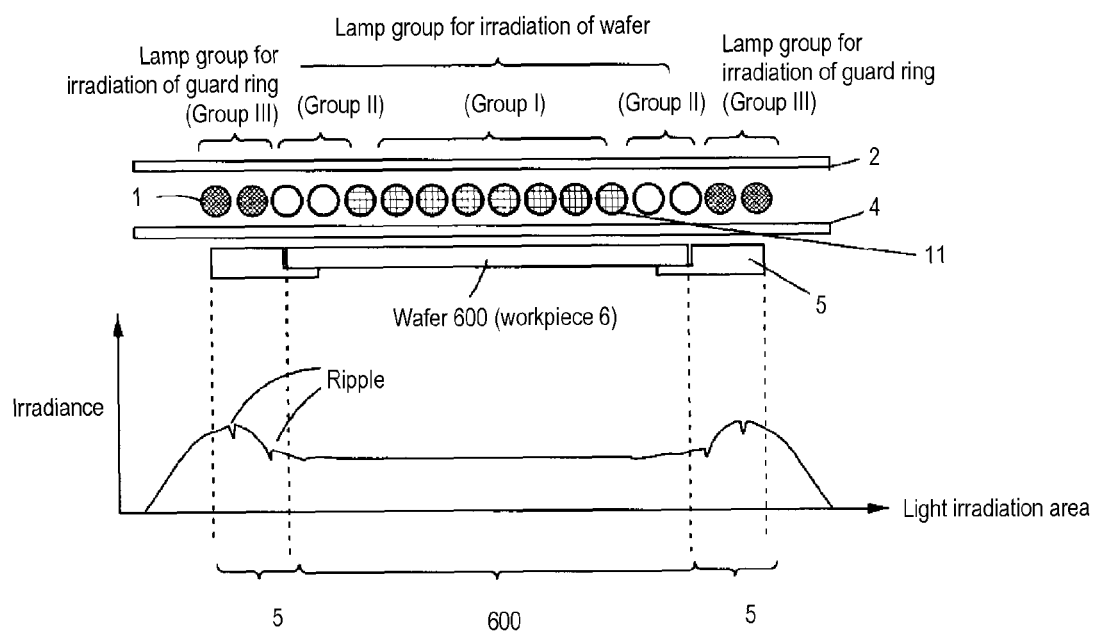
FIG. 3 is a diagram showing a third embodiment of the present invention.

FIG. 3 shows the constitution of another light irradiation means of this invention; the figure schematically shows the constitution of a light irradiation means and also the distribution of the irradiance on the wafer that is the workpiece and guard ring when the wafer and the workpiece are irradiated by this light irradiation means.

The light irradiation means shown in FIG. 3, like schematic 1, comprises multiple straight-bulb incandescent lamps 1 arrayed in parallel; the reflecting mirror 2 installed above the lamps 1 is a flat mirror, for example, and there are three zones (lamp groups). That is, the zones are group I located above the central region of the wafer that is the workpiece, group II that is located above the peripheral area of the wafer, and group III that is the lamp group for irradiation of the guard ring.

Further, control of the zones is the same as in constitution 1 described above; the energy supplied to the lamps is set to decrease in the order, group III, group I, group II. Further, in the heating device of the light irradiation type of this invention, the distance between the lamps 1 that make up the light irradiation means and the workpiece 6 is set to be as short as possible.

This schematic uses multiple lamps 1 of which at least a portion are incandescent lamps having a light diffusion area 11 (indicated by heavy lines in the FIG. 3) as at least part of the light-emitting bulb.

Concretely, the lamps 1 belonging to group I located above the central region of the wafer and the lamps 1 belonging to group II located above the peripheral area of the wafer in this heating device of the light irradiation type are incandescent lamps of which at least a portion of the light-emitting bulb is a light diffusion area 11. The light-emitting bulbs of the lamps 1 belonging to group III, that is, the lamp group for irradiating the guard ring, on the other hand, do not have a light diffusion area 11.

The distance between the lamps 1 that make up the light irradiation means and the workpiece 6 is set to be as short as possible, as mentioned above, and so the optical path of the light from a lamp 1 that reaches the workpiece 6 after reflection by the reflecting mirror 2 and the optical path of light from a lamp 1 that directly irradiates the workpiece 6 are shorter.

By this means, the light from a lamp 1 that reaches the workpiece 6 after reflection by the reflecting mirror 2 and the light from a lamp 1 that directly irradiates the workpiece 6 both arrive at the workpiece 6 without spreading too much. As a result, the proportion of light emitted from each zone that irradiates parts of the regions irradiated by light emitted from other zones is reduced, and zone separation improves.

Here, if lamps 1 that have a light diffusion area 11 on the light-emitting bulbs were not used, ripple would occur in the distribution of the irradiance on the wafer 600 that is the workpiece 6 because of regions on the wafer corresponding to non-light-emitting areas between the lamps, as stated above.

By contrast, in the heating device of the light irradiation type of this constitution there is a light diffusion area 11 on at least a portion of the light-emitting bulbs of the lamps 1 belonging to group I and group II.

In other words, the region of these light diffusion areas 11 is the upper region corresponding to the workpiece 6 (wafer 600), and its size is either the same as the size of the region enclosed by the periphery of the wafer 600 or a size that is expanded slightly from the periphery of the wafer to include the peripheral area of the wafer.

For that reason, the light that is emitted from the lamps 1 belonging to group I and group II and reflected by the reflecting mirror 2 irradiates the workpiece as diffused light. Here, the distance between the lamps 1 belonging to group I and group II and the workpiece 6 is set to be as short as possible, and so the irradiation region of diffused light on the light irradiation region (that is, the surface of the workpiece 6 and the surface of the guard ring 5) is not extended too far.

In other words, the diffused light described above primarily irradiates the surface of the wafer that is the workpiece. This diffused light counteracts the conventional ripple component, and consequently, improves the uniformity of the distribution of the irradiance on the surface of the wafer.

The light emitted from the lamps 1 belonging to group III, on the other hand, is not diffused light because there is no light diffusion area 11 on those light-emitting bulbs. Because the distance between the lamps 1 belonging to the group III and the workpiece 6 (wafer 600) is set to be as short as possible, the light that arrives at the workpiece 6 from the lamps 1 that belong to group III, either directly or indirectly by way of the reflecting mirror, does not spread too much onto the workpiece 6. That is, good zone separation can be maintained between group III and group II.

To sum up, the heating device of the light irradiation type of this embodiment has as little space as possible between lamps so that it can be applied to the spike annealing process, and it uses a flat mirror, for example, as the reflecting mirror. The distance between the light irradiation means and the workpiece is set short so that the length of the optical path of light from the lamps that is reflected by the flat mirror and arrives at the wafer that is the workpiece and the length of the optical path of the light from the lamps that irradiates the wafer directly will be short, which improves zone separation.

Next, when the zones (lamp groups) are group I positioned above the central region of the wafer, group II positioned above the peripheral area of the wafer, and group III positioned for irradiation of the guard ring, the lamps 1 belonging to group I and group II are incandescent lamps of which at least a portion of the light-emitting bulb is a light diffusion area. There is no light diffusion area on the light-emitting bulbs of lamps belonging to group III.

By means of the embodiment described above, the light that is emitted from the lamps 1 of group I and group II and that irradiates the workpiece 6 (wafer 600) directly, and the light that is reflected by the reflecting mirror 2, irradiates the workpiece 6 as diffused light. This diffused light counteracts the conventional ripple component and improves the uniformity of the distribution of the irradiance on the workpiece 6 as a result.

Further, the light emitted from the lamps 1 belonging to group III and irradiates the workpiece 6 directly and the light reflected by the reflecting mirror 2 irradiates the guard ring 5 and its vicinity without being diffused. Accordingly, good zone separation is maintained between group III and group II.

Here, a ripple component is present in the distribution of the irradiance on the guard ring 5, produced by light that is emitted from the lamps 1 belonging to group III and that arrives at the guard ring 5 either directly or by way of the reflecting mirror 2. However, the guard ring itself is a part of the heating device of the light irradiation type and does not require a uniform distribution of the irradiance on its surface, and so the presence of ripple does not cause any problem.

In other words, using the heating device of the light irradiation type of this invention, it is possible to shorten the length of the optical path of light that is emitted from the lamps 1 and that irradiates the workpiece either directly or by way of the reflecting mirror. And so, zone separation is good, and at the same time, it is possible to suppress the ripple component that has conventionally occurred on the workpiece by shortening the optical path. For that reason, the heating device of the light irradiation type of this invention can be well-suited to the spike annealing process described above.

Now, in the event that the intensity of the lamps used cannot be controlled separately along their axial direction, it is desirable to rotate the wafer during light irradiation in order to achieve appropriate zone control for uniformity across the full surface (that is, in two dimensions) of the wafer that is the workpiece. However, there is no real need to rotate the wafer if the lamps used have the light-emitting portion within the light-emitting bulbs subdivided to allow individual control of the power fed to the divided light-emitting portions.

The previously described problems are solved by this invention as follows:

(1) In a heating device of the light irradiation type having an article to be heated, a guard ring located on the periphery of that article, multiple lamps located above the article to be heated and the guard ring, and a reflecting mirror located above the lamps, a light diffusion part is located in the upper region corresponding to the article to be heated so that the diffused light projects onto the entire surface of the article to be heated.

Now, to realize a process of abrupt heating and abrupt cooling (the spike annealing process), the multiple lamps, the reflecting mirror and the article to be heated are located close enough together to produce an area of uneven light intensity on the article to be heated because of drops of irradiance caused by non-light-emitting areas between the lamps. In other words, the lamps, the reflecting mirror and the article to be heated are located so close together that ripple is produced on the article to be heated. Further, as stated previously, during heating to a high temperature the thermal capacity of the guard ring is greater than that of the article to be heated and it is necessary to light-irradiate the guard ring with greater irradiance than the article to be heated.

In such a case, it is desirable that the multiple lamps mentioned above be divided into lamps for irradiation of the article to be heated located above the article to be heated and lamps for irradiation of the guard ring located above the guard ring, and that the light intensity of the lamps for irradiation of the guard ring be made to differ from the light intensity of the lamps for irradiation of the article to be heated (to exercise zone control). By this means, it is possible to eliminate the effect of the difference in thermal capacity between the article to be heated and the guard ring.

(2) In (1) above, the size of the region occupied by the light diffusion area is equal to the size of the region enclosed by the periphery of the article to be heated or a size that includes that region and the peripheral area of the article to be heated.

(3) In (1) or (2) above, the lamps used are incandescent lamps that have, within the light emitting bulb, a light emitting part that is multiply divided in the direction of longitudinal axis of the bulb, which divided light emitting parts can be fed power individually.

(4) In (1), (2) or (3) above, the light diffusion part is a light diffusion area formed on a reflecting mirror.

(5) In (1), (2) or (3) above, the light diffusion part is a light diffusion area formed on an optically transparent window part located between the article to be heated and the lamps.

(6) In (1), (2) or (3) above, the light diffusion part is a light diffusion area formed on the light-emitting bulbs of the lamps.

(7) In the heating method of the light irradiation type in which an article to be heated located within the guard ring of the heating device of the light irradiation type is heated by multiple lamps, the article to be heated is irradiated with diffused light from the light diffusion part located in the upper region corresponding to the article to be heated, and the guard ring is irradiated predominantly with non-diffused light. In other words, of the light that irradiates the guard ring, at least 50% is undiffused light.

(8) In (7) above, the light diffusion part is a light diffusion area formed on the reflecting mirror located above the lamps.

Effects of the Invention

It is possible to obtain the following effects in this invention.

(1) The light diffusion part is installed in the upper region corresponding to the article to be heated, and so the ripple component in the distribution of the irradiance on the article to be heated, which is produced in the event that the length of the optical path of the light from the lamps that irradiates the article to be heated either directly or by way of the reflecting mirror is short and zone separation is good, can be counteracted by diffused light from the light diffusion part.

Further, the light diffusion part is installed in the upper region corresponding to the article to be heated and not in the upper region corresponding to the guard ring, and so light emitted from the lamps located above the guard ring that arrives at the guard ring either directly or by way of the reflecting mirror will not be diffused light.

For that reason, in the event that the length of the optical path from the lamps to the article to be heated is short and zone separation is good, the light emitted from the lamps located above the guard ring will hardly irradiate the article to be heated at all.

Consequently, even if the light intensity of the lamps located above the guard ring and that of the lamps located above the article to be heated are different, it will not effect the distribution of the irradiance on the article to be heated, and uniformity of the distribution of the irradiance on the article to be heated can be maintained.

For this reason, the heating device of the light irradiation type of this invention can be well-suited to the spike annealing process.

Now, a ripple component will be present in the distribution of the irradiance on the guard ring due to light emitted by the lamps and arrives at the guard ring either directly or by way of the reflecting mirror, but the guard ring itself does not require a uniform distribution of the irradiance on its surface, and so the presence of ripple does not cause any problem.

(2) Because the lamps used are incandescent lamps with light-emitting areas within the light-emitting bulbs that are divided along the axial direction of the bulb and power can be supplied separately to the divided light-emitting areas, it is possible to control individually the power fed to the incandescent lamp light-emitting areas.

For this reason, zone control in the axial direction of the lamp bulbs is also possible, and there is no real need to rotate the article to be heated during irradiation. This renders such things as a rotation mechanism unnecessary and makes it possible to simplify the construction.

(3) Forming a light diffusion area on the reflecting mirror makes it unnecessary to install an optically transparent window part having a light diffusion area, or to use special lamps having light diffusion areas.

Forming a light diffusion area on the optically transparent window part or on the light-emitting bulbs of the lamps, on the other hand, makes it possible to diffuse direct and reflected light from the lamps, and not just light that irradiates the article to be heated by way of the reflecting mirror. Compared with the formation of a light diffusion area on the reflecting mirror, therefore, it is possible to counteract more effectively the ripple component in the distribution of the irradiance on the article to be heated.

OPTIMUM MODE OF EMBODIMENT OF THE INVENTION

Specific constitutions of the heating device of the light irradiation type of this invention are explained below.

(1) Embodiment 1

Figure 4:
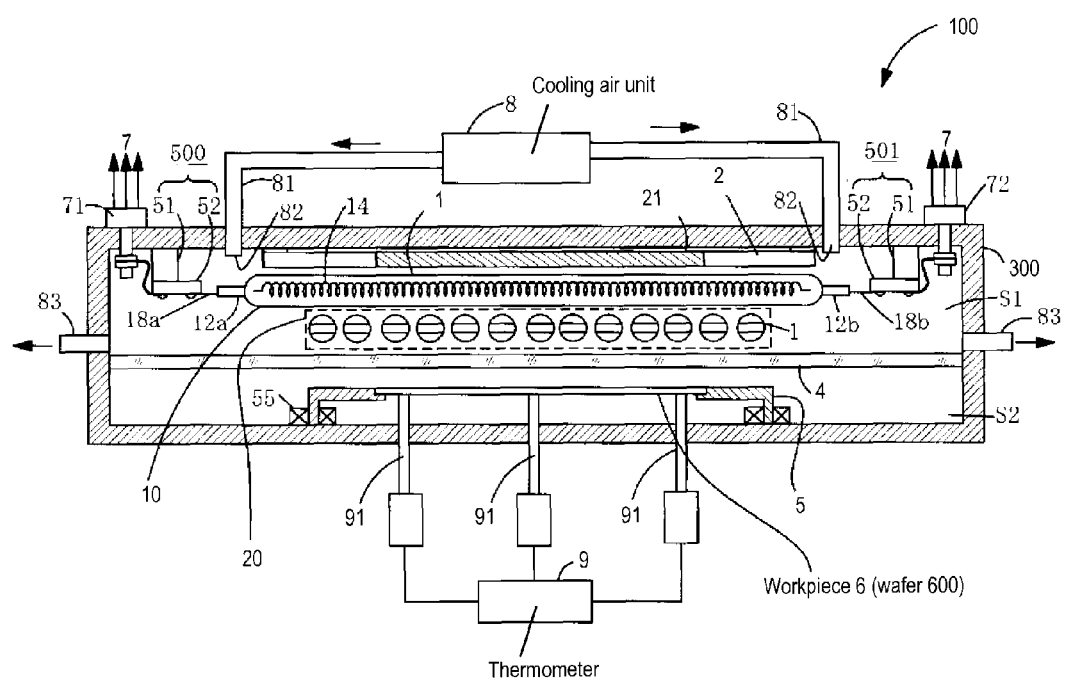
FIG. 4 is a diagram showing the constitution of the heating device of the light irradiation type of the first embodiment of this invention.

FIG. 4 is a diagram to explain the constitution of the heating device of the light irradiation type (also called the "heating device" hereafter) 100 of embodiment 1 of this invention.

As shown in FIG. 4, the heating device 100 has a chamber 300. The interior of the chamber 300 is divided by a quartz window 4 that is an optically transparent window part into a lamp unit accommodation space S1 and a heat-treatment space S2.

The light emitted from the first lamp unit 10 and second lamp unit 20, which are housed in the lamp unit accommodation space S1, passes through the quartz window 4 and irradiates the workpiece 6 (for example, a wafer 600, also called "wafer 600" hereafter) that is placed in the heat-treatment space S2.

The first lamp unit 10 and the second lamp unit 20 each comprises, for example, ten straight-bulb incandescent lamps (also called "lamps 1" hereafter) arrayed in parallel at a specified spacing. A lamp 1 is, for example, a halogen lamp having a single filament 14 within a light-emitting bulb. The two lamp units 10, 20 are placed opposite each other. Now, the axial direction of the lamps 1 that make up the lamp unit 10 is set so as to intersect the axial direction of the lamps 1 that make up the lamp unit 20.

A reflecting mirror 2 is located above the first lamp unit 10. In the heating device shown in FIG. 5 there is a light irradiation means that comprises the first lamp unit 10 and the second lamp unit 20, together with the reflecting mirror 2, all housed in the lamp unit accommodation space S1.

Now, in this heating device, the distance between the first lamp unit 10 and the second lamp unit 20 and the workpiece 6 (a wafer 600, for example) is set as short as possible, in order to be able to handle the spike annealing process.

Within the lamp unit accommodation space S1, cooling air from the cooling air unit 8 is introduced through the squirt holes 82 of the cooling air supply nozzles 81 attached to the chamber 300. The cooling air introduced into the lamp unit accommodation space S1 is blown onto the lamps 1 that make up the first lamp unit 10 and the second lamp unit 20, and cool the light-emitting bulbs of the lamps 1. Here, the seal portions 12a, 12b of the lamps 1 have lower heat-resistance than other points. For that reason, it is preferable that the injection outlet openings 82 of the cooling air supply nozzles 81 be located facing the seal portions 12a, 12b of the lamps 1 to give priority to cooling the seal portions 12a, 12b of the lamps 1. The cooling air that is blown onto the lamps 1 and attains a high temperature by means of heat exchange is then exhausted through the cooling air exhaust ports 83 in the chamber 300. Now, the flow of cooling air is arranged so that the cooling air that has attained a high temperature by means of heat exchange does not heat the lamps 1 instead.

The flow of this cooling air is set to cool the reflecting mirror 2 at the same time. Now, in the event that the reflecting mirror 2 is cooled by a cold-water mechanism, illustration of which has been omitted, the flow of air need not be set to cool the reflecting mirror 2 at the same time.

A pair of power supply ports 71, 72 that are connected to the leads from the power source 7 (not shown) is built into the chamber 300. In the example shown in FIG. 4, the power supply port 71 is electrically connected to the terminal seats 52 fixed to the mounts 51 of the first lamp fixture 500. Further, the power supply port 72 is electrically connected to the terminal seats 52 fixed to the mounts 51 of the first lamp fixture 501.

On the other hand, the terminal seats 52 of the first lamp fixture 500 are electrically connected to the external lead 18a of a lamp 1 of the first lamp unit 10, for example. The terminal seats 52 of the first lamp fixture 501 are electrically connected to the external lead 18b of the lamp 1 of the first lamp unit 10, for example. By means of such a constitution, it is possible to feed power from the power source 7 to the filaments 14 of the lamps 1 in the first lamp unit 10.

Further, the lamps 1 of the second lamp unit 20 are supported by an unillustrated pair of second fixtures.

In the heat-treatment space S2, on the other hand, there is a processing stand to which the workpiece 6 is fixed. For example, in the event that the workpiece 6 is a wafer 600, the processing stand is a thin, ring-shaped body made of a high-melting-point metal, such as molybdenum, tungsten, or tantalum, a ceramic material, such as silicon carbide (SiC), or quartz or silicon (Si); it is desirable to have a guard ring 5 with a stepped structure to support the wafer 600 within its circular opening.

The wafer 600 is fitted into this circular opening of the ring-shaped guard ring 5, and is supported by the step. The guard ring 5 itself is irradiated, reaches a high temperature, and performs compensatory radiation heating of the edge of the wafer 600 that it faces; it compensates for the thermal radiation from the edge of the wafer 600. The temperature drop at the edge of the wafer 600 that is caused by thermal radiation from the edge of the wafer 600 is suppressed by this means.

The light irradiation means in FIG. 4 is based on the first embodiment described previously. That is, there is a light diffusion area on the mirror surface 21 of the reflecting mirror 2 that diffuses the reflected light. Consider the case in which the lamps 1 that make up the first lamp unit 10 and the second lamp unit 20 are divided into a lamp group for irradiation of the wafer placed above the wafer 600, and a lamp group for irradiation of the guard ring (group III). As an example, the lamp group for irradiation of the wafer is further divided into a group I placed above the central region of the wafer and a group 2 placed above the peripheral area of the wafer. In other words, the lamps 1 that make up the first lamp unit 10 and the second lamp unit 20 are divided into three groups, group I, group II, and group III.

Figure 5A:
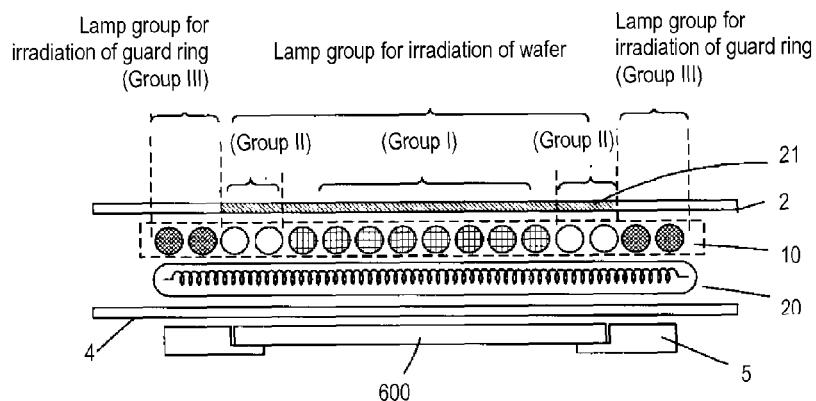
FIGS. 5(a) & 5(b) are diagrams for explaining the positional relationship between the light diffusion area on the mirror surface and the workpiece in the first embodiment (as seen from the direction of the cross section).
Figure 5B:
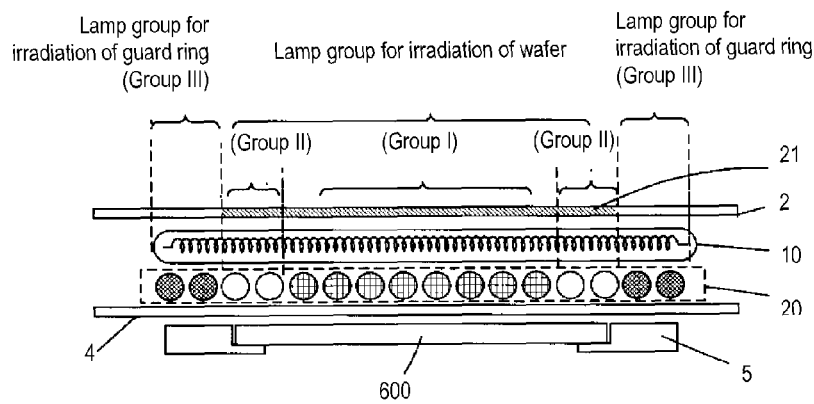
Figure 6:
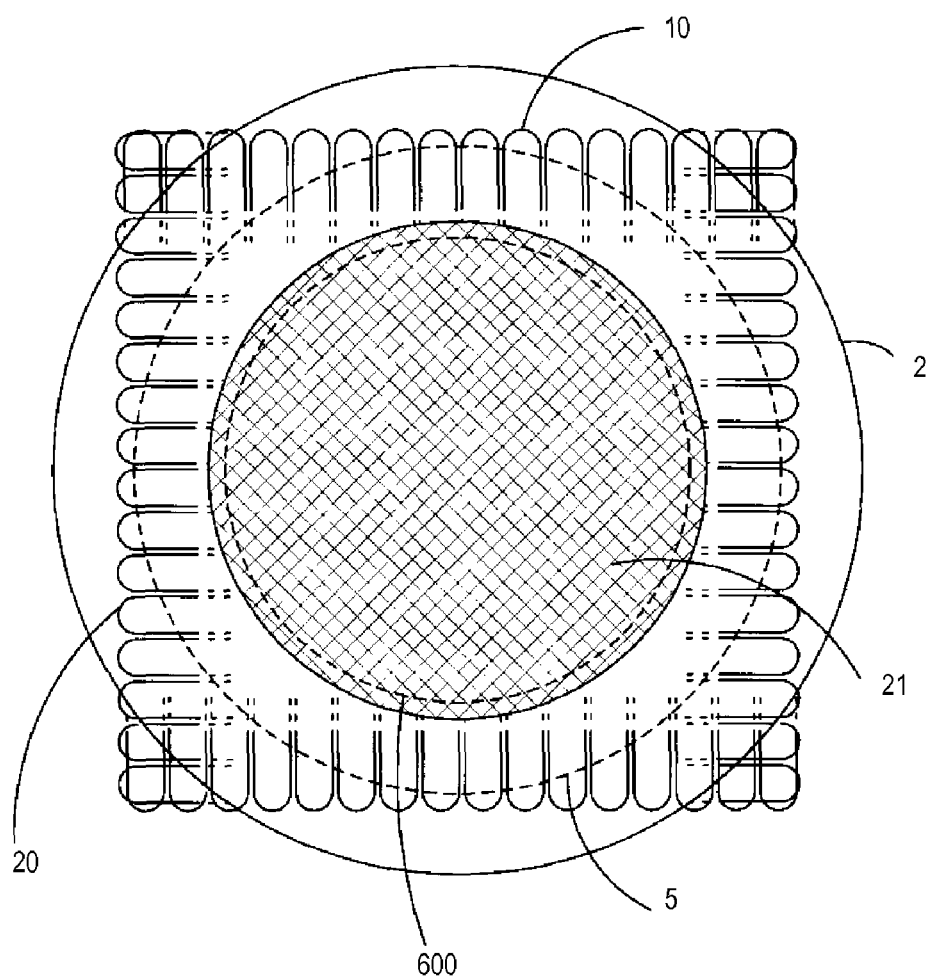
FIG. 6 is a diagram to explain the positional relationship between the light diffusion area on the mirror surface and the workpiece in first embodiment (as seen from above).

FIGS. 5(a), 5(b) & 6 are diagrams that show the positional relationships for placement of the light diffusion area on the mirror surface 21. FIG. 5(a) is a diagram of the lamps 1 that make up the first lamp unit 10 as seen from the direction of the cross section; FIG. 5(b) is a diagram of the lamps 1 that make up the second lamp unit 20 as seen from the direction of the cross section. Further, FIG. 6 is a diagram as seen from above the reflecting mirror 2.

As shown in FIGS. 5(a) & 5(b), the light diffusion area on the mirror surface 21 is set in the region where there is incident light from the lamps 1 belonging to group I and from the lamps 1 belonging to group II and almost no incident light from the lamps 1 belonging to group III. The shape of the wafer 600 that is the workpiece and the shape of the guard ring 5 are both round, and so the light diffusion area on the mirror surface 21 is also round, as shown in FIG. 6.

Further, the part of the reflecting mirror 2 that corresponds to the guard ring 5 is a non-diffusion surface.

By means of the constitution described above, the light that is emitted from the lamps belonging to group I and group II is reflected by the reflecting mirror 2 and irradiates the wafer 600 as diffused light. If, as in conventional devices, the reflecting mirror 2 has a flat, specular surface, the distance between the first lamp unit 10, the second lamp unit 20, and the wafer 600 is set to be as short as possible, a ripple component might occur in the irradiance distribution on the wafer 600 because of the non-light-emitting areas between the lamps that make up the lamp units 10 and 20. However, the heating device of this embodiment counteracts the ripple component by means of diffused light, and the uniformity of the distribution of the irradiance on the wafer surface is improved as a result.

Now, of the light that is emitted from the lamps 1 belonging to group III and reflected by the reflecting mirror 2, hardly any is reflected by the light diffusion area on the mirror surface 21, and almost all is reflected by the specular surface that is the non-diffusion surface of the reflecting mirror 2. Accordingly, good zone separation between group III and group II is maintained. Here, a ripple component is present in the distribution of the irradiance on the guard ring 5 due to light that is emitted from the lamps 1 belonging to group III and that arrives at the guard ring 5 either directly or by way the reflecting mirror 2. However, the guard ring itself does not require a uniform distribution of the irradiance on its surface, and so the presence of ripple does not cause any problem.

The reflecting mirror 2 is, for example, a plate-shaped base made of oxygen-free copper or aluminum and coated with gold. The light diffusion area on the mirror surface 21 is a region formed by shot-blasting the base and then coating with gold the surface that has undergone shot-blast processing.

Now, other methods are conceivable for formation of the light diffusion area on the mirror surface 21, such as chemical processing the surface of the reflecting mirror 2.

An explanation of zone control has been given previously and is omitted here. As mentioned above, zone control can be applied in one direction perpendicular to the axial direction of the straight-bulb lamps. For example, zone control by means of the first lamp unit 10 can be applied in the cross-section direction perpendicular to the axial direction of the lamps 1 that make up the first lamp unit 10, as shown in FIG. 5(a). In the same direction, zone control by means of the second lamp unit 20 cannot be implemented in practice, since the axial direction of the lamps 1 that make up the second lamp unit 20 is not perpendicular to the direction above.

Similarly, zone control by means of the second lamp unit 20 can be applied in the cross-section direction perpendicular to the axial direction of the lamps 1 that make up the second lamp unit 20, as shown in FIG. 5(b). In the same direction, zone control by means of the first lamp unit 10 cannot be implemented in practice, since the axial direction of the lamps 1 that make up the first lamp unit 10 is not perpendicular to the direction above.

In order to apply zone control to the full surface of the workpiece (that is, in two dimensions) by means of each lamp unit, therefore, it is common to rotate the workpiece 6 (wafer 600, for example) during irradiation. Rotation of the workpiece 6 can be achieved by, for example, rotating the guard ring 5 that supports the workpiece 6. In FIG. 4, there are bearings 55 installed on the underside of the guard ring 5; the guard ring 5 is driven to rotate by an unillustrated rotation mechanism. Now, the axis of rotation is at approximately the center of the workpiece 6.

Temperature measurement part 91 are placed on the back side from the irradiation surface of the wafer 600 placed in the guard ring 5, in contact with or close to the workpiece 6. The temperature measurement part 91 are to monitor the temperature distribution of the wafer 600; their number and placement is set in accordance with the dimensions of the wafer 600. The temperature measurement part 91 can use, for example, thermocouples or optical fiber radiation thermometers. The temperature information monitored by the temperature measurement part 91 is transmitted to the thermometer 9. The thermometer 9 calculates the temperatures at the measurement points of each temperature measurement part 91 on the basis of the temperature information transmitted from the temperature measurement part 91.

Now, depending on the type of heat treatment, it is possible to connect a process gas unit, which would introduce and exhaust process gases, to the heat-treatment space S2. For example, if a thermal oxidation process is performed, a process gas unit could be connected to the heat-treatment space S2 to introduce and exhaust oxygen gas and to introduce and exhaust a purge gas (nitrogen gas, for example) to purge the heat-treatment space S2.

(2) Variation of First Embodiment

Figure 7:
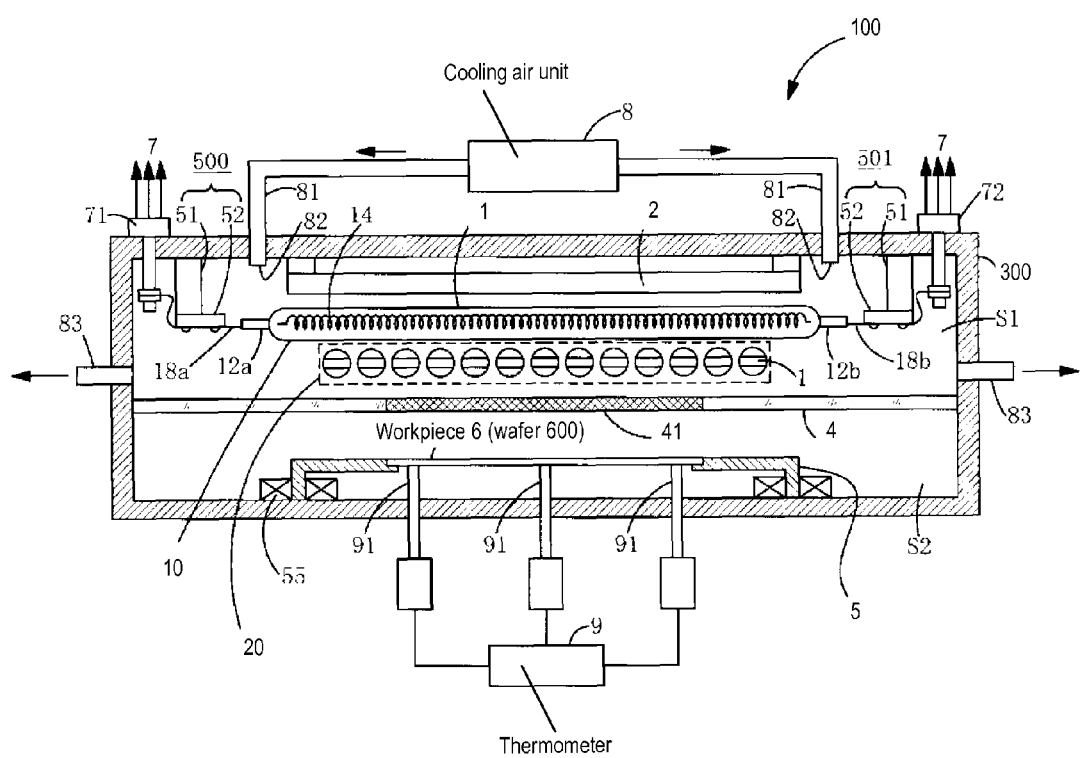
FIG. 7 is a diagram to explain a variation of the first embodiment.

FIG. 7 is a diagram to explain a variation of the heating device in the first embodiment. The structural elements with the same labels as in FIG. 4 are the same as those of the first embodiment, and so explanation is omitted. In this variation, as in the first embodiment, the distance between the first lamp unit 10, the second lamp unit 20, and the workpiece 6 (wafer 600, for example) is set to be as short as possible, as in embodiment 1, to be suited to the spike annealing process. Further, as in embodiment 1, for example, the lamps 1 that make up the first lamp unit 10 and the second lamp unit 20 are divided into three zones. Now, the reflecting mirror 2 is a flat, specular surface mirror as in conventional devices.

The difference between the constitution of the heating device of the variation shown in FIG. 7 and the constitution of the heating device shown in FIG. 4 is that while the light irradiation means in FIG. 4 is based on constitution 1, which was described previously, the light irradiation means in FIG. 7 is based on constitution 2, which was described previously. That is, in this variation, a portion of the quartz window 4 has a light diffusion area 41 in the region where there is incident light from the lamps 1 belonging to group I, located above the central region of the wafer, and group II, located above the peripheral area of the wafer, but hardly any incident light from the lamps 1 belonging to group III, which is the lamp group for irradiation of the guard ring. Now, the shape of the wafer 600 that is the workpiece and the shape of the guard ring 5 are both round, and so the shape of the light diffusion area 41 is round as well.

The method of forming the light diffusion area 41 on a portion of the quartz window 4 could be, for example, rubbing or delustering the window material by a frosting process, or chemical treatment of the lamp-side surface of the window material. Alternatively, it is possible to mix foam into the glass that makes up the window material, or to crystallize (devitrify) the glass.

By means of this constitution, the light from the lamps 1 belonging to group I and group II that passes through the light diffusion area 41, either directly or after being reflected by the flat reflecting mirror 2, irradiates the wafer 600 as diffused light. The intensity of this diffused light is averaged, and so the uniformity of the distribution of the irradiance on the surface of the wafer 600 is improved, with no production of a ripple component in the distribution of the irradiance on the surface of the wafer 600.

On the other hand, of the light that passes through the quartz window 4 after it is emitted from the lamps 1 of group III directly or reflected by the reflecting mirror 2, hardly any passes through the light diffusion area 41, and so good zone separation between group III and group II is maintained.

Here, a ripple component is present in the distribution of the irradiance on the guard ring 5, produced by light that is emitted from the lamps 1 belonging to group III and that arrives at the guard ring 5 either directly or by way of the reflecting mirror 2. However, the guard ring itself does not require a uniform distribution of the irradiance on its surface like the workpiece (wafer), and so the presence of ripple does not cause any problem.

Accordingly, using a constitution like the variation of the first embodiment of the heating device of the light irradiation type of this invention, it is possible to shorten the length of the optical path of light that is emitted from the lamps 1 and that irradiates the workpiece 6 either directly or by way of the reflecting mirror 2. Additionally, zone separation is good, and at the same time, it is possible to suppress the ripple component that has conventionally occurred on the workpiece by shortening the optical path.

For that reason, the heating device of the light irradiation type of this invention can be well-suited to the spike annealing process described above.

Now, of the light irradiation means of the heating device of the light irradiation type described in constitution 1, only the reflected light emitted from the lamps 1 belong to group I and group II and reflected by the reflecting mirror 2 is diffused light. Using the light irradiation means of the heating device of the light irradiation type described in this variation, on the other hand, the light emitted from the lamps 1 belong to group I and group II that irradiates the workpiece 6 directly, without being reflected by the reflecting mirror 2, is also diffused light. By this means, it is possible to suppress the ripple component described above more efficiently.

(3) Heat Treatment by Means of the Heating Device of the Light Irradiation Type of the First Embodiment An example of heat treatment using the heating device of the light irradiation type of this embodiment is given next.

Figure 8:
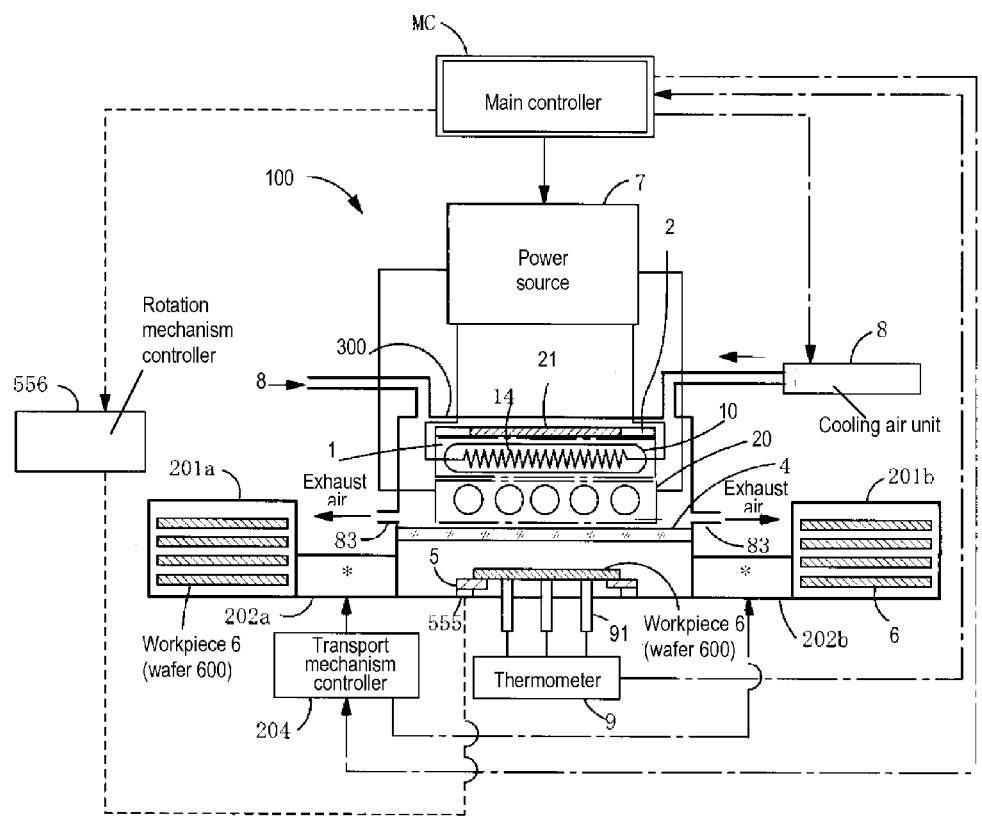
FIG. 8 is a control block diagram to explain the heat treatment process of the heating device of the light irradiation type of first embodiment.

A control block diagram that includes the heating device of the light irradiation type of this invention is shown in FIG. 8 in order to explain an example of heat treatment using this heating device of the light irradiation type. The heating device of the light irradiation type is shown in detail in FIG. 4, and so it is shown in simplified form here.

Figure 9:
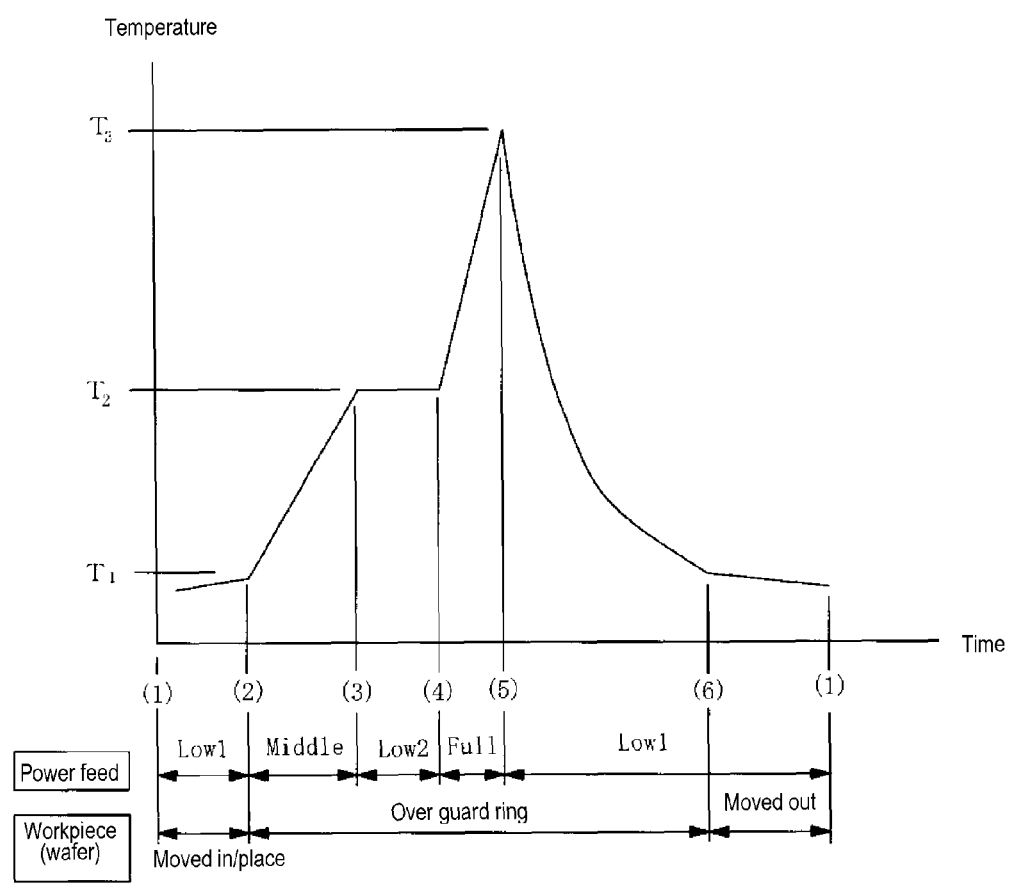
FIG. 9 is a diagram showing the operating conditions of power feed to lamp units in the heat treatment process.

Now, the portions omitted from FIG. 4 are shown in FIG. 8. Further, FIG. 9 shows the operating conditions of power fed to the lamp units in the heat-treatment process. Moreover, a flow chart of an example of heat treatment using the heating device of the light irradiation type of this invention is shown in FIGS. 10 & 11.

The workpiece 6 below is a semiconductor wafer 600, and FIGS. 8, 9, and 10 and 11 are used to explain an example of implementing high-temperature heat treatment by the spike annealing process in order to activate impurity ions driven into the wafer 600 by means of ion implantation.

Now, the lamp units 10, 20 of the heating device 100 have their irradiation conditions set on the basis of zone control as described above.

Figure 10:
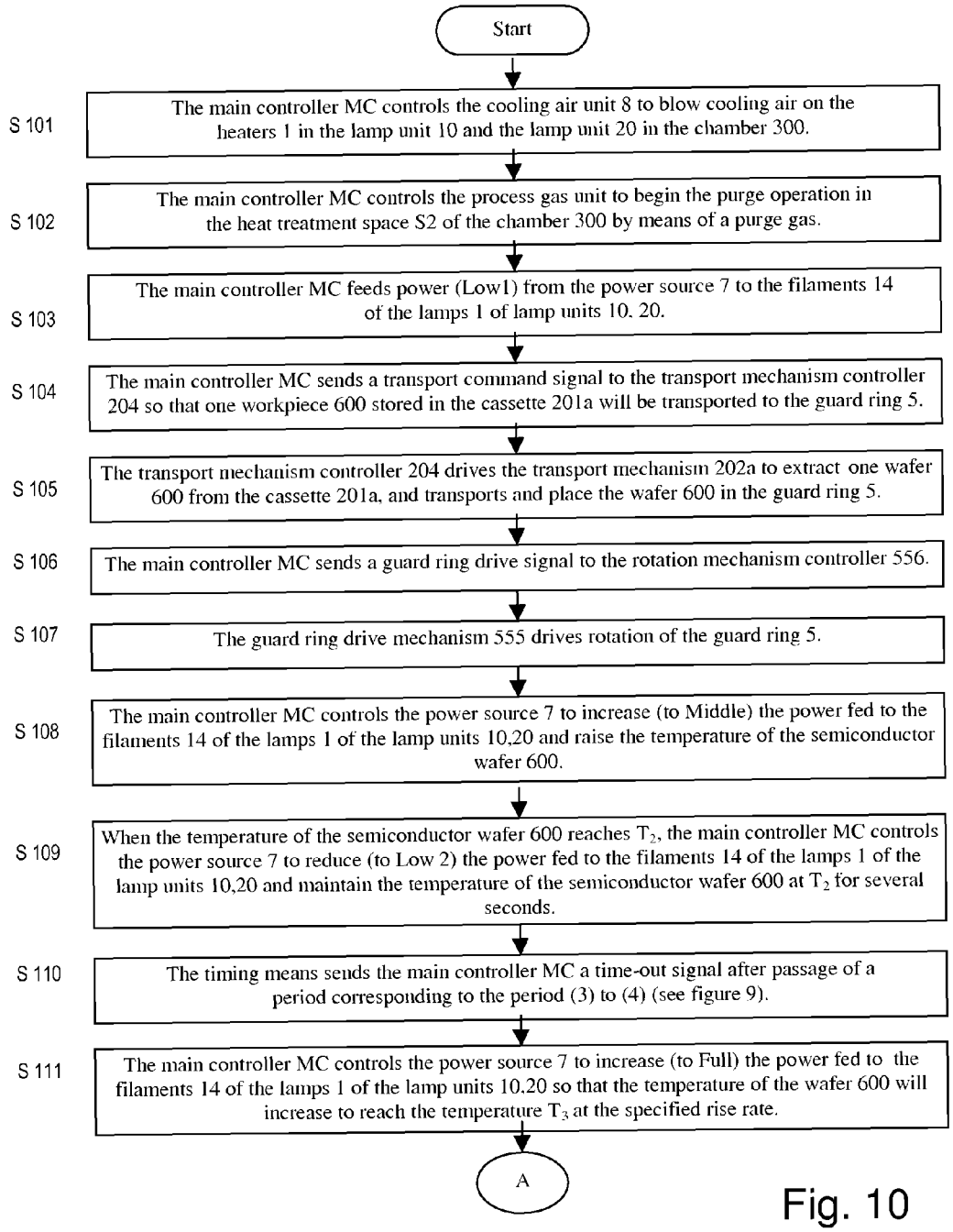
FIG. 10 is the first part of a flow chart of heat treatment using the heating device of the light irradiation type of first embodiment.
Figure 11:
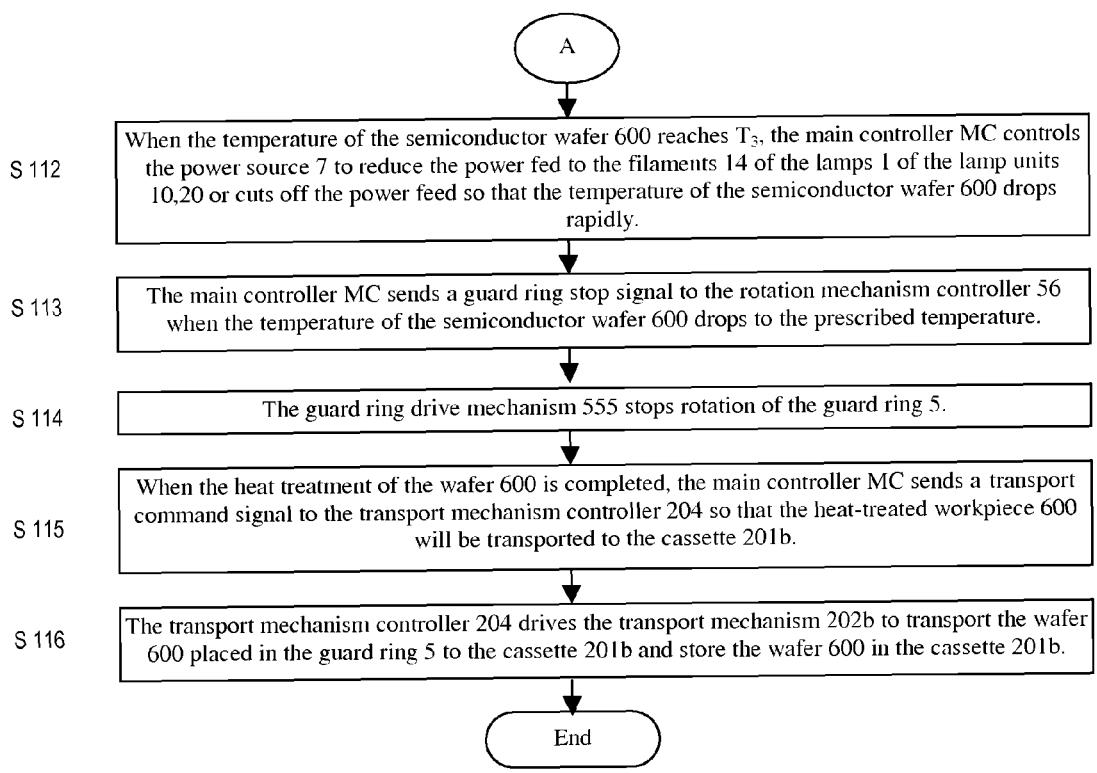
FIG. 11 is a second part of a flow chart of heat treatment using the heating device of the light irradiation type of first embodiment.

A main controller MC controls a cooling air unit 8 to blow cooling air on the lamps 1 in lamp unit 10 and lamp unit 20 within the chamber 300 (step S101, in FIG. 10).

Further, the main controller MC controls the process gas unit, illustration of which is omitted, to begin the purge operation in the heat treatment space S2 of the chamber 300 by means of a purge gas (nitrogen gas, for example) (step S102 in FIG. 10). At this time, the purge gas pressure and the purge gas volume in the heat-treatment space S2 are controlled at the specified values by the process gas unit.

Next, the main controller MC controls a power source 7 that is connected to the filaments 14 of the lamps 1 of the lamp units 10, 20 to feed power to the filaments 14 of the lamps 1 of lamp units 10, 20 (step S103 in FIG. 10). Now, at this time (time point (1) in FIG. 9), the power to be fed in the case of light irradiation of the wafer 600 is a low power (Low1 in FIG. 9) such that the temperature of the wafer 600 will reach a temperature range from room temperature to 350° C.

Sometimes when high power is suddenly fed to the lamp units 10, 20 during heat treatment of a wafer 600, there is a large rush-current flow, and the power source 7 is damaged. For that reason, a small power is fed and the effect of a rush current is suppressed when the lamps 1 that make up the lamp units 10, 20 are lighted. Now, of course, the amount of power fed to the lamps 1 differs from zone to zone.

The main controller MC sends a transport command signal to the transport mechanism controller 204 so that one workpiece 600 stored in the cassette 201*a* will be transported to the guard ring 5 (step S104 in FIG. 10). Having received the transport command signal, the transport mechanism controller 204 drives the transport mechanism 202*a* to extract one wafer 600 from the cassette 201*a*, and transports and place the wafer 600 in the guard ring 5 (step S105 in FIG. 10).

The steps S101 to S105 above are carried out in the time period from (1) to (2) in FIG. 9.

Now, as stated above, following time point (1), the power to be fed in the case of light irradiation of the wafer 600 is a low power (Low1 in FIG. 9) fed to the filaments 14 of the lamps 1 of the lamp units 10, 20 so that the temperature of the wafer 600 will reach a temperature range from room temperature to 350° C. Accordingly, the transport mechanism 202*a* is heated when the wafer 600 is placed in the guard ring 5. The low power condition mentioned above corresponds to conditions such that the temperature reached when the transport mechanism 202*a* is heated is lower than the temperature that can be withstood by the transport mechanism 202*a*.

The main controller MC sends a guard ring drive signal to the rotation mechanism controller 556 (step S106 in FIG. 10). Having received the guard ring drive signal, the guard ring drive mechanism 555 drives rotation of the guard ring 5 (step S107 in FIG. 10).

As shown in FIG. 4, bearings 55 are installed on the underside of the guard ring 5, and the guard ring 5 is driven to rotate, together with the wafer 600 that it holds. The rotation is performed on an axis of rotation at approximately the center of the wafer 600.

The main controller MC controls the power source 7, which is connected to the filaments 14 of the lamps 1 of the lamp units 10, 20, to increase (to Middle in FIG. 9) the power fed to the filaments 14 of the lamps 1 of the lamp units 10, 20 and raise the temperature of the wafer 600 (step S108 in FIG. 10).

When the temperature of the semiconductor wafer 600 reaches $T_2$ (time point (3) in FIG. 9), the main controller MC controls the power source 7 to reduce (to Low2 in FIG. 9) the power fed to the filaments 14 of the lamps 1 of the lamp units 10, 20 and maintain the temperature of the semiconductor wafer 600 at $T_2$ for several seconds to several tens of seconds (step S109 in FIG. 10).

The temperature $T_2$ here is the temperature to which the wafer 600 is heated by light irradiation, but it is a temperature at which dispersion of impurities does not occur, or a temperature at which, if dispersion of impurities does occur, there will be no effect on the film structure (circuit structure) formed on the wafer 600—from 500° C. to 700° C., for example.

Now, the amount of power fed to the lamps 1 in steps S108, S109 differs from zone to zone.

The temperature of the wafer 600 here is monitored by the temperature measurement part 91. Based on the temperature information transmitted by the temperature measurement part 91, a thermometer 9 calculates the temperatures at the points measured by the temperature measurement part 91. Based on the wafer 600 temperature data transmitted from the thermometer 9, the main controller MC determines the time point when the temperature of the wafer 600 reaches $T_2$.

The reason that the temperature of the wafer 600 is maintained at $T_2$ for several seconds to several tens of seconds (from (3) to (4) in FIG. 9) in step S109 is to stabilize the operation of the filaments 14 of the lamps 1 prior to the high-temperature heat treatment, and to stabilize the heat treatment atmosphere so that the temperature will be approximately uniform across the full surface of the wafer 600 that is the workpiece. Now, in the event that radiation thermometers are used as the temperature measurement part 91, the temperature detection threshold (lower limit) for the temperature measurement part 91 will normally be about 500° C. and there will be large temperature measurement errors below that threshold. For that reason, the temperature of the wafer 600 is raised to between 500° C. and 700° C. prior to heat treatment.

Now, data such as the amount of power fed to raise the temperature of the wafer 600 until $T_2$ is reached (Middle in FIG. 9) and the amount of power fed to maintain the temperature of the wafer 600 at $T_2$ (Low2 in FIG. 9) is stored in the main controller MC in advance. The main controller MC controls the power source 7 on the basis of that stored data.

The timing of the period (3) to (4) for stabilization of the heat-treatment atmosphere is performed by a timing means of the main controller MC. The timing means sends the main controller MC a time-out signal after passage of a period corresponding to the period (3) to (4) (step S110 in FIG. 10).

The steps S106 to S110 above are performed during the period (2) to (4) in FIG. 9.

During the period from (4) to (5) in FIG. 9, the main controller MC, having received the time-out signal from the timing means, controls the power source 7 to increase (to Full in FIG. 9) the power fed to the filaments 14 of the lamps 1 of the lamp units 10, 20 so that the temperature of the wafer 600 will increase to reach the temperature $T_3$ (from 1000° C. to 1200° C., for example) at a rise rate of 200° C. to 400° C./s, for example (step S111 in FIG. 10).

When the temperature of the semiconductor wafer 600 reaches $T_3$ (time point (5) in FIG. 9), the main controller MC controls the power source 7 to reduce the power fed to the filaments 14 of the lamps 1 of the lamp units 10, 20 (to Low1 of FIG. 9) or cuts off the power feed so that the temperature of the semiconductor wafer 600 drops rapidly (step S112 in FIG. 11). Now, the main controller MC determines the time point at which the temperature of the wafer 600 reaches $T_3$ on the basis of wafer 600 temperature data transmitted from the thermometer 9.

Now, the amount of power fed to the lamps 1 in steps S111, S112 differs from zone to zone.

When the temperature of the wafer 600 has dropped to a specified temperature (time point (6) in FIG. 9), the main controller MC determines that the wafer 600 has completed the prescribed heat-treatment process and sends a guard ring stop signal to the rotation mechanism controller 556 (step S113 in FIG. 11). Here, the prescribed temperature at time point (6) is set lower that the temperature that can be withstood by the transport mechanism 202b.

Having received the guard ring stop signal, the guard ring drive mechanism 555 stops rotation of the guard ring 5 (step S114 in FIG. 11).

When the heat treatment of the wafer 600 is completed, the main controller MC sends a transport command signal to the transport mechanism controller 204 so that the heat-treated workpiece 600 will be transported to the cassette 201b (step S115 in FIG. 11). Having received the transport command signal, the transport mechanism controller 204 drives the transport mechanism 202b to transport the wafer 600 placed in the guard ring 5 to the cassette 201b and store the semiconductor wafer 600 in the cassette 201b (step S116 in FIG. 11). The heat treatment of one wafer 600 is completed by means of the above procedure.

If another workpiece is to be processed, maintaining the blowing of cooling air on the lamps 1 and, maintaining the introduction of the purge gas to the chamber 300, the procedure in steps S103 to S116 is repeated.

By means of the procedure described above, the temperature of the wafer 600 is increased at a rise rate of 200° C. to 400° C./s and, after the temperature T3 (from 1000° C. to 1200° C., for example) is reached, it is dropped quickly. In other words, the spike annealing process of abrupt heating and abrupt cooling is realized. Accordingly, it is possible to realize activation of impurity ions without affecting the circuit structure that makes up the wafer 600.

(4) Second Embodiment

In the constitution of a heating device of the light irradiation type of the first embodiment 1 shown in FIG. 4, the first lamp unit 10 and the second lamp unit 20 housed in the lamp unit accommodation space S1 are made up of multiple straight-bulb lamps 1 arrayed in parallel with a prescribed spacing.

Both lamp units 10, 20 are located to face each other. Here, the axial direction of the lamps 1 that make up the lamp unit 10 intersects the axial direction of the lamps that make up the lamp unit 20. The lamps 1 of both lamp units 10, 20 are, for example, halogen lamps, each having a single filament 14 within the light-emitting bulb.

As stated previously, if a lamp unit of this sort is used, zone control can be applied in a dimension perpendicular to the axial direction of the straight-bulb lamps. Accordingly, it is necessary to rotate the workpiece 6 (a wafer 600, for example) during light irradiation in order to apply zone control of each unit across the full face of the workpiece 6 (that is, in two dimensions).

Heat treatment of a workpiece 6 is generally performed in a specified gas atmosphere. In the treatment for activation of impurities in the wafer 600 described above, for example, a nitrogen gas atmosphere is used. Further, in the event of thermal oxidation treatment of the wafer 600, an atmosphere that includes oxygen gas is used.

In other words, a specified gas atmosphere is maintained in the heat treatment space S2 during the heat treatment. For that reason, the rotation mechanism, illustration of which is omitted, that rotates the wafer 600 placed in the guard ring 5 must rotate the wafer 600 in a way that does not break down the specified gas atmosphere in the heat treatment space S2. This complicates the constitution.

The constitution of the heating device of the light irradiation type shown in embodiment 2 is able to apply zone control to the full surface of the workpiece (that is, in two dimensions) without rotating the wafer 600 (and the guard ring 5).

Concretely, in the lamps that make up the two lamp units 10, 20, the filaments within the light-emitting bulbs are divided multiply, and have a constitution in which each filament can be fed power independently.

Lamp units 10, 20 are constituted by preparing multiple straight-bulb lamps 1' that have such a filament structure and aligning these lamps 1' with specified spacing.

In this constitution, each filament of each lamp 1' emits light individually, and the power fed to each filament of a lamp 1' can be controlled individually. Accordingly, it is possible to implement zone control in the axial direction of the straight-bulb lamps, which has not been possible with conventional technology. In other words, it is possible to implement zone control with respect to two dimensions of the workpiece, and so there is no need to rotate the workpiece 6 (a wafer 600, for example) during light illumination.

Figure 12:
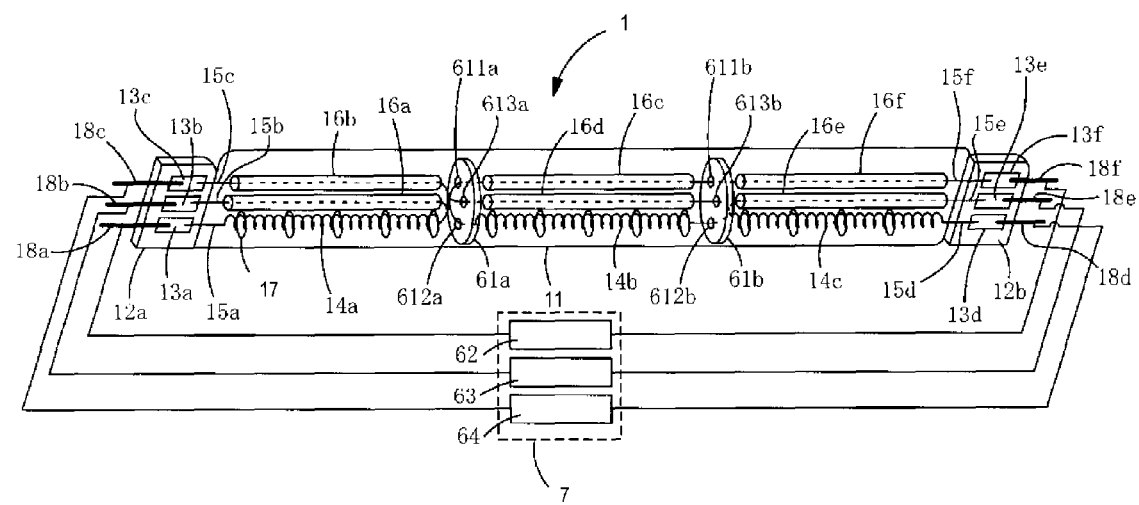
FIG. 12 is a diagram showing detailed structure of the lamp used in the second embodiment and a fourth embodiment.

The detailed structure of this sort of lamp 1' is shown in FIG. 12. An example of a lamp 1' that has three filaments 14a, 14b, 14c is shown in FIG. 12. As shown in FIG. 12, the light-emitting bulb 11 of the lamp 1' has a seal portion 12a at one end and a seal portion 12b at the other end, formed with a seal production method such as pinch sealing, so that the inside of the light-emitting bulb 11 is sealed airtight. An example in which the sealing is performed by pinch sealing is shown in FIG. 12, but the method of seal production is not limited by that.

Now, in FIG. 12, metal foils 13a, 13b, and 13c are buried within the pinch seal of seal portion 12a, and metal foils 13d, 13e, 13f are buried within the pinch seal of seal portion 12b. The metal foils 13a, 13b, 13c, 13d, 13e, and 13f are electrically connected to external leads 18a, 18b, 18c, 18d, 18e, and 18f.

Within the light-emitting bulb 11, there are three filaments 14a, 14b, 14c in order on roughly the same axis. An insulator 61a is placed between filaments 14a and 14b, and an insulator 61b is placed between filaments 14b and 14c. One end of the filament 14a is electrically connected to the lead 15a, and the lead 15a is electrically connected to the metal foil 13a. The other end of the filament 14a is electrically connected to the lead 15f, and the lead 15f is connected to the metal foil 13f.

The lead 15f here passes, in order, through a through hole 611a in the insulator 61a, an insulator bulb 16f that faces filament 14b, a through hole 611b in the insulator 61b, and an insulator bulb 16f that faces the filament 14c.

One end of the filament 14b is electrically connected to the lead 15b, and the lead 15b is electrically connected to the metal foil 13b. The other end of the filament 14b is electrically connected to the lead 15e, and the lead 15e is connected to the metal foil 13e.

The lead 15b here passes, in order, through a through hole 612a in the insulator 61a, an insulator bulb 16a that faces filament 14a, and the lead 15e passes, in order, a through hole 612b in the insulator 61b, and an insulator bulb 16e that faces the filament 14c.

One end of the filament 14c is electrically connected to the lead 15c, and the lead 15c is electrically connected to the metal foil 13c. The other end of the filament 14c is electrically connected to the lead 15d, and the lead 15d is connected to the metal foil 13d.

The lead 15c here passes, in order, through a through hole 613b in the insulator 61b, an insulator bulb 16d that faces filament 14b, a through hole 613a in the insulator 61a, and an insulator bulb 16b that faces the filament 14a.

The filaments 14a, 14b, 14c are supported by multiple anchors 17 that are distributed along the axial direction of the light-emitting bulb 11. The anchors 17 are supported by being sandwiched between the inner wall of the light-emitting bulb 11 and the insulator bulbs 16a, 16d, or 16e.

In the lamp 1', the first power supply 62 is connected between the external leads 18a and 18f, the second power supply 63 is connected between the external leads 18b, 18e, and the third power supply 64 is connected between the external leads 18c, 18d. In other words, the filaments 14a, 14b, 14c are independently fed power by individual power supplies 62, 63, 64. Because the power supplies 62, 63, 64 are variable power supplies, the amount of feeding power can be adjusted, if necessary. Now, the power supplies can feed DC power to the filaments, or they can feed AC power.

That is, by means of the lamps 1' shown in FIG. 12, there are three filaments 14a, 14b, 14c located in order on approximately the same axis, and the filaments 14a, 14b, 14c can be fed power independently by the individual power supplies 62, 63, 64. It is possible, therefore, to regulate the luminous energy emitted from each filament individually. For this reason, the filaments in such lamps make it possible to implement zone control in the axial direction of the straight-bulb lamps that is not conventionally possible.

Now, it is not necessary to use individual power supplies for every filament included in the lamps of the first lamp unit 10 and the second lamp unit 20; depending on the desired distribution of the irradiance, it is possible to connect multiple filaments to a single power supply.

Hereafter, the multiple power supplies are labeled together as the power source 7.

Figure 13:
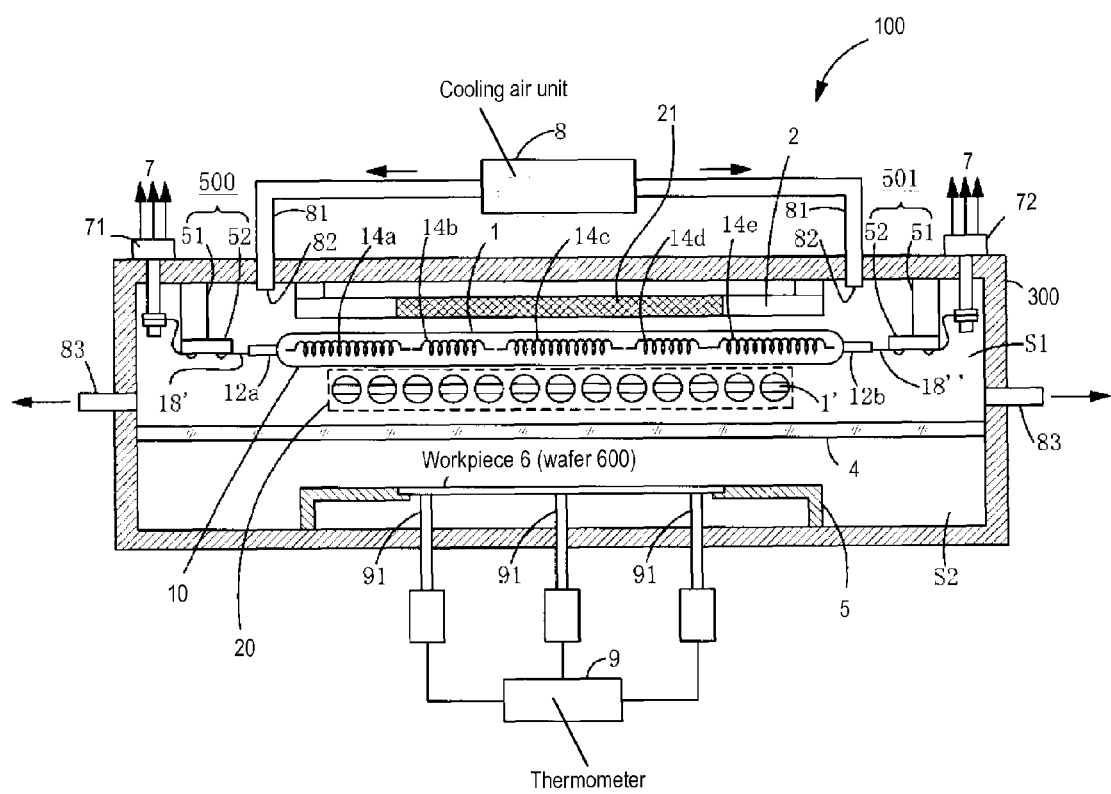
FIG. 13 is a diagram showing the constitution of the heating device of the light irradiation type of the second embodiment of this invention.

FIG. 13 is a diagram to explain the constitution of the heating device of this embodiment, which has a first lamp unit 10 and a second lamp unit 20 that use the lamps 1' described above. Now, in the lamps 1' shown in FIG. 13, the filaments are divided into five filaments 14a, 14b, 14c, 14d, 14e so that it is possible to implement zone control in the axial direction of the lamps using the zones, group I, group II, and group III, as shown in FIG. 5. As in the lamp 1' shown in FIG. 12, the filaments 14a, 14b, 14c, 14d, 14e are constituted so that they can be fed power individually.

Here, the structural elements with the same labels as in FIG. 4 are of the same constitution, and so explanation is omitted.

In FIG. 13, the lamps 1' of the first lamp unit 10 are supported by pairs of first fixtures 500, 501. Taking the number of lamps making up the lamp unit as n1 and the number of divided filaments per lamp as m1 with power being fed independently to all the filaments, the number of pairs of first fixtures 500, 501 will be n1×m1.

The lamps 1' of the second lamp unit 20 are supported by pairs of second fixtures. Taking the number of lamps making up the lamp unit as n2 and the number of divided filaments per lamp as m2 with power being fed independently to all the filaments, the number of pairs of fixtures will be n2×m2.

Installed in the chamber 300, there are pairs of power source feed ports 71, 72 to which power feed lines from the power source 7 are connected. Now, one set of power source feed ports 71, 72 is shown in FIG. 13, but the number of sets of power source feed ports is decided in accordance with the number of lamps 1' and the number of filaments in each lamp.

In the example in FIG. 13, the power source feed ports 71 are electrically connected to the terminal seats 52 of the first lamp fixtures 500. Further, the power source feed ports 72 are electrically connected to the terminal seats 52 of the first lamp fixtures 501.

A terminal seat 52 of a first lamp fixture 500, on the other hand, is electrically connected to, for example, one external lead 18' of the filament 14a of one lamp 1'. A terminal seat 52 of a first lamp fixture 501 is electrically connected to, for example, the other external lead 18" of the filament 14a of the lamp 1'. By means of such a constitution, it is possible to feed power from a power supply to the filament 14a of one lamp 1' in the first lamp unit 10.

The other filaments 14b, 14c, 14d, 14e of that lamp 1', the filaments of the other lamps 1' of the first lamp unit 10, and each of the filaments of the lamps 1' of the second lamp unit 20 are similarly electrically connected by means of the other pair of power source feed ports 71, 72.

The light irradiation means in FIG. 13 is the same as the heating device shown in FIG. 4 and is based on the first embodiment, which was described previously. That is, there is a light diffusion area on the mirror surface 21 of a portion of the reflecting mirror 2, and the portion of the reflecting mirror 2 that corresponds to the guard ring 5 is a non-diffusion surface.

The filaments of the lamps 1' that make up the first lamp unit 10 and the second lamp unit 20 are divided into a filament group for irradiation of the wafer placed above the wafer 600, and a filament group for irradiation of the guard ring (group III). The filament group for irradiation of the wafer is further divided into a group I placed above the central region of the wafer and a group II placed above the peripheral area of the wafer. In other words, the filaments of the lamps 1' that make up the first lamp unit 10 and the second lamp unit 20 are divided into three zones, group I, group II, and group III.

Figure 14:
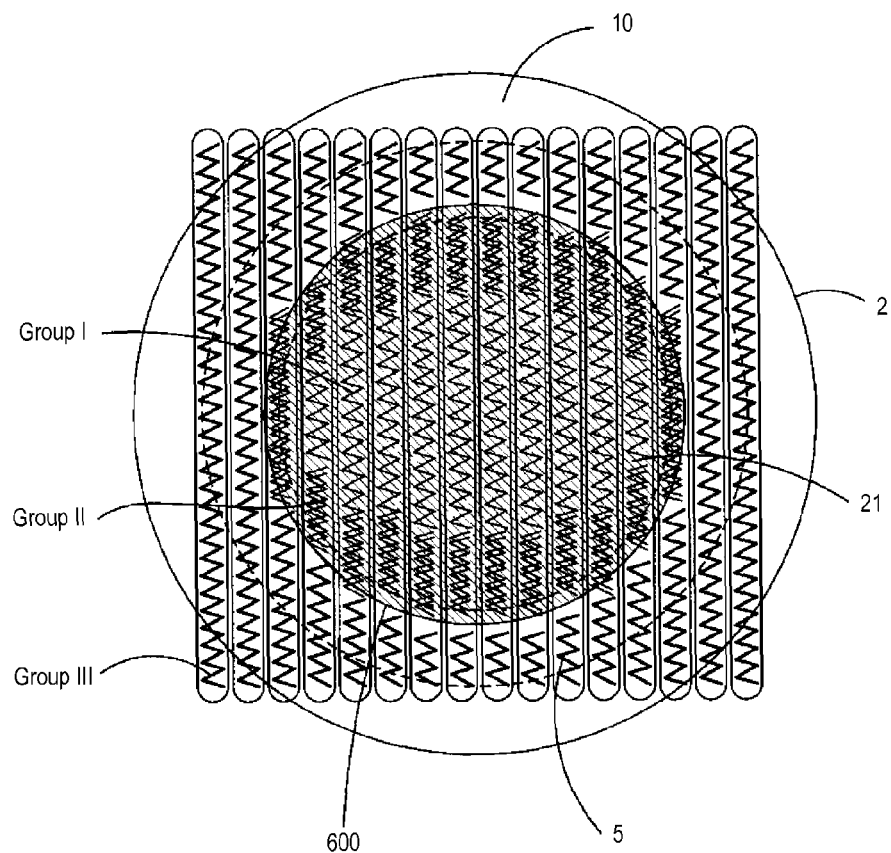
FIG. 14 is a diagram to explain the positional relationship of the first lamp unit, light diffusion mirror area, and workpiece in the second embodiment.
Figure 15:
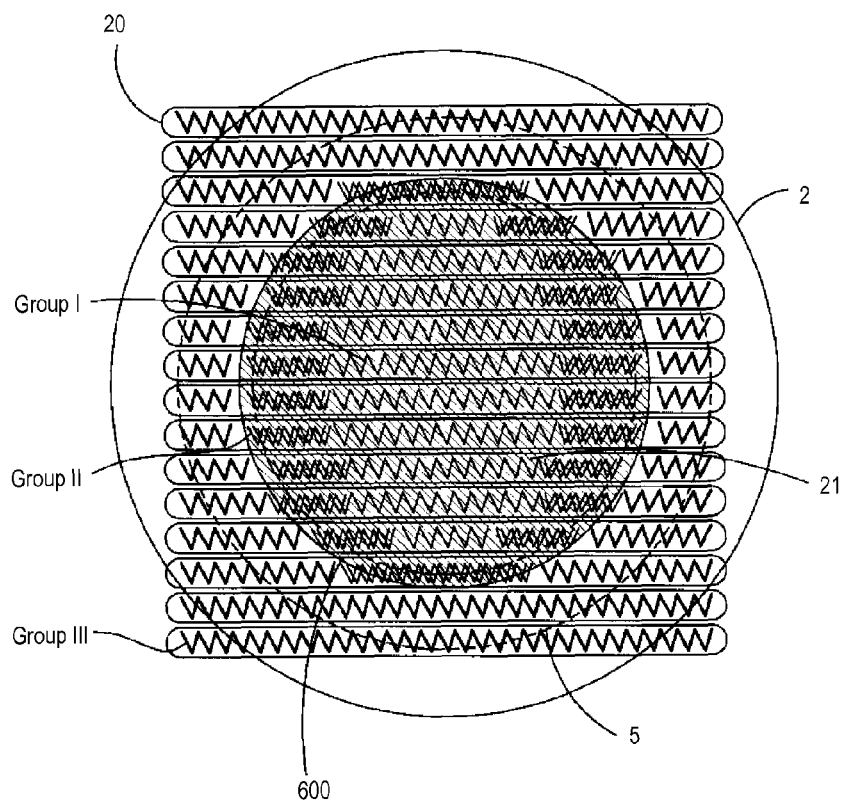
FIG. 15 is a diagram to explain the positional relationship of the second lamp unit, light diffusion mirror area, and workpiece in the second embodiment.

FIGS. 14 & 15 are diagrams that show positional relationships for placement of the light diffusion area on the mirror surface 21. FIG. 14 is a diagram that shows the positional relationship between the light diffusion area on the mirror surface 21 and the first lamp unit 10, and FIG. 15 is a diagram that shows the positional relationship between the light diffusion area on the mirror surface 21 and the second lamp unit 20.

In FIGS. 14 & 15, the filament group shown with single lines corresponds to group I, the filament group shown with double lines corresponds to group II, and the filament group shown with heavy lines corresponds to group III.

As shown in FIG. 14, the light diffusion area on the mirror surface 21 is set in a region on the reflecting surface of the reflecting mirror 2 where, of the light from the lamps 1' of the first lamp unit 10, it receives incident light from the filaments belonging to group I and from the filaments belonging to group II, but hardly any incident light from the filaments belonging to group III.

Also, as shown in FIG. 15, the light diffusion area on the mirror surface 21 is set in a region on the reflecting surface of the reflecting mirror 2 where, of the light from the lamps 1' of the second lamp unit 20, it receives incident light from the filaments belonging to group I and from the filaments belonging to group II, but hardly any incident light from the filaments belonging to group III.

Now, the shape of the wafer 600 that is the workpiece and the shape of the guard ring 5 are both round, and so the light diffusion area on the mirror surface 21 is also round, as shown in FIGS. 6 14 & 15. Further, the part of the reflecting mirror 2 that corresponds to the guard ring 5 is a non-diffusion surface so that undiffused light is incident to the guard ring 5.

By means of the constitution described above, the light that is emitted from the filaments belonging to group I and group II is reflected by the reflecting mirror 2 and irradiates the wafer 600 as diffused light. If, as in conventional devices, the reflecting mirror 2 has a flat, specular surface, the distance between the first lamp unit 10, the second lamp unit 20, and the wafer 600 is set to be as short as possible, and so a ripple component occurs in the irradiance distribution on the wafer 600 because of the non-light-emitting areas between the lamps that make up the lamp units 10 and 20. However, the heating device of this embodiment counteracts the ripple component by means of diffused light, and the uniformity of the distribution of the irradiance on the wafer surface is improved as a result.

Now, of the light that is emitted from the filaments belonging to group III and reflected by the reflecting mirror 2, hardly any is reflected by the light diffusion area on the mirror surface 21, and almost all is reflected by the specular surface that is the non-diffusion surface of the reflecting mirror 2. Accordingly, good zone separation between group III and group II is maintained. Here, a ripple component is present in the distribution of the irradiance on the guard ring 5 due to light that is emitted from the lamps 1 belonging to group III and that arrives at the guard ring 5 either directly or by way the reflecting mirror 2. However, the guard ring itself does not require a uniform distribution of the irradiance on its surface, and so the presence of ripple does not cause any problem.

In the heating device of this embodiment, the filaments in the lamps that make up the lamp units 10, 20 are divided multiply within the light-emitting bulbs and are constituted so that each filament can be fed power independently. Therefore, the filaments are divided into specified zones and the power fed to each of the said filaments is regulated individually. For that reason, it is possible to implement zone control across two dimensions of the workpiece, and so it is not necessary to rotate the workpiece 6 (wafer 600, for example) during light irradiation.

(5) Variation of Second Embodiment

As in the case of embodiment 1, it is possible to constitute light irradiation means based on constitution 2, previously described, as variations of embodiment 2.

Figure 16:
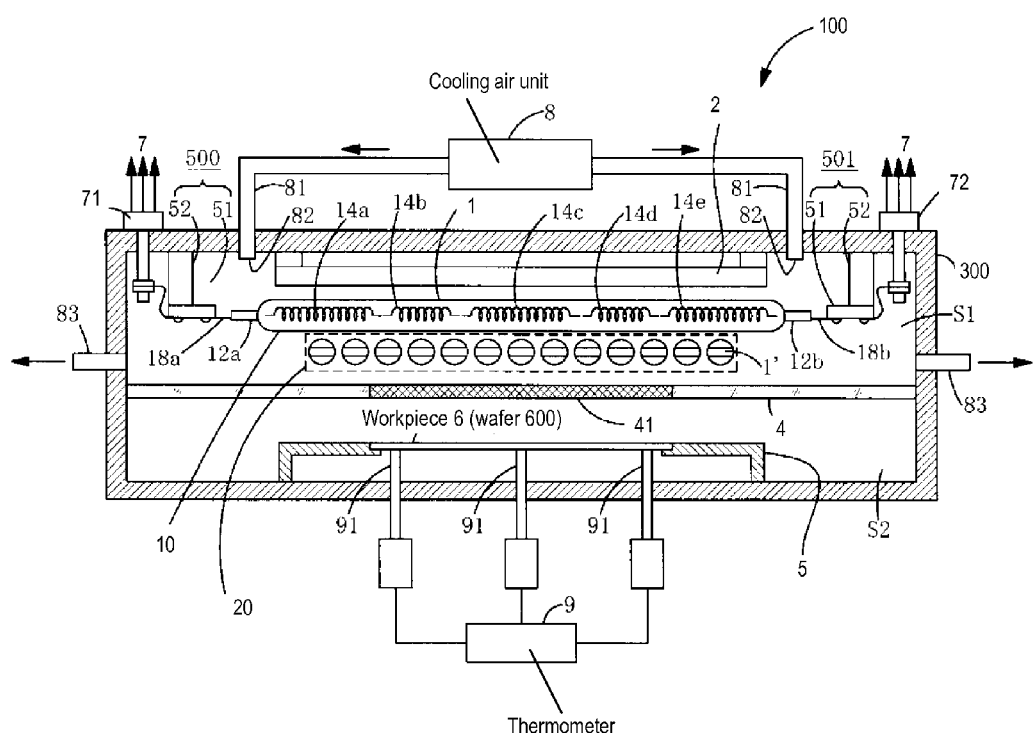
FIG. 16 is a diagram to explain a variation of the second embodiment.

FIG. 16 is a diagram to explain the constitution of a variation of the heating device in the second embodiment. The structural elements with the same labels as in FIG. 13 are of the same constitution as in the first embodiment, and so explanation is omitted. In this variation, as in the second embodiment, the distance between the first lamp unit 10 and the second lamp unit 20 and the workpiece 6 (wafer 600) is set as short as possible, in order to be able to handle the spike annealing process. Further, the filaments of the lamps 1' that makes up the first lamp unit 10 and the second lamp unit 20 are divided into three zones, as in the second embodiment. Now, the reflecting mirror 2 is a flat specular mirror, as in conventional technology.

As stated above, the light irradiation means in FIG. 16 is based on the second embodiment described above.

That is, a part of the quartz window 4 has a light diffusion area 41 in a region where there is incident light from the filaments belonging to group I, located above the central region of the wafer that is the workpiece, and from group II, located above the peripheral area of the wafer, and hardly any incident light from the filaments belonging to group III, which is the lamp group for irradiation of the guard ring. Now, the shape of the wafer 600 that is the workpiece is round and the guard ring 5 is round, and so the shape of the light diffusion are 41 is also round.

By means of this constitution, the light that is emitted by the filaments of group I and group II and passes through the light diffusion area 41 on the quartz window 4, either directly or after reflection by the reflecting mirror 2, irradiates the wafer 600 as diffused light. Because the intensity of this diffused light is averaged, a ripple component is not produced in the distribution of the irradiance on the surface of the wafer 600, and the uniformity of the distribution of the irradiance on the surface of the wafer 600 is improved.

On the other hand, if the light that is emitted from the filaments belonging to group III and passes the quartz window 4, either directly or after reflection by the reflecting mirror 2, hardly any passes through the light diffusion area 41, and so it is not diffused light. Accordingly, good zone separation between group III and group II is maintained.

Here, a ripple component is present in the distribution of the irradiance on the guard ring 5 due to light that is emitted from the filaments belonging to group III and that arrives at the guard ring 5 either directly or by way the reflecting mirror 2. However, the guard ring itself does not require a uniform distribution of the irradiance on its surface, and so the presence of ripple does not cause any problem.

Now, even when the heating device of the light irradiation type is constituted as this variation of embodiment 2, the optical path of the light that is emitted by the filaments and irradiates the workpiece 6, either directly or by way of the reflecting mirror 2, is set to be as short as possible, as in the case of embodiment 2, and so the zone separation is good; at the same time, it is possible to suppress the ripple component that is conventionally produced on the workpiece by making the optical path as short as possible. For that reason, the heating device of the light irradiation type of this variation can be well-suited to the spike annealing process described above.

Now, with the light irradiation means of the heating device of the light irradiation type in first embodiment, only the reflected light that is emitted from filaments belonging to group I and group II and reflected by the flat mirror that is reflecting mirror 2 becomes diffused light. With the light irradiation means of the heating device of the light irradiation type in this variation, on the other hand, the light that is emitted from the filaments belonging to group I and group II and irradiates the wafer 600 directly, not by way of the reflecting mirror 2, also becomes diffused light. Accordingly, it is possible to suppress production of the ripple component more efficiently.

(6) Example of Heat Treatment by Means of the Heating Device of the Light Irradiation Type of Embodiment 2

An example of heat treatment using the heating device of the light irradiation type of second embodiment is shown next.

Figure 17:
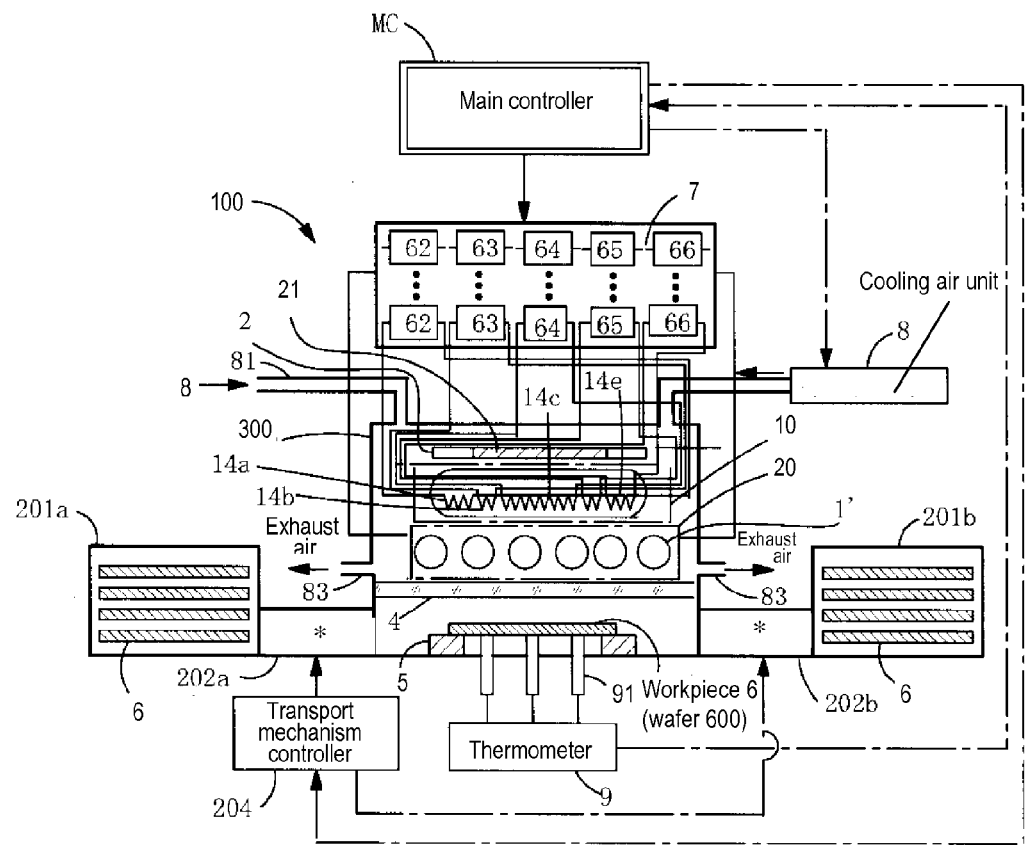
FIG. 17 is a control block diagram to explain the heat treatment process of the heating device of the light irradiation type of the second embodiment.

FIG. 17 shows a control block diagram that includes a heating device of the light irradiation type in order to explain an example of heat treatment using the heating device of the light irradiation type of this invention. Now, the heating device 100 shown in FIGS. 13 & 16 is the one applied here. FIG. 17 is an example of application of the heating device shown in FIG. 13. The heating device 100 here is shown in detail in FIG. 13, and so it is shown in simplified form here. Now, some parts that were omitted in FIG. 13 are described in FIG. 17.

Figure 18:
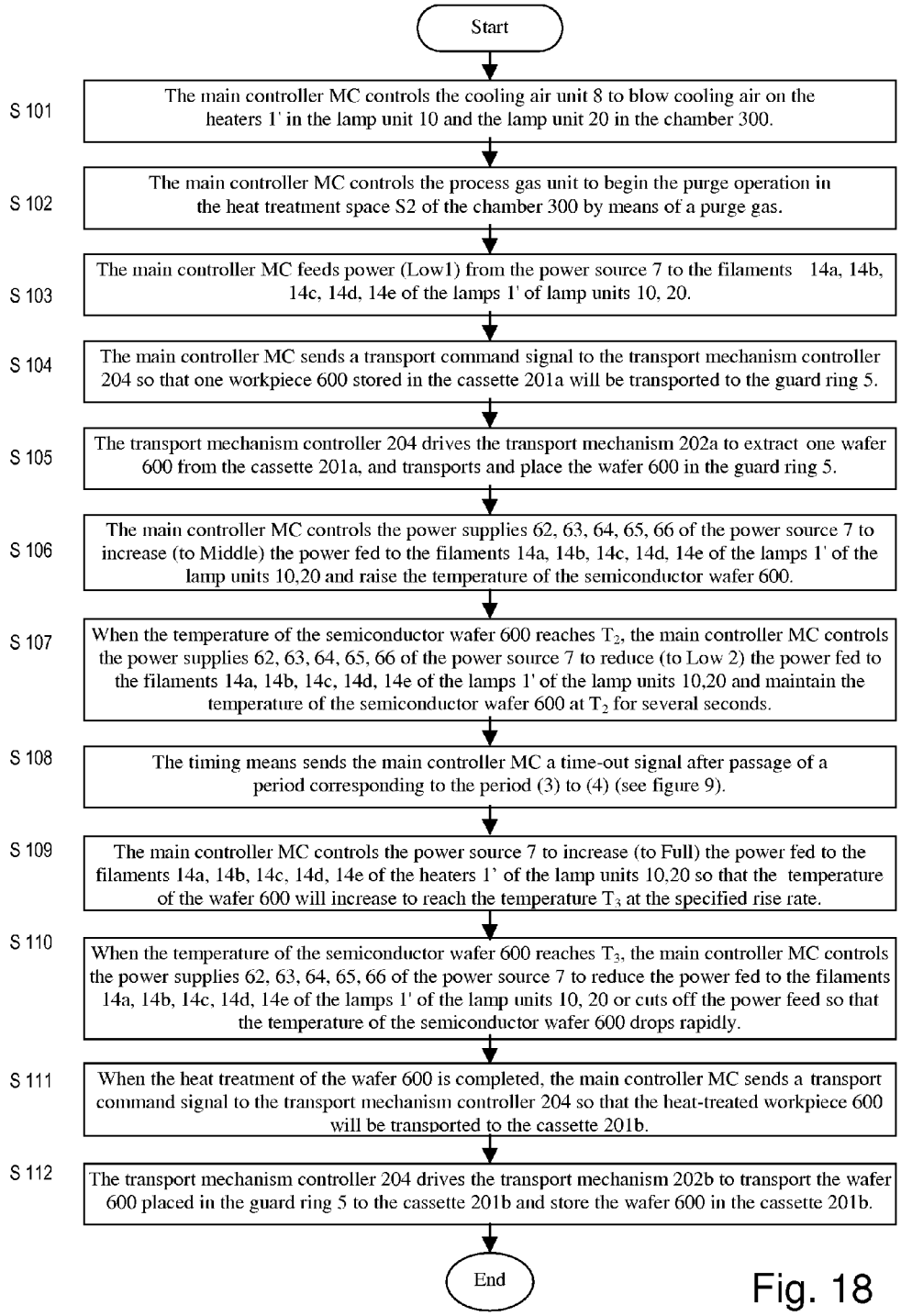
FIG. 18 is a flow chart of heat treatment using the heating device of the light irradiation type of the second embodiment.

FIG. 18 is a flow chart of an example of heat treatment using the heating device of the light irradiation type of this invention. Now, as in the case of the first embodiment, the operating conditions for power feed to the lamp units in the heat-treatment process are shown in FIG. 9.

The workpiece 6 below is a semiconductor wafer 600, and FIGS. 17, 18, & 9 are used to explain an example of implementing high-temperature heat treatment by the spike annealing process in order to activate impurity ions driven into the wafer 600 by means of ion implantation. Now, the filaments of the lamps 1' of lamp units 10, 20 of the heating device 100 have their irradiation conditions set on the basis of zone control as described above.

A main controller MC controls a cooling air unit 8 to blow cooling air on the lamps 1' in lamp unit 10 and lamp unit 20 within the chamber 300 (step S101 in FIG. 18).

Further, the main controller MC controls the process gas unit, illustration of which is omitted, to begin the purge operation in the heat treatment space S2 of the chamber 300 by means of a purge gas (nitrogen gas, for example) (step S102 in FIG. 18). At this time, the purge gas pressure and the purge gas volume in the heat-treatment space S2 are controlled at the specified values by the process gas unit.

Next, the main controller MC controls power supplies 62, 63, 64, 65, 66 of a power source 7 that is connected to the filaments 14a, 14b, 14c, 14d, 14e of the lamps 1' of the lamp units 10, 20 to feed power to the filaments of the lamps 1' of lamp units 10, 20 (step S103 in FIG. 18).

Now, at this time (time point (1) in FIG. 9), the power to be fed in the case of light irradiation of the wafer 600 is a low power (Low1 in FIG. 9) such that the temperature of the wafer 600 will reach a temperature range from room temperature to 350° C. Sometimes when high power is suddenly fed to the lamp units 10, 20 during heat treatment of a wafer 600, there is a large rush-current flow, and there may be damage to the power supplies 62, 63, 64, 65, 66 of the power source 7 or elsewhere. For that reason, a small power is fed and the effect of a rush current is suppressed when the lamps 1' that make up the lamp units 10, 20 are lighted. Now, of course, the amount of power fed to the filaments 14a, 14b, 14c, 14d, 14e differs from zone to zone.

Now, the lamps 1' that make up the lamp units 10, 20 need not all have five filaments; the number can be set as is appropriate to the zone. For example, since the lamps 1' at each end of the lamp units 10, 20 are located above the guard ring 5 only, as shown in FIGS. 14, 15, the number of filaments can be one. Further, the lamps 1' that are located above the peripheral area of the wafer and the guard ring are not present above the central region of the wafer, and so the number of filaments there can be three.

For ease of understanding, the explanation below takes five filaments as representative of the lamps 1'.

The main controller MC sends a transport command signal to the transport mechanism controller 204 so that one workpiece 600 stored in the cassette 201a will be transported and placed to the guard ring 5 (step S104 in FIG. 18). Having received the transport command signal, the transport mechanism controller 204 drives the transport mechanism 202a to extract one wafer 600 from the cassette 201a, and transports and places the wafer 600 in the guard ring 5 (step S105 in FIG. 18). The steps S101 to S105 above are carried out in the time period from (1) to (2) in FIG. 9.

Now, as stated above, following time point (1), the power to be fed to the filaments 14 of the lamps 1' of the lamp units 10, 20 in the case of light irradiation of the wafer 600 is a low power (Low1 in FIG. 9) so that the temperature of the wafer 600 will reach a temperature range from room temperature to 350° C. Accordingly, the transport mechanism 202a is heated when the wafer 600 is placed in the guard ring 5. The low power condition mentioned above corresponds to conditions such that the temperature reached when the transport mechanism 202a is heated is lower than the temperature that can be withstood by the transport mechanism 202a.

The main controller MC controls the power supplies 62, 63, 64, 65, 66 of the power source 7, which is connected to the filaments 14a, 14b, 14c, 14d, 14e of the lamps 1' of the lamp units 10, 20, to increase (to Middle in FIG. 9) the power fed to the filaments 14a, 14b, 14c, 14d, 14e of the lamps 1' of the lamp units 10, 20 and raise the temperature of the wafer 600 (step S106 in FIG. 18).

When the temperature of the semiconductor wafer 600 reaches $T_2$ (time point (3) in FIG. 9), the main controller MC controls the power supplies 62, 63, 64, 65, 66 of the power source 7 to reduce (to Low2 in FIG. 9) the power fed to the filaments 14a, 14b, 14c, 14d, 14e of the lamps 1' of the lamp units 10, 20 and maintain the temperature of the semiconductor wafer 600 at $T_2$ for several seconds to several tens of seconds (step S107 in FIG. 18). The temperature $T_2$ here is the temperature to which the wafer 600 is heated by light irradiation, but it is a temperature at which dispersion of impurities does not occur, or a temperature at which, if dispersion of impurities does occur, there will be no effect on the film structure (circuit structure) formed on the wafer 600 from 500° C. to 700° C., for example.

Now, the amount of power fed to the lamps 1 in steps S106, S107 differs from zone to zone.

The temperature of the wafer 600 here is monitored by the temperature measurement part 91. Based on the temperature information transmitted by the temperature measurement part 91, a thermometer 9 calculates the temperatures at the points measured by the temperature measurement part 91. Based on the wafer 600 temperature data transmitted from the thermometer 9, the main controller MC determines the time point when the temperature of the wafer 600 reaches $T_2$.

The reason that the temperature of the wafer 600 is maintained at $T_2$ for several seconds to several tens of seconds (from (3) to (4) in FIG. 9) in step S107 is to stabilize the operation of the filaments 14 of the lamps 1' prior to the high-temperature heat treatment, and to stabilize the heat treatment atmosphere so that the temperature will be approximately uniform across the full surface of the wafer 600 that is the workpiece. Now, in the event that radiation thermometers are used as the temperature measurement part 91, the temperature detection threshold (lower limit) for the temperature measurement part 91 will normally be about 500° C. and there will be large temperature measurement errors below that threshold. For that reason, the temperature of the wafer 600 is raised to between 500° C. and 700° C. prior to heat treatment.

Now, data such as the amount of power fed to raise the temperature of the wafer 600 until $T_2$ is reached (Middle in FIG. 9) and the amount of power fed to maintain the temperature of the wafer 600 at $T_2$ (Low2 in FIG. 9) is stored in the main controller MC in advance. The main controller MC controls the power source 7 on the basis of that stored data.

The timing of the period (3) to (4) for stabilization of the heat-treatment atmosphere is performed by a timing means of the main controller MC. The timing means sends the main controller MC a time-out signal after passage of a period corresponding to the period (3) to (4) (step S108 in FIG. 18).

The steps S106 to S110 above are performed during the period (2) to (4) in FIG. 9.

During the period from (4) to (5) in FIG. 9, the main controller MC, having received the time-out signal from the timing means, controls the power source 7 to increase (to Full in FIG. 9) the power fed to the filaments 14 of the lamps 1' of the lamp units 10, 20 so that the temperature of the wafer 600 will increase to reach the temperature $T_3$ (from 1000° C. to 1200° C., for example) at a rise rate of 200° C. to 400° C./s, for example (step S109 in FIG. 18).

When the temperature of the semiconductor wafer 600 reaches $T_3$ (time point (5) in FIG. 9), the main controller MC controls the power source 7 to reduce the power fed to the filaments 14 of the lamps 1 of the lamp units 10, 20 (to Low1 of FIG. 9) or cuts off the power feed so that the temperature of the semiconductor wafer 600 drops rapidly (step S110 in FIG. 18). Now, the main controller MC determines the time point at which the temperature of the wafer 600 reaches $T_3$ on the basis of wafer 600 temperature data transmitted from the thermometer 9.

Now, the amount of power fed to the filaments 14a, 14b, 14c, 14d, 14e of the lamps 1' in steps S109, S110 differs from zone to zone.

When the temperature of the wafer 600 has dropped to a specified temperature (time point (6) in FIG. 9), the main controller MC determines that the wafer 600 has completed the prescribed heat-treatment process and sends a transport command signal to the transport mechanism controller 204 so that the heat-treated workpiece 600 will be transported to the cassette 201b (step S111). Having received the transport command signal, the transport mechanism controller 204 drives the transport mechanism 202b to transport the wafer 600 placed in the guard ring 5 to the cassette 201b and store the semiconductor wafer 600 in the cassette 201b (step S112).

The heat treatment of one wafer 600 is completed by means of the above procedure.

If another workpiece is to be processed, maintaining the blowing of cooling air on the lamps 1' and, maintaining the introduction of the purge gas to the chamber 300, the procedure in steps S103 to S112 is repeated.

By means of the procedure described above, the temperature of the wafer 600 is increased at a rise rate of 200° C. to 400° C./s and, after the temperature $T_3$ (from 1000° C. to 1200° C., for example) is reached, it is dropped quickly. In other words, the spike annealing process of abrupt heating and abrupt cooling is realized. Accordingly, it is possible to realize activation of impurity ions without affecting the circuit structure that makes up the wafer 600.

(7) Third Embodiment

In the first and second embodiments, a light diffusion area is placed on a part of the reflecting mirror or the quartz window 4, but in the third embodiment, explained below, the light diffusion area is placed on the light-emitting bulbs located above the workpiece.

Figure 19:
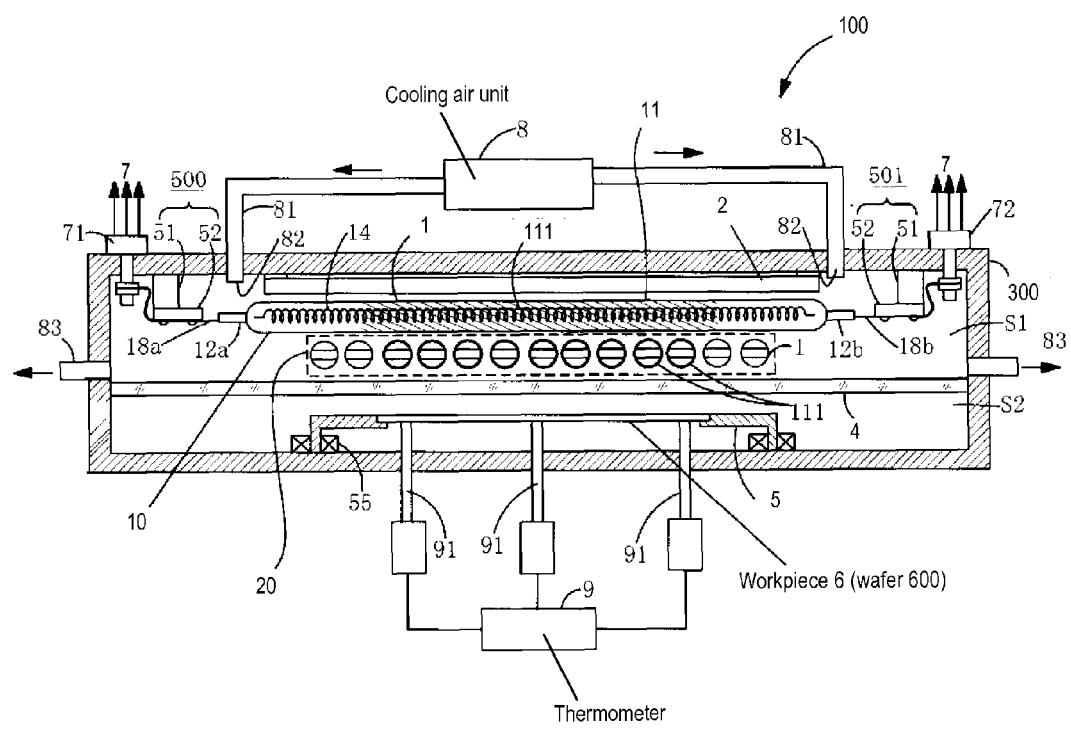
FIG. 19 is a diagram showing the constitution of the heating device of the light irradiation type of the third embodiment of this invention.

The constitution of the heating device of the light irradiation type of this embodiment is explained below. FIG. 19 is a diagram to explain the structure of the heating device of the light irradiation type (also called the "heating device" hereafter) 100 of this embodiment. In this embodiment, a light diffusion area is located on the light-emitting bulb of the lamp, not on the reflecting mirror or the quartz window; otherwise the structure is the same as embodiment 1.

As shown in FIG. 19, the heating device 100 has a chamber 300. The interior of the chamber 300 is divided by a quartz window 4, which is an optically transparent window part, into a lamp unit accommodation space S1 and a heat-treatment space S2.

As in the first and second embodiments, heat treatment of the workpiece 6 (for example, a semiconductor wafer 600, also called a "wafer 600" hereafter) is performed by irradiating the workpiece with light that is emitted from a first lamp unit 10 and a second lamp unit 20, which are housed in the lamp unit accommodation space S1, and that passes through the quartz window 4.

The first lamp unit 10 and the second lamp unit 20 housed in the lamp unit accommodation space S1 each comprise, for example, ten straight-bulb incandescent lamps 1 (also called "lamps 1" hereafter) arrayed in parallel. A lamp 1 is, for example, a halogen lamp having a single filament 14 in a light-emitting bulb 11 made of quartz. The two lamp units 10, 20 are placed facing each other. Now, the axial direction of the lamps 1 of the lamp unit 10 is set so that it intersects the axial direction of the lamps 1 that make up the lamp unit 20.

A reflecting mirror 2 is located above the first lamp unit 10. As explained in embodiment 1, the reflecting mirror 2 is, for example, a plate-shaped base made of oxygen-free copper or aluminum and coated with gold, but in this embodiment there is no light diffusion area on the reflecting mirror 2.

In the heating device shown in FIG. 19, the light irradiation means comprises the first lamp unit 10, the second lamp unit 20, and the reflecting mirror 2, all housed in the lamp unit accommodation space S1. Now, in the heating device of this embodiment, the distance between the first lamp unit 10 and the second lamp unit 20 and the workpiece 6 (a wafer 600, for example) is set as short as possible, in order to be able to handle the spike annealing process.

Of the lamps 1 that make up the lamp units 10, 20, those located above the wafer 600 have a light diffusion area 111 on their light-emitting bulbs 11. The light diffusion area could be formed by, for example, rubbing or delustering the window material by a frosting process, or chemical treatment of the lamp-side surface of the window material. Alternatively, it is possible to mix foam into the glass that makes up the window material, or to crystallize (devitrify) the glass. Now, the positional relationship between the light diffusion area 111 and the wafer 600 is described hereafter.

In the lamp unit accommodation space S1, as explained relative to the first embodiment, cooling air from a cooling air unit 8 is introduced through squirt holes 82 of the cooling air supply nozzles 81 attached to the chamber 300 to cool the light-emitting bulbs of the lamps 1 of the first lamp unit 10 and the second lamp unit 20. Here, as stated previously, it is preferable that the squirt holes 82 of the cooling air supply nozzles 81 be located facing the seal portions 12a, 12b of the lamps 1 to give priority to cooling the seal portions 12a, 12b of the lamps 1. The cooling air that is blown onto the lamps 1 and attains a high temperature by means of heat exchange is then exhausted through the cooling air exhaust ports 83 in the chamber 300. Now, the flow of cooling air is arranged so that the cooling air that has attained a high temperature by means of heat exchange does not heat the lamps 1 instead.

A pair of power supply ports 71, 72 connected to the leads from the unillustrated power source 7 is built into the chamber 300. The power supply port 71 is electrically connected to the terminal seats 52 fixed to the mounts 51 of the first lamp fixture 500. Further, the power supply port 72 is electrically connected to the terminal seats 52 fixed to the mounts 51 of the first lamp fixture 501.

On the other hand, the terminal seats 52 of the first lamp fixture 500 are electrically connected to the external lead 18a of a lamp 1 of the first lamp unit 10, for example. The terminal seats 52 of the first lamp fixture 501 are electrically connected to the external lead 18b of the lamp 1 of the first lamp unit 10, for example. By means of such a constitution, it is possible to feed power from the power source 7 to the filaments 14 of the lamps 1 in the first lamp unit 10.

In the heat-treatment space S2, moreover, there is a processing stand to which the workpiece 6 is fixed. For example, in the event that the workpiece 6 is a wafer 600, the processing stand is a thin, ring-shaped body made of a high-melting-point metal such as molybdenum, tungsten, or tantalum, a ceramic material such as silicon carbide (SiC), or quartz or silicon (Si); it is desirable to have a guard ring 5 with a stepped structure to support the wafer 600 within its circular opening.

The guard ring 5 itself is irradiated, reaches a high temperature, and performs compensatory radiation heating of the edge of the wafer 600 that it faces; it compensates for the thermal radiation from the edge of the wafer 600. The temperature drop at the edge of the wafer 600 that is caused by thermal radiation from the edge of the wafer 600 is suppressed by this means.

The positional relationship between the lamps 1 with a light diffusion area 111 and the workpiece 6 is explained next.

Figure 20A:
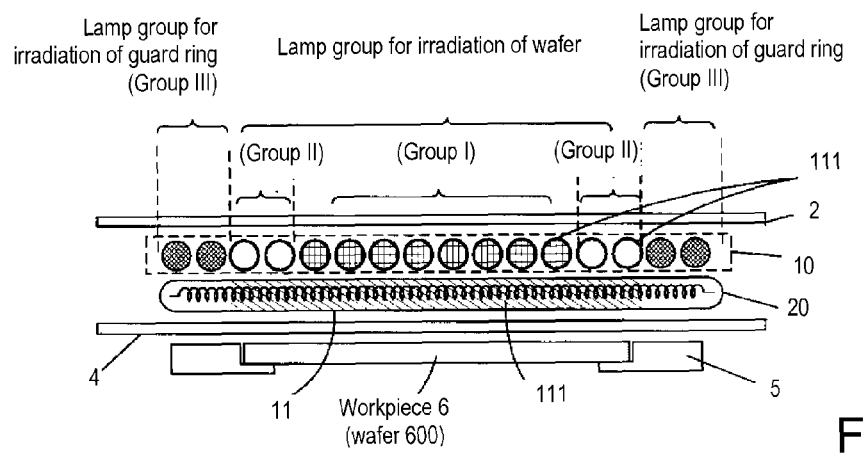
FIGS. 20(a) & 20(b) are diagrams for explaining the positional relationship between the light diffusion area on the lamp and the workpiece in the third embodiment (as seen from the direction of the cross section).
Figure 20B:
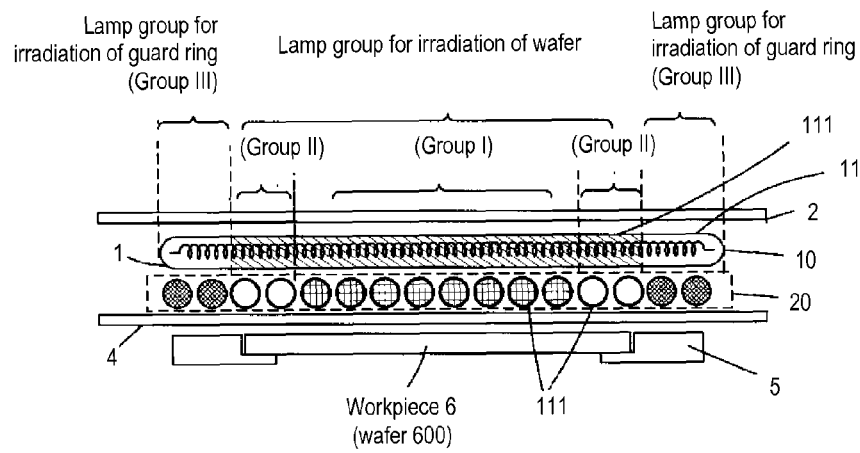
Figure 21:
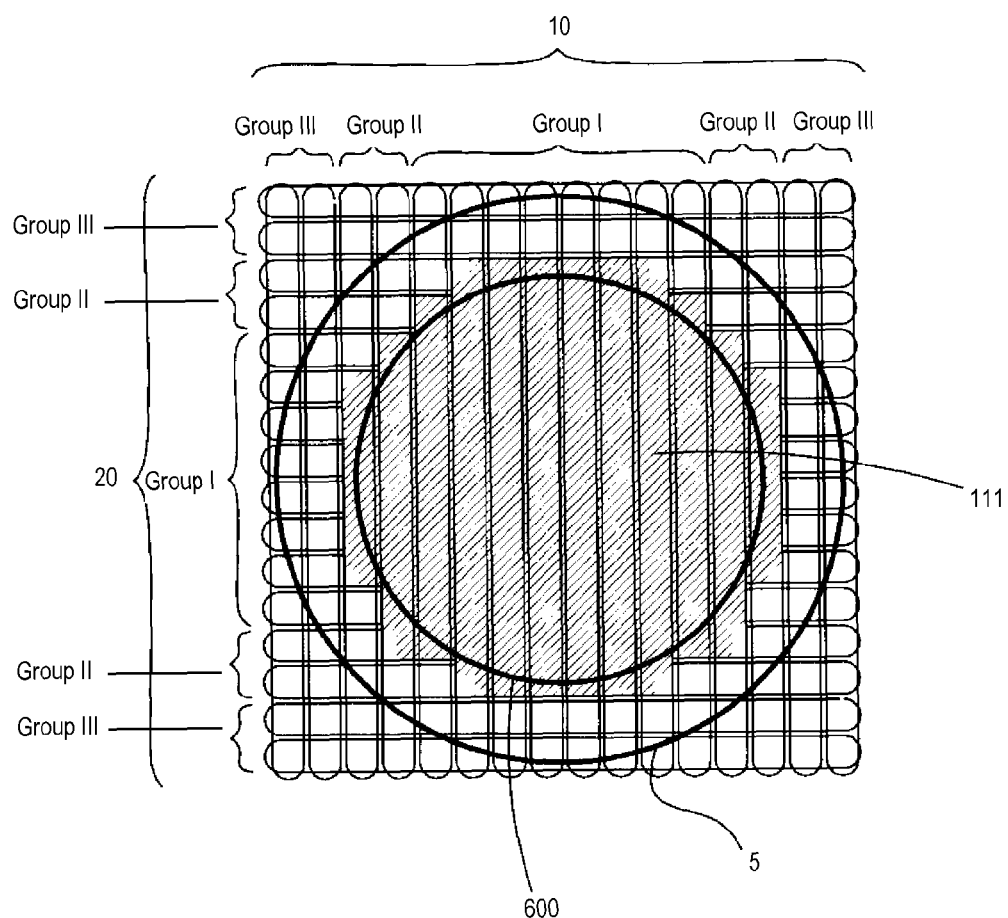
FIG. 21 is a diagram to explain the positional relationship between the light diffusion area on the lamp and the workpiece in the third embodiment (as seen from above).

FIGS. 20 & 21 are diagrams that show the positional relationships between the lamps 1 with light diffusion areas and the workpiece 6. FIG. 20 (a) is a diagram of the lamps 1 that make up the first lamp unit 10 as seen from the direction of the cross section; FIG. 20 (b) is a diagram of the lamps 1 that make up the second lamp unit 20 as seen from the direction of the cross section. Further, FIG. 21 is a diagram as seen from above the reflecting mirror 2.

Now, zone separation is established as follows.

That is, the lamps 1 that make up the first lamp unit 10 and the second lamp unit 20 are divided into a lamp group for irradiation of the wafer placed above the wafer 600, and a lamp group for irradiation of the guard ring (group III). As an example, the lamp group for irradiation of the wafer is further divided into a group I placed above the central region of the wafer and a group 2 placed above the peripheral area of the wafer. In other words, the lamps 1 that make up the first lamp unit 10 and the second lamp unit 20 are divided into three zones, group I, group II, and group III.

As shown in FIG. 20, of the lamps 1 that make up the lamp units 10, 20, those lamps 1 belonging to group I and group II above the wafer 600 have light diffusion areas 111 on their light-emitting bulbs 11. The lamps 1 belong to group III, which is the group of lamps for irradiation of the guard ring, on the other hand, do not have light diffusion areas 111 on their light-emitting bulbs 11.

The light diffusion areas 111 here are formed on portions of the light-emitting bulbs 11 in consideration of the shape of the wafer 600 that is the workpiece and the shape of the guard ring 5, as shown in FIG. 21.

Further, the light diffusion areas 111 are not necessarily placed all around the outer surface of the light-emitting bulbs 11; they can be placed on the outer surface of the light-emitting bulbs 11 in certain directions only.

Figure 22A:
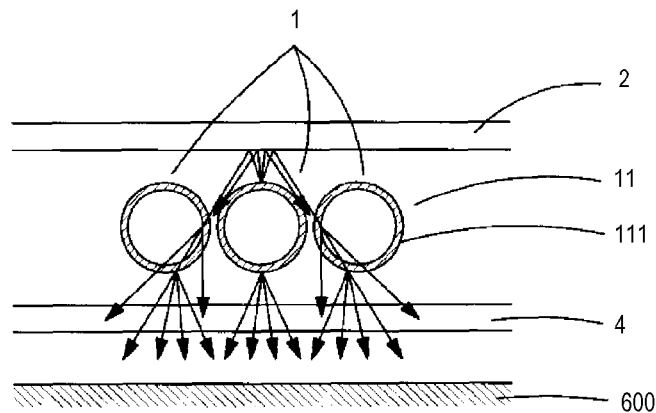
FIG. 22(a) & 22(b) are diagrams for explaining an example of formation of the light diffusion area.
Figure 22B:
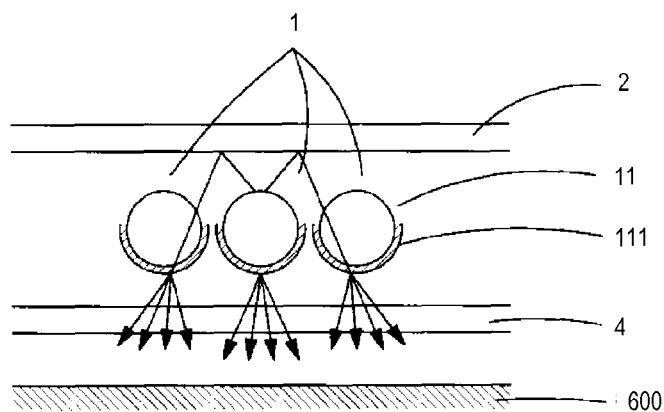

FIG. 22(a) is an example of the light diffusion areas 111 placed all around the outer surface of the light-emitting bulbs 11, and FIG. 22(b) is an example of the light diffusion areas 111 placed on the outer surface of the light-emitting bulbs 11 in semicircle directions facing to wafer 600.

As stated above, the heating device of the light irradiation type of this invention has the spacing between lamps 1 as small as possible so that it is suited to the spike annealing process. For that reason, the light that is emitted from one lamp 1 and reflected by the reflecting mirror 2 often passes through the light-emitting bulb of the adjacent lamp 1 and then arrives at the wafer 600 that is the workpiece by way of the quartz window 4.

In the event that light diffusion areas 111 are placed all around the outer surface of the light-emitting bulbs 11, as shown in FIG. 22(a), the light that is emitted from the lamps 1 and irradiates the wafer 600 directly is diffused light, since it passes through a light diffusion area 111 when it is emitted from the lamp 1. Further, the light that is emitted from the lamps 1 and irradiates the wafer 600 after being reflected by the reflecting mirror 2 is also diffused light, since it passes through a light diffusion area 111 when it is emitted from the lamp 1. Accordingly, it is possible to compensate for the effect of ripple to a certain extent.

Here, as stated above, a large proportion of the light radiated by one lamp 1 and reflected by the reflecting mirror 2 passes through the light-emitting bulb of the adjacent lamp 1 before arriving at the wafer 600 by way of the quartz window 4. Accordingly, in the case of FIG. 22(a), the light reflected by the reflecting mirror 2 often passes through a light diffusion area 111 multiple times and its irradiance on the wafer 600 is lessened to that extent. Further, the zone separation of this reflected light is not too good.

In the event that light diffusion areas 111 are placed around the outer surface of the light-emitting bulbs 11 only in semicircle directions facing to wafer 600 as shown in FIG. 22(b), on the other hand, the light that is emitted from the lamps 1 and irradiates the wafer 600 directly is diffused light, just as in FIG. 22(a), since it passes through a light diffusion area 111 when it is emitted from the lamp 1.

The light that is emitted from the lamps 1 and irradiates the wafer 600 after being reflected by the reflecting mirror 2 does not pass through a light diffusion area 111 when it is emitted from the lamp 1, but a large proportion of it passes through the light diffusion area 111 of the adjacent lamp 1. Such light passes through light diffusion areas fewer times than in the case in FIG. 22(a), and so the irradiance on the wafer 600 is greater than in the case in FIG. 22(a). Further, the zone separation of the reflected light is relatively good.

As a result, in the case of FIG. 22(b), the diffused light makes it possible to compensate to a certain extent for the effect of the ripple described above, as with FIG. 22(a), but beyond that, the diffused light that arrives at the wafer 600 that is the workpiece 6 has greater irradiance on the workpiece 600 than in case shown in FIG. 22(a), and zone separation is better.

As stated above, it is not necessary that the light diffusion area 111 be present all around the light-emitting bulb 11; depending on the arrangement of the multiple lamps arrayed in parallel, it is possible to compensate effectively for the effect of ripple without having the light diffusion area 111 present in certain directions.

Using the construction described above, the light that is emitted from the lamps 1 belonging to group I and group II and that irradiates the wafer 600 directly, as well as the light that is reflected by the reflecting mirror 2, passes through the light diffusion area 111 of the light-emitting bulbs 11, and so the wafer 600 is illuminated with diffused light.

The distance between the first lamp unit 10, the second lamp unit 20, and the wafer 600 is set as short as possible, and so, if there were no light diffusion area 111 on the light-emitting bulbs 11 of the lamps 1, a ripple component would be produced in the irradiance distribution on the wafer 600 by the non-light-emitting areas between the lamps that make up the lamp units 10, 20, as described above. With the heating device of this embodiment, however, the ripple component is counteracted by the diffused light mentioned above, and the uniformity of the distribution of the irradiance on the wafer surface is improved as a result.

Now, the light that is emitted from the lamps belonging to group III that irradiates the workpiece directly or after reflection by the flat mirror irradiates the guard ring and its vicinity without being diffused. Accordingly, good zone separation between group III and group II is maintained. Here, there is a ripple component present in the distribution of the irradiance on the guard ring due to light emitted from lamps belonging to group III that arrives at the guard ring directly or by way of the reflecting mirror. However, the guard ring itself does not require a uniform distribution of the irradiance on its surface, and so the presence of ripple does not cause any problem.

In other words, using the lighting device of the heat-irradiation type shown in this embodiment, the length of the optical path of the light that is emitted from the lamps and that irradiates the workpiece, either directly or by way of the reflecting mirror, can be made short, and so zone separation is good. At the same time, it is possible to suppress the ripple component that has conventionally occurred on the workpiece by shortening the said optical path. For that reason, it is possible to handle well the spike annealing process described above.

The explanation of zone control has been stated previously, and so it is omitted here. As stated above, zone control is applied in a single dimension perpendicular to the axial direction of straight-bulb lamps. For example, zone control by means of the first lamp unit 10 is applied in the direction of a cross section vertical to the axial direction of the lamps that make up the first lamp unit 10, as shown in FIG. 20(*a*).

Zone control by means of the second lamp unit 20 in the same direction cannot be implemented in reality, because the axial direction of the lamps that make up the second lamp unit 20 cannot be perpendicular to that direction.

Similarly, zone control by means of the second lamp unit 20 is applied in the direction of a cross section vertical to the axial direction of the lamps that make up the second lamp unit 20, as shown in FIG. 20(*b*).

Zone control by means of the first lamp unit 10 in the same direction cannot be implemented in reality, because the axial direction of the lamps that make up the first lamp unit 10 cannot be perpendicular to that direction.

Accordingly, in order to implement zone control across the full surface of the workpiece (that is, in two dimensions) by means of the lamp units, it is common to rotate the workpiece 6 (for example, a wafer 600) during irradiation, as in embodiment 1 described above. Rotation of the workpiece 6 can be achieved by, for example, rotating the guard ring 5 that supports the workpiece 6. In FIG. 19, there are bearings 55 installed on the underside of the guard ring 5; the guard ring 5 is driven to rotate by an unillustrated rotation mechanism. Now, the axis of rotation is at approximately the center of the workpiece 6.

Temperature measurement part 91 are placed on the back side from the irradiation surface of the wafer 600 placed in the guard ring 5, in contact with or close to the workpiece 6. The temperature measurement part 91 are to monitor the temperature distribution of the wafer 600; their number and placement is set in accordance with the dimensions of the wafer 600. The temperature measurement part 91 can use, for example, thermocouples or optical fiber radiation thermometers. The temperature information monitored by the temperature measurement part 91 is transmitted to the thermometer 9. The thermometer 9 calculates the temperatures at the measurement points of each temperature measurement area 91 on the basis of the temperature information transmitted from the temperature measurement part 91.

Depending on the type of heat treatment, it is possible to connect a process gas unit, which would introduce and exhaust process gases, to the heat-treatment space S2. For example, if a thermal oxidation process is performed, a process gas unit could be connected to the heat-treatment space S2 to introduce and exhaust oxygen gas and to introduce and exhaust a purge gas (nitrogen gas, for example) to purge the heat-treatment space S2.

The heat treatment using the heating device of the light irradiation type of this embodiment can be realized using equipment with the same constitution as shown in FIG. 8. Now, in FIG. 8, there is a light diffusion area on the mirror surface that is a portion of the reflecting mirror, but in this implementation the light diffusion area is on the lamps.

Further, the heat-treatment method by means of the heating device of the light irradiation type of this embodiment is the same as that explained with reference to FIG. 8 and to FIGS. 9, 10, and 11. In the event of using the spike annealing process to implement a high-temperature heat treatment to activate impurity ions driven into the wafer by ion implementation, it can be performed in the same way as described above.

(8) Fourth Embodiment

In the third embodiment, zone control was applied in the cross-section direction perpendicular to the axial direction of the lamps 1, but it was not possible to apply zone control in the axial direction. In this embodiment, however, it is possible to apply zone control to the entire face of the workpiece (that is, in two dimensions), and to apply zone control to the entire face of the workpiece (that is, in two dimensions) without rotation of the wafer 600 (and the guard ring 5).

Concretely, the lamps shown in FIG. 12 above, in which the filament within the light-emitting bulb is multiply divided and constituted so that it is possible to feed power to each filament individually, are used as the lamps that make up the two lamp units 10, 20. Multiple straight-bulb lamps 1' that have this sort of filament structure are prepared and arrayed in parallel with specified spacing to constitute the lamp units 10, 20. Of these lamps 1', those that are positioned above the wafer 600 have a light diffusion area 111 on the light-emitting bulb 11.

With this construction, it is possible to make the filaments of the lamps 1' emit light individually, and to regulate individually the power fed to the filaments of the lamps 1'. Accordingly, it is possible to implement zone control in the axial direction of straight-bulb lamps, which has not been possible with conventional technology. In other words, it is possible to implement zone control with respect to two dimensions on the workpiece, and so it is not necessary to rotate the workpiece 6 (a wafer 600, for example) during irradiation.

Figure 23:
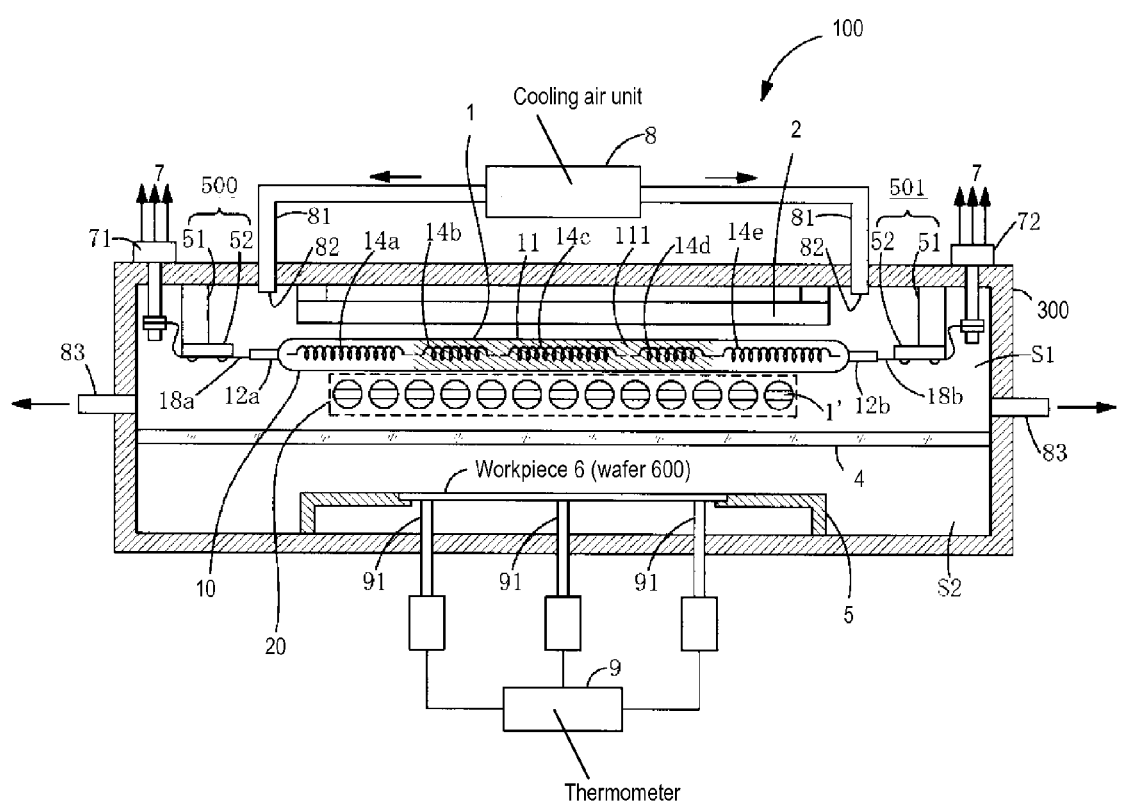
FIG. 23 is a diagram showing the constitution of the heating device of the light irradiation type of the fourth embodiment of this invention.

FIG. 23 is a diagram to explain the constitution of the heating device of the light irradiation type (also called the "heating device" hereafter) 100 of this embodiment. This embodiment uses lamps that have multiply divided filaments within the light-emitting bulbs with a constitution that allows independent power feed to each filament, within light-emitting bulbs having light diffusion areas as in the third embodiment. Except for the point that the lamps are different, the constitution is the same as that of the third embodiment.

The heating device of this embodiment, like the heating device shown in FIG. 19, has a light irradiation means that comprises a first lamp unit 10, a second lamp unit 20, and a reflecting mirror 2 made of, for example, a base of oxygen-free copper or aluminum coated with gold, all housed in a lamp unit accommodation space S1, as shown in FIG. 23.

Now, in this heating device, the distance between the first lamp unit 10, the second lamp unit 20, and the workpiece 6 (for example, a wafer 600) is as short as possible to be able to handle the spike annealing process.

In the lamps 1' that have one or more divided filaments and that make up the lamp units 10, 20, there are light diffusion areas 111 on the light-emitting bulbs in the vicinity of the filaments located above the wafer 600. The light diffusion area 111 is formed on the surface of the light-emitting bulbs by, for example, rubbing or delustering the window material by a frosting process. Now, as previously stated, other conceivable methods of forming a light diffusion area on the light-emitting bulb include sand-blasting the surface of the light-emitting bulb, chemical treatment, or crystallizing (devitrifying) the glass.

The positional relationship between the lamps 1' having light diffusion areas 111 and the workpiece 6 is explained next.

Figure 24:
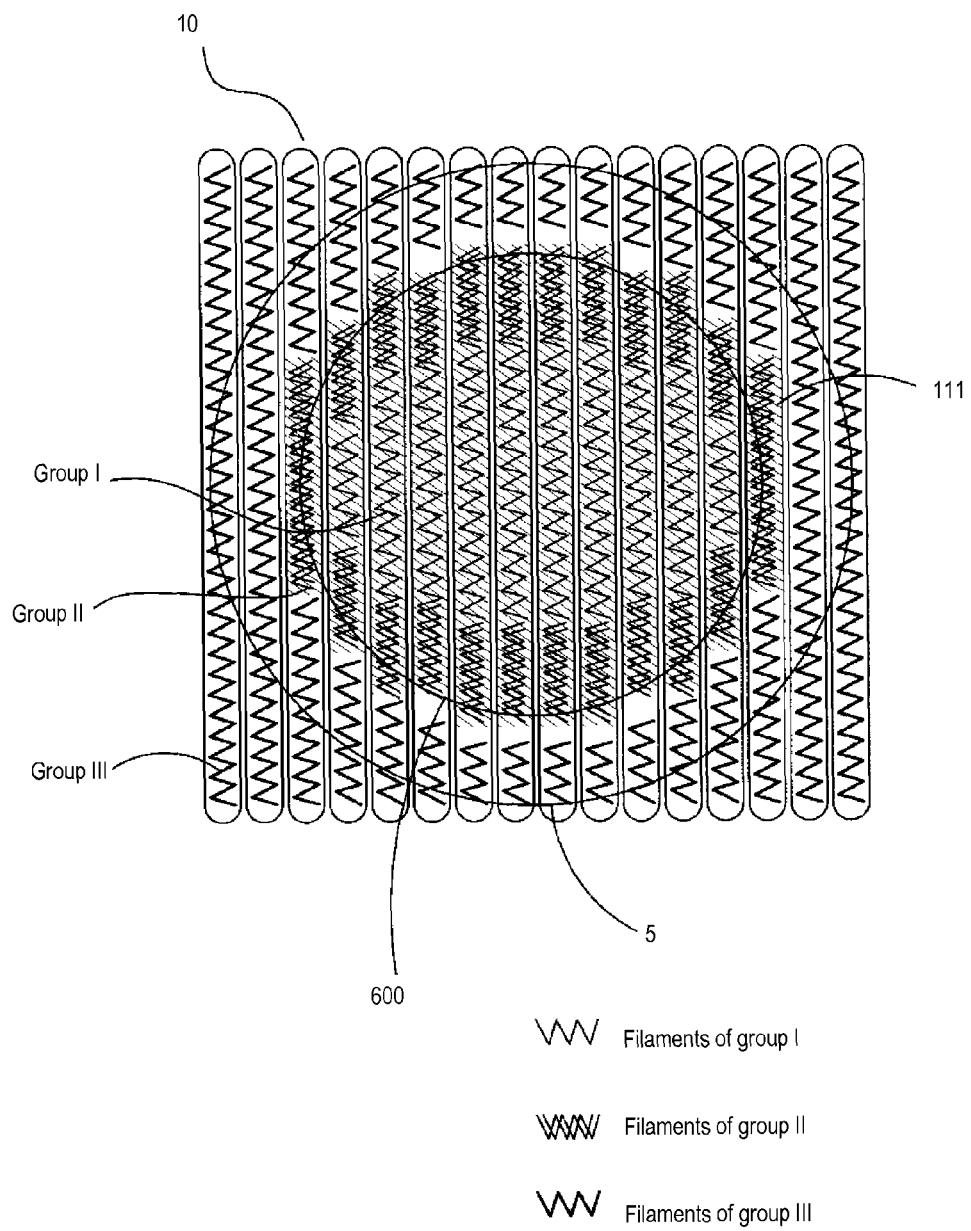
FIG. 24 is a diagram to explain the positional relationship of the first lamp unit, the light diffusion area, and the workpiece in the fourth embodiment.
Figure 25:
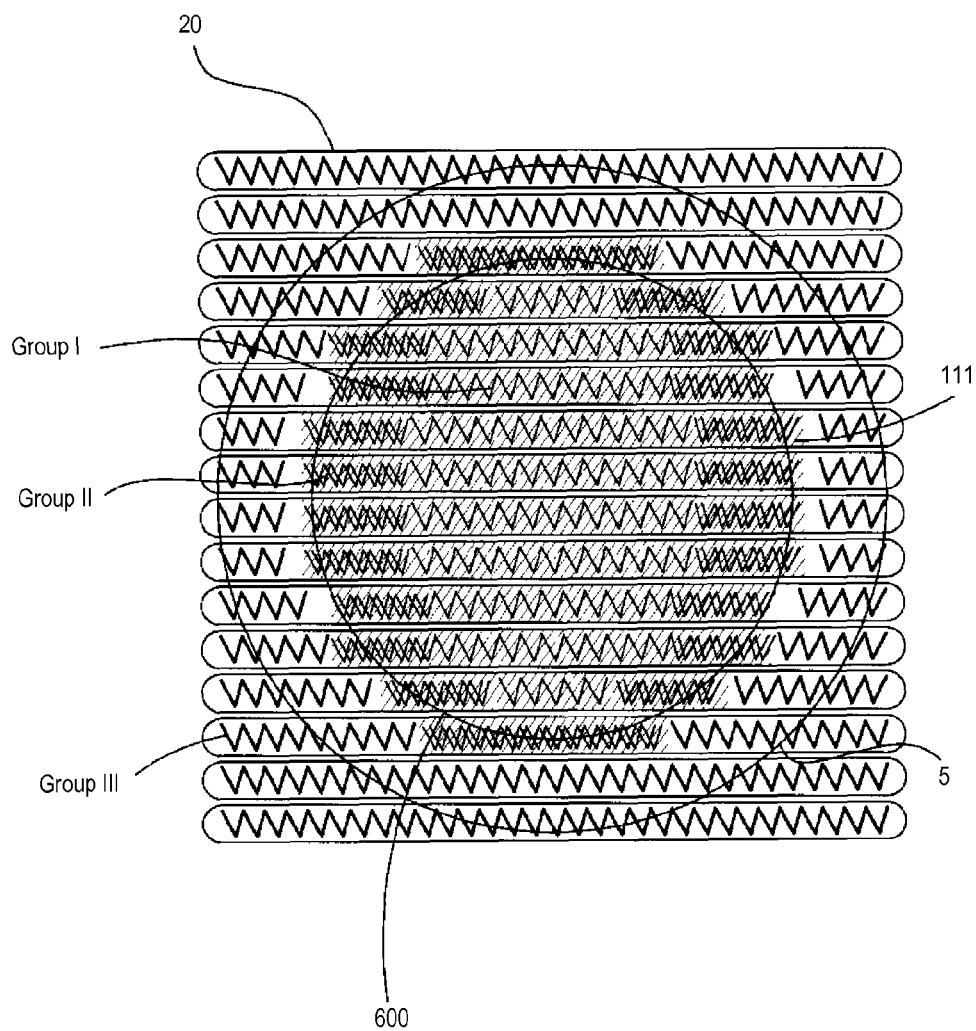
FIG. 25 is a diagram to explain the positional relationship of the second lamp unit, the light diffusion area, and the workpiece in the fourth embodiment.

FIGS. 24 & 25 are diagrams that show the positional relationship between the light diffusion areas 111 and the workpiece. FIG. 24 is a diagram showing the positional relationship between the light diffusion areas 111 on the lamps 1' belonging to the first lamp unit 10 and the workpiece 6, and FIG. 25 is a diagram showing the positional relationship between the light diffusion areas 111 on the lamps 1' belonging to the second lamp unit 20 and the workpiece 6.

Now, the zone separation is the same as that explained in second embodiment, and is established as follows. That is, consider the case in which the lamps 1' that make up the first lamp unit 10 and the second lamp unit 20 are divided into a lamp group for irradiation of the wafer placed above the wafer 600, and a lamp group for irradiation of the guard ring (group III). As an example, the lamp group for irradiation of the wafer is further divided into a group I placed above the central region of the wafer and a group II placed above the peripheral area of the wafer. In other words, the lamps 1 that make up the first lamp unit 10 and the second lamp unit 20 are divided into three zones, group I, group II, and group III.

In FIGS. 24 & 25, the filament group shown with single lines corresponds to group I, the filament group shown with double lines corresponds to group II, and the filament group shown with heavy lines corresponds to group III.

On the light-emitting bulbs 11 of the lamps 1' of the first lamp unit 10, as shown in FIGS. 24 & 25, the light diffusion area 111 is placed on the portions through which the light from the filaments belonging to group I and the light from filaments belonging to group II passes. There is no light diffusion area 111, on the other hand, on the portions through which the light from filaments belonging to group III passes.

Here, as shown in FIG. 22(*b*), there is no particular need to have a light diffusion area 111 for that part of the light emitted from the filaments belonging to group I and group II that is not emitted in a direction to irradiate the workpiece 6 directly. In other words, there does not have to be a light diffusion area 111 all around the light-emitting bulb 11; it can be placed to cover certain directions only.

With the construction described above, the light that is emitted from the filaments belonging to group I and group II and that irradiates the wafer 600 directly or is reflected by the reflecting mirror 2 passes through a light diffusion area 111 on a light-emitting bulb 11, and so it irradiates the wafer 600 as diffused light.

Conventionally, when there was no light diffusion area 111 on the light emitting bulbs 11 of the lamps 1', the distance between the first lamp unit 10, the second lamp unit 20, and the wafer 600 was set to be as short as possible, and so there was a ripple component in the distribution of the irradiance on the surface of the wafer 600 caused by non-light-emitting portions between the lamps of the lamp units 10, 20.

With the heating device of this embodiment, however, the diffused light described above counteracts the ripple component, and the uniformity of the distribution of the irradiance on the surface of the wafer is improved as a result.

Now, the light that is emitted from the filaments belonging to group III that irradiates the workpiece 6, either directly or after reflection by reflecting mirror 2, irradiates the guard ring 5 and its vicinity without having been diffused. Accordingly, good zone separation between group III and group II is maintained. Here, a ripple component is present in the distribution of the irradiance on the guard ring 5, produced by light that is emitted from the lamps belonging to group III and that arrives at the guard ring 5 either directly or by way of the reflecting mirror 2. However, the guard ring itself does not require a uniform distribution of the irradiance on its surface like the workpiece (wafer), and so the presence of ripple does not cause any problem.

In other words, using the heating device of the light irradiation type of this embodiment, as in the case of first to third embodiments, it is possible to shorten the length of the optical path of light that is emitted from the lamps 1 and that irradiates the workpiece either directly or by way of the reflecting mirror. Thus, zone separation is good, and at the same time, it is possible to suppress the ripple component that has conventionally occurred on the workpiece by shortening the optical path. For that reason, the heating device of the light irradiation type of this invention can be well-suited to the spike annealing process described above.

In the heating device of this embodiment in particular, in the lamps 1' that make up the lamp units 10, 20 the filaments are multiply divided within the light-emitting bulbs, and the filaments are constituted so that they can be fed power independently. Then the filaments are divided into the specified zones and the power fed to these filaments is regulated independently. For that reason, it is possible to implement zone control on the workpiece in two dimensions, and so it is not necessary to rotate the workpiece 6 (a wafer 600, for example) during irradiation.

Heat treatment using a heating device of the light irradiation type of this embodiment can be realized using equipment that is the same as the equipment with the constitution shown in FIG. 17 above. Now, there is a light diffusion area on the mirror surface of the reflecting mirror in FIG. 17, but the light diffusion area is on the lamps in this embodiment.

Further, the heat-treatment method using the heating device of the light irradiation type of this embodiment is the same as that explained in FIG. 17 and in FIGS. 9 & 18; in the event of using the spike annealing process to implement a high temperature heat treatment to activate impurity ions driven into the wafer by ion implementation, it can be performed in the same way as described above.

(9) Other Embodiments

The heating devices of the light irradiation type of this invention described in first through fourth embodiments above adopt a light irradiation means that comprises lamp units, in which multiple straight-bulb lamps are arrayed in parallel at a specified spacing, and a reflecting mirror that is a flat mirror.

In the devices of the first and third embodiments, the lamps 1 that make up the lamp units have a single filament, and the work is rotated in order to apply zone control across the full surface of the workpiece. In those of second and fourth embodiments, on the other hand, the lamps that make up the lamp units each have one or more filaments. These filaments can be fed power individually, and so it is possible to implement individual lighting control. For that reason, it is possible to apply zone control across the full surface of the workpiece without rotating the workpiece.

Further, the heating devices of the light irradiation type of these embodiments have as little space as possible between lamps and use flat mirrors as reflecting mirrors in order to be able to handle the spike annealing process. During that process, the distance between the light irradiation means and the workpiece is set as short as possible so that the length of the optical path by which light that is emitted by the lamps and reflected by the flat mirror arrives at the wafer and the length of the optical path of light from the lamps that irradiates the wafer directly are short, and the zone separation is improved.

In the heating devices of the light irradiation type that have light irradiation means of this sort, in this invention light diffusion areas to diffuse light are located on a portion of the reflecting mirror (constitution 1), on a portion of an optically transparent window part placed between the light irradiation means and the workpiece (a wafer, for example) (constitution 2), or on a portion of the light-emitting bulb of the lamp (constitution 3). The light diffusion area is formed in a region where there is incident light from the lamp groups (first and third embodiments) or filament groups (second and fourth embodiments) that are above the wafer, and hardly any incident light from the lamp groups (first and third embodiments) or filament groups (second and fourth embodiments) that are above the guard ring.

By means of the constitutions described above, the light reflected by a light diffusion area on the mirror surface (constitution 1) or the light that passes through a light diffusion area (constitutions 2 and 3) to irradiate the workpiece as diffused light. By means of this diffused light, the conventional ripple component is counteracted and the uniformity of the distribution of the irradiance on the surface of the wafer is improved as a result.

Further, hardly any of the light for irradiation of the guard ring from the lamp group (embodiments 1 and 3) or the filament groups (embodiments 2 and 4) is reflected by (constitution 1) or passes through (constitutions 2 and 3) the light diffusion areas mentioned above. Accordingly, the light for irradiation of the guard ring has little effect on the wafer, and good zone separation can be maintained.

Figure 26:
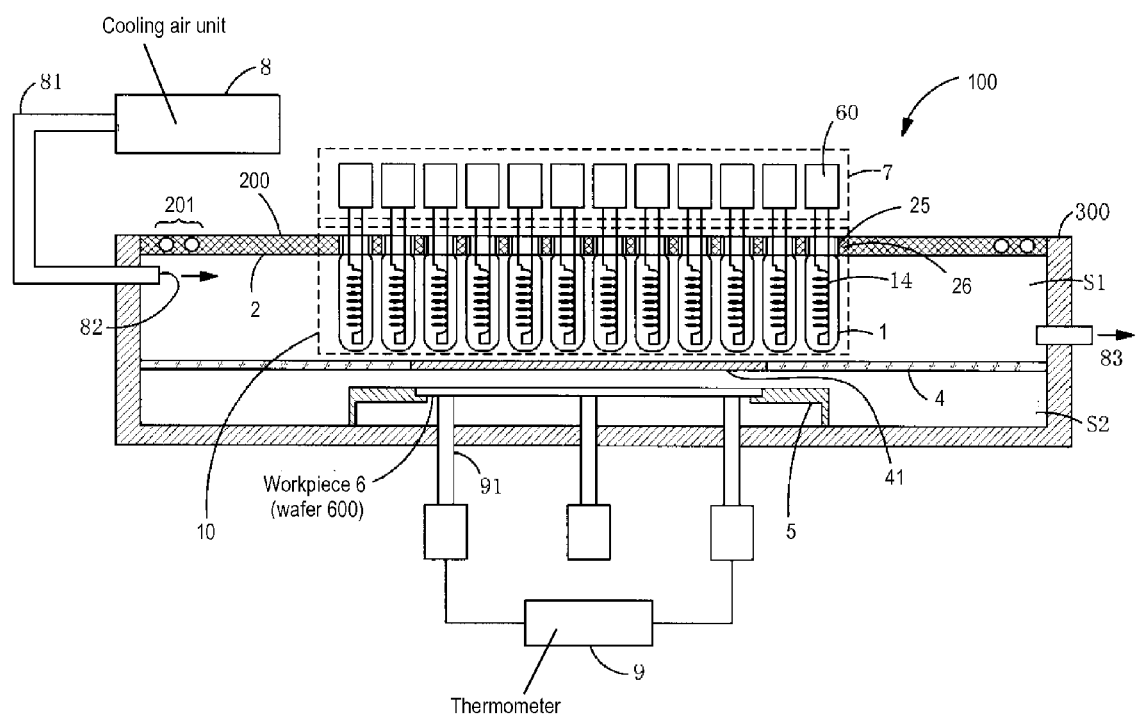
FIG. 26 is a diagram showing examples of the constitution of heating devices (using single-ended lamps) of other embodiments.

The lamp units that make up the light irradiation means here not necessarily limited to constitutions in which the multiple straight-bulb lamps arrayed in parallel. It is possible, for example, to use a lamp unit constituted as a honeycomb array of multiple lamps with a sealed portion on one end of the lamp only (also called "single-ended"). FIG. 26 shows an embodiment of a heating device that uses a lamp unit with multiple single-ended lamps of this sort arrayed in a honeycomb shape.

As shown in FIG. 26, the heating device 100 has a chamber 300. The interior of the chamber 300 is divided by a quartz window 4, which is an optically transparent window part, into a lamp unit accommodation space S1 and a heat-treatment space S2.

The light that is emitted from the lamp unit 10 housed in the lamp unit accommodation space S1 performs heat treatment of a workpiece 6 (for example, a semiconductor wafer 600, also called a "wafer 600" hereafter) placed in the heat-treatment space S2 by passing through a quartz window 4 and irradiating the workpiece.

The lamp unit 10 housed in the lamp unit accommodation space S1 is made up of a honeycomb-shaped array of single-ended incandescent lamps 1 (also called "lamps 1" hereafter) at a prescribed spacing. The lamps 1 are, for example, halogen lamps, each having a single filament 14 within their light-emitting bulbs. Now each lamp 1 is positioned so that its bulb axis is perpendicular to the surface of the workpiece. The seal portion of each lamp 1 has a sleeve 25 to cover the seal portion.

At the top of the chamber 300, there is a mirror structure 200, in which there are multiple holes 26, on the inner surface of the chamber. A reflecting mirror 2 is formed by the inner surface of the mirror structure 200. Further, the holes 26 are located at a prescribed spacing in a honeycomb shape in the mirror structure 200.

By fitting the sleeves 25 of the lamps 1 into the holes 26 in the mirror structure 200, the lamps 1 are fixed in the mirror structure 200. That is, the lamps 1 are located in a honeycomb shape at prescribed spacing, and make up the lamp unit 10.

The interior of the mirror structure 200 is a cavity, and this cavity is constituted so that a coolant from a cooling means (not shown) can circulate through it. The coolant circulates through the cavity by way of circulation ports 201. The coolant that circulates in this cavity has the purpose of cooling the seal portions of the lamps 1 that are installed in the mirror structure 200. In other words, the heat of the seal portions that increase in temperature while the lamps 1 are lit undergoes heat exchange with the coolant inside the mirror structure 200, through the sleeves 25 and partitions that compose the holes 26 installed in the mirror structure 200.

In the heating device shown in FIG. 26, the distance between the lamp unit 10 and the workpiece 6 (a wafer 600, for example) is set to be as short as possible so that the heating device can handle the spike annealing process. As stated above, the lamps 1 are positioned with their bulb axes perpendicular to the surface of the workpiece. Accordingly, the distance between the wafer 600 and the mirror 2 formed by the mirror structure 200 is not too short. Therefore, the light from the lamps 1 that directly irradiates the wafer 600 is used primarily in the spike annealing process.

Now, it also possible to constitute the lamp unit with each lamp inserted in a cylindrical light guide, as in the heating device described in JP-A-H6-93440 (of 1994) (corresponding to WO-A-91/10873). In this case, the light emitted from the tip of the light guide is used to heat the workpiece.

Within the lamp unit accommodation space S1, cooling air from the cooling air unit 8 is introduced through the injection outlet holes 82 of the cooling air supply nozzles 81 attached to the chamber 300. The cooling air introduced into the lamp unit accommodation space S1 is blown onto the lamps 1 of the lamp unit 10, and cools the light-emitting bulbs of the lamps 1. The cooling air that is blown onto the lamps 1 and attains a high temperature by means of heat exchange is then exhausted through the cooling air exhaust ports 83 in the chamber 300. Now, the flow of cooling air is arranged so that the cooling air that has attained a high temperature by means of heat exchange does not heat the lamps 1 instead.

There are power source supply ports (not shown) in the mirror structure 200. Two leads that are electrically connected to the filament protrude from the single-end portion of each lamp 1. These leads that protrude to the exterior are connected to a power supply 60 by way of the power source supply ports. In other words, the power supply 60 that supplies power to the lamps 1 is individually attached to each lamp 1. By means of such a construction, it is possible to feed power from the power supply 60 to each lamp 1 individually. Now, multiple power supplies together are also designated "power source 7."

In the heat-treatment space S2, there is a processing stand to which the workpiece 6 is fixed. For example, in the event that the workpiece 6 is a wafer 600, the processing stand is a thin, ring-shaped body made of a high-melting-point metal such as molybdenum, tungsten, or tantalum, a ceramic material such as silicon carbide (SiC), or quartz or silicon (Si); it is desirable to have a guard ring 5 with a stepped structure to support the wafer 600 within its circular opening.

The wafer 600 is fitted into this circular opening of the ring-shaped guard ring 5, and is supported by the step. The guard ring 5 itself is irradiated, reaches a high temperature, and performs compensatory radiation heating of the edge of the wafer 600 that it faces; it compensates for the thermal radiation from the edge of the wafer 600. The temperature drop at the edge of the wafer 600 that is caused by thermal radiation from the edge of the wafer 600 is suppressed by this means.

Temperature measurement part 91 are placed on the back side from the irradiation surface of the wafer 600 placed in the guard ring 5, in contact with or close to the workpiece 6. The temperature measurement part 91 are to monitor the temperature distribution of the wafer 600; their number and placement is set in accordance with the dimensions of the wafer 600. The temperature measurement part 91 can use, for example, thermocouples or optical fiber radiation thermometers. The temperature information monitored by the temperature measurement part 91 is transmitted to the thermometer 9. The thermometer 9 calculates the temperatures at the measurement points of each temperature measurement area 91 on the basis of the temperature information transmitted from the temperature measurement part 91.

Depending on the type of heat treatment, it is possible to connect a process gas unit, which would introduce and exhaust process gases, to the heat-treatment space S2. For example, if a thermal oxidation process is performed, a process gas unit could be connected to the heat-treatment space S2 to introduce and exhaust oxygen gas and to introduce and exhaust a purge gas (nitrogen gas, for example) to purge the heat-treatment space S2.

The positional relationship of the lamp unit and the light diffusion area is explained next.

As stated above, the light irradiation means of the heating device of this embodiment uses a lamp unit with multiple single-ended lamps arrayed in a honeycomb shape. In such a construction, each lamp 1 emits light individually, and it is possible to individually regulate the power fed to the filament of each lamp 1. Therefore, as in the case of the second and fourth embodiments, it is possible to implement zone control across two dimensions of the workpiece, and it is not necessary to rotate the workpiece 6 (a wafer 600, for example) during irradiation.

Further, as stated above, the distance between the reflecting mirror 2 and the workpiece is not too short, and so the light from the lamps 1 that irradiates the wafer 600 directly is used primarily in the spike annealing process. Even in the event that the lamp unit has a constitution in which each lamp is inserted into a cylindrical light guide, like the heating device described in JP-A-H6-93440 (of 1994) (corresponding to WO-A-91/10873), the light emitted from the tips of the light guides is used to heat the workpiece.

Accordingly, in the heating device of this embodiment, the construction adopted is that of constitution 2 that has a light diffusion area 41 on the optically transparent window part 4 or that of constitution 3 that has light diffusion areas on parts of the light-emitting bulbs.

In FIG. 26, the case of a light diffusion area 41 on the optically transparent window part 4 is shown.

Consider the case in which the single-ended lamps 1 that make up the lamp unit 10 are divided into a lamp group for irradiation of the wafer placed above the wafer 600, and a lamp group for irradiation of the guard ring (group III). The lamp group for irradiation of the wafer is further divided into a group I placed above the central region of the wafer and a group II placed above the peripheral area of the wafer. In other words, the lamps 1 that make up the first lamp unit 10 and the second lamp unit 20 are divided into three zones, group I, group II, and group III.

Figure 27:
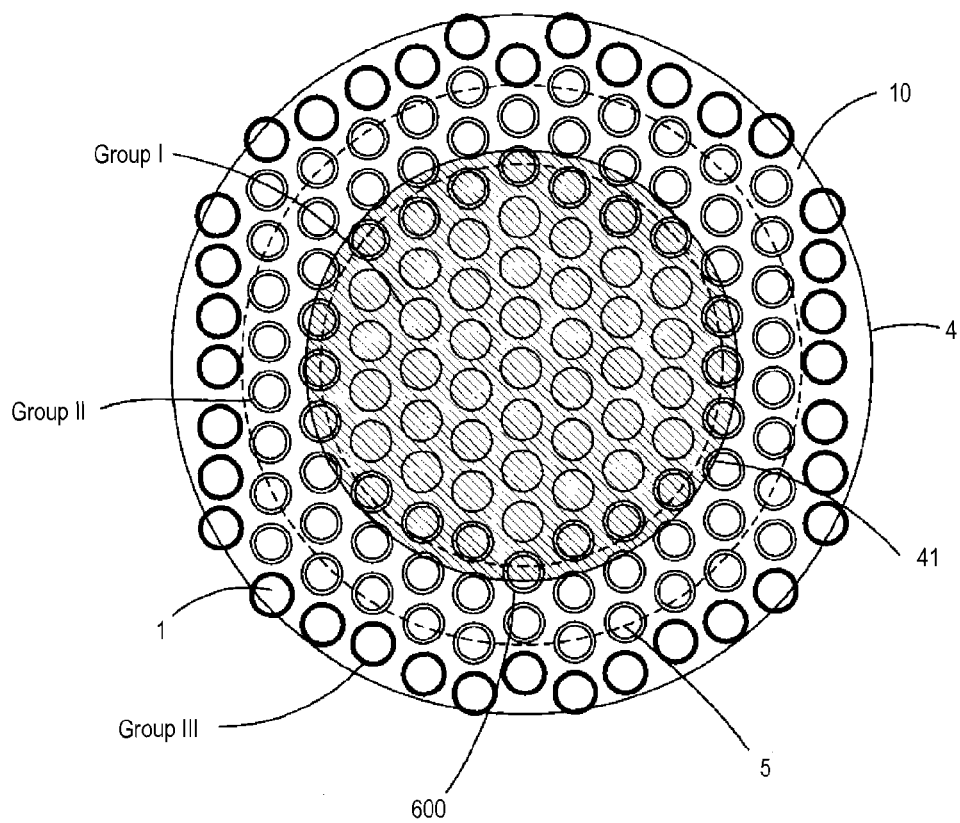
FIG. 27 is a diagram to explain the positional relationship of the light diffusion area and the workpiece in other embodiments.

FIG. 27 is a diagram that shows the positional relationship for placement of the light diffusion area 41. In FIG. 27, the lamp group shown with single lines corresponds to group I, the lamp group shown with double lines corresponds to group II, and the lamp group shown with heavy lines corresponds to group III.

As shown in FIG. 27, the light diffusion area 41 is set in a region where it receives incident light from the lamps belonging to group I and from the lamps belonging to group II, but hardly any incident light from the lamps belonging to group III.

Now, the shape of the wafer 600 that is the workpiece and the shape of the guard ring 5 are both round, and so the light diffusion area 41 is also round.

By means of the construction described above, the light that is emitted from the lamps 1 that correspond to group I and group II passes through the optically transparent window part 4 and irradiates the wafer 600 as diffused light. If there were no light diffusion area on the optically transparent window part 4, as in conventional technology, a ripple component would be generated in the irradiance distribution on the wafer 600 by the non-light emitting portions between the lamps that make up the lamp unit 10, since the distance between the lamp unit 10 and the wafer 600 is set to be as short as possible. By means of the heating device of this invention, however, the ripple component is counteracted by the diffused light, and the uniformity of the distribution of the irradiance on the surface of the wafer is improved as a result.

Now, of the light that is emitted from the lamps 1 that correspond to group III and passes through the optically transparent window part 4, hardly any passes through the light diffusion area 41. Therefore, good zone separation is maintained between group II and group II. A ripple component is present in the distribution of the irradiance on the guard ring 5 from light that is emitted from the lamps 1 belonging to group III here. However, the guard ring 5 does not require uniformity of the distribution of the irradiance on its surface, so the presence of ripple does not cause any problem.

Heat treatment by means of the heating device shown in FIG. 26 is the same as in embodiment 2, with "filaments" replaced by "lamps," and so explanation is omitted.

What is claimed is:

1. A heating device of the light irradiation type, comprising:
    an article to be heated,
    a guard ring located on the periphery of the article,
    multiple lamps located above the article to be heated and the guard ring,
    a reflecting mirror located above the lamps, and
    a light diffusion part located in an upper region with respect to the article to be heated and arranged for projecting diffused light from the light diffusion part onto the entire surface of the article to be heated; wherein a non-diffusion surface is arranged for projecting undiffused light from the non-diffusion surface to the guard ring, wherein the non-diffusion surface is located on a part of the reflecting mirror that positionally corresponds to the guard ring.

2. A heating device of the light irradiation type as described in claim 1, wherein the lamps are incandescent lamps that have a light emitting bulb within which a light emitting part is multiply divided in a direction of a longitudinal axis of the bulb, which divided light emitting parts can be fed power individually.

3. A heating device of the light irradiation type as described in claim 2, wherein said lamps are arrayed in parallel.

4. A heating device of the light irradiation type as described in claim 1, wherein the light diffusion part is a light diffusion area formed on a reflecting mirror.

5. A heating device of the light irradiation type as described in claim 1, wherein the light diffusion part is a light diffusion area formed on an optically transparent window part located between the article to be heated and the lamps.

6. A heating device of the light irradiation type as described in claim 1, wherein the light diffusion part is a light diffusion area formed on light emitting bulbs of the lamps.

* * * * *